United States Patent
Vidne et al.

(10) Patent No.: US 11,762,260 B2
(45) Date of Patent: Sep. 19, 2023

(54) LASER BEAMS METHODS AND SYSTEMS

(71) Applicant: Civan Advanced Technologies, Ltd, Jerusalem (IL)

(72) Inventors: Yaniv Vidne, Petah-Tikva (IL); Ran Vered, Nehalim (IL); Eyal Shekel, Moshav Beit Zayit (IL)

(73) Assignee: Civan Advanced Technologies, Ltd, Jerusalem (IL)

( * ) Notice: Subject to any disclaimer, the term of this patent is extended or adjusted under 35 U.S.C. 154(b) by 0 days.

(21) Appl. No.: 17/579,609

(22) Filed: Jan. 20, 2022

(65) Prior Publication Data

US 2022/0146906 A1     May 12, 2022

Related U.S. Application Data

(63) Continuation of application No. 17/054,776, filed as application No. PCT/IL2019/050536 on May 13, 2019, now Pat. No. 11,287,722.
(Continued)

(30) Foreign Application Priority Data

May 14, 2018 (IL) .......................................... 259364
May 14, 2018 (IL) .......................................... 259366

(51) Int. Cl.
   *G02F 1/35*          (2006.01)
   *G02F 1/37*          (2006.01)
   *G02B 27/14*        (2006.01)

(52) U.S. Cl.
   CPC ......... *G02F 1/3544* (2013.01); *G02B 27/141* (2013.01); *G02F 1/3503* (2021.01);
(Continued)

(58) Field of Classification Search
None
See application file for complete search history.

(56) References Cited

U.S. PATENT DOCUMENTS 6,339,604 B1    1/2002   Smart
6,519,385 B1    2/2003   Green
(Continued)

FOREIGN PATENT DOCUMENTS

DE     102007002821     7/2008
JP       2014216361 A    11/2014
WO    WO 2011/151818    12/2011

OTHER PUBLICATIONS

International Search Report for PCT Application No. PCT/IL19/50536 dated Dec. 12, 2019.
(Continued)

*Primary Examiner* — Rhonda S Peace
(74) *Attorney, Agent, or Firm* — Mark S. Cohen; PEARL COHEN ZEDEK LATZER BARATZ LLP

(57) ABSTRACT

Methods and apparatuses for manipulating and modulating of laser beams. The methods and apparatuses enable activating and deactivating of laser beams, while the laser systems maintain their operating power. Further, a hybrid pump module configured to be coupled to an optical fiber having a core and at least one clad, comprising: at least one focusing lens in optical with the optical fiber; plurality of diode modules, each configured to output a multi-mode beam in optical path with the clad; and at least one core associated module, in optical path with the core, configured to provide selected functions. Further, apparatus and methods configured for frequency doubling of optical radiation.

15 Claims, 41 Drawing Sheets

Related U.S. Application Data

(60) Provisional application No. 62/827,210, filed on Apr. 1, 2019, provisional application No. 62/777,787, filed on Dec. 11, 2018.

(52) U.S. Cl.
CPC .............. *G02F 1/3507* (2021.01); *G02F 1/37* (2013.01); *G02F 2203/50* (2013.01)

(56) References Cited

U.S. PATENT DOCUMENTS

| | | | |
|---|---|---|---|
| 6,970,624 B2 | 11/2005 | Digiovanni et al. | |
| 8,306,073 B2* | 11/2012 | Kitabayashi | H01S 3/1001 359/341.1 |
| 8,374,206 B2* | 2/2013 | Peng | H01S 3/115 372/27 |
| 9,431,787 B2* | 8/2016 | Ichige | H01S 3/0675 |
| 9,496,683 B1* | 11/2016 | Kanskar | H01S 3/13 |
| 9,584,224 B2* | 2/2017 | Shekel | G02F 1/0121 |
| 9,893,494 B2* | 2/2018 | Shekel | H01S 3/10053 |
| 11,287,722 B2* | 3/2022 | Jackel | H01S 3/06754 |
| 2003/0165176 A1 | 9/2003 | Minden | |
| 2004/0109230 A1 | 6/2004 | Matsushita et al. | |
| 2009/0296751 A1 | 12/2009 | Kewtsch et al. | |
| 2011/0267671 A1 | 11/2011 | Peng et al. | |
| 2013/0107343 A1 | 5/2013 | Shekel | |
| 2016/0218476 A1 | 7/2016 | Kliner et al. | |
| 2016/0320686 A1 | 11/2016 | Hansen et al. | |
| 2017/0125980 A1 | 5/2017 | Shekel | |
| 2017/0271837 A1 | 9/2017 | Hemenway et al. | |

OTHER PUBLICATIONS

Fluck et al., (1998). "Efficient second-hat tonic generation by lens wave-guiding in KNbO3 crystals". *Optics Communications*, 147(4-6), 305-308.

Liu et al., (2017). "Three-crystal method for thermally induced phase mismatch compensation in second-harmonic generation". JOSA B, 34(2), 383-388.

Chen et al., (2017). Improvement of the frequency-doubling efficiency of high-average-power lasers using multicrystal scheme with opposite thermal properties. Results in physics, 7, 3530-3536.

Cui et al., (2016). "Compensation method for temperature-induced phase mismatch during frequency conversion in high-power laser systems". JOSA B, 33(4), 525-534.

Hansen et al., (2015). "Concept for power scaling second harmnonic generation using a cascade of nonlinear crystals". Optics express, 23(12), 15921-15934.

Hansen et al., (Feb. 2014). "Generation of 3.5 W of diffraction-limited green light from SHG of a single tapered diode laser in a cascade of nonlinear crystals". In Nonlinear Frequency Generation and Conversion: Materials, Devices, and Applications XIII (vol. 8964, p. 896406). International Society for Optics and Photonics.

Wikipedia—"Pulsed Laser", pp. 1-2, Oct. 18, 2015 https://en.wikipedia.org/wiki/Pulsed Laser.

European Search Report for European Application No. 22189911.5 dated Jan. 2, 2023.

* cited by examiner

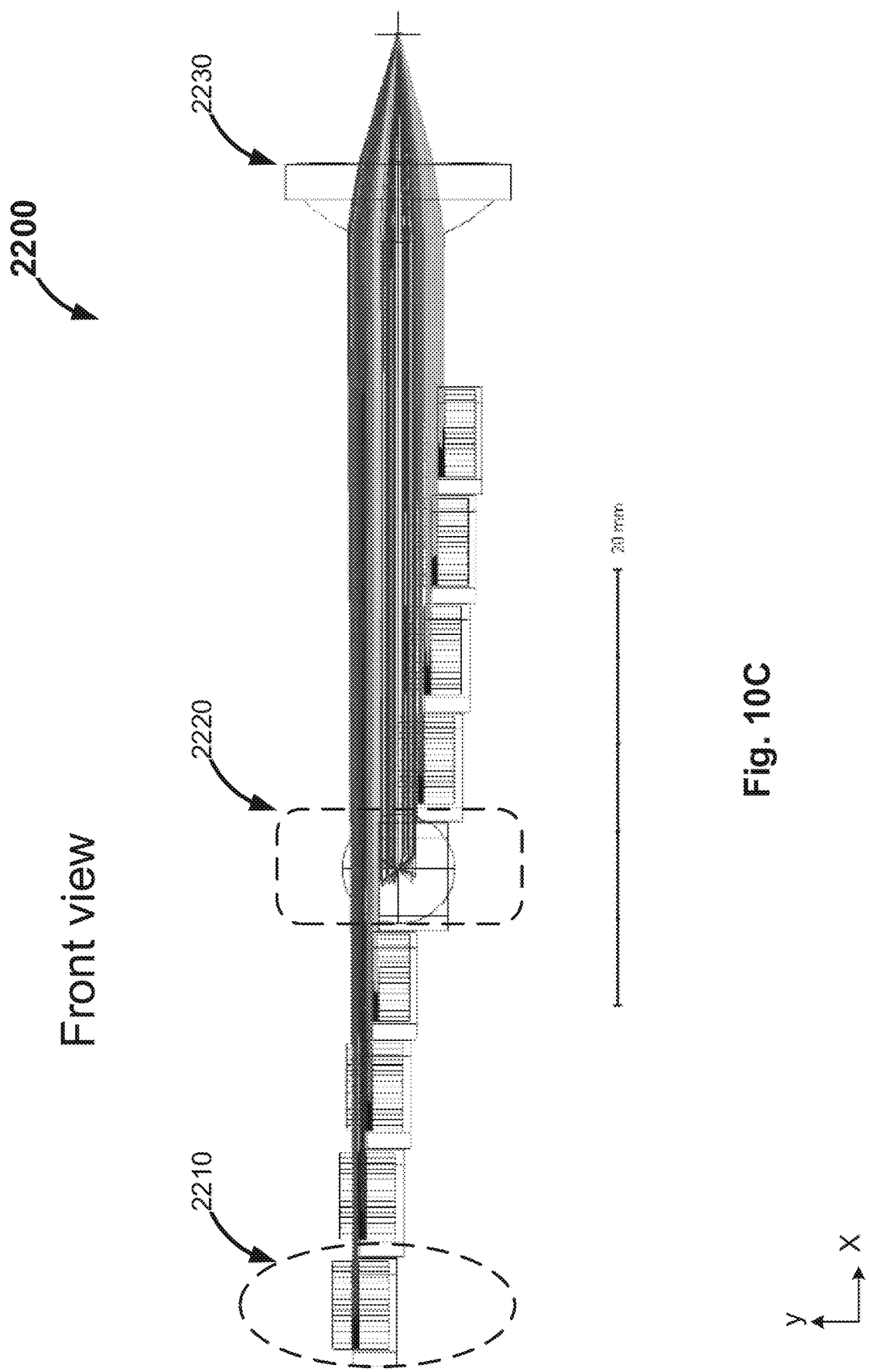

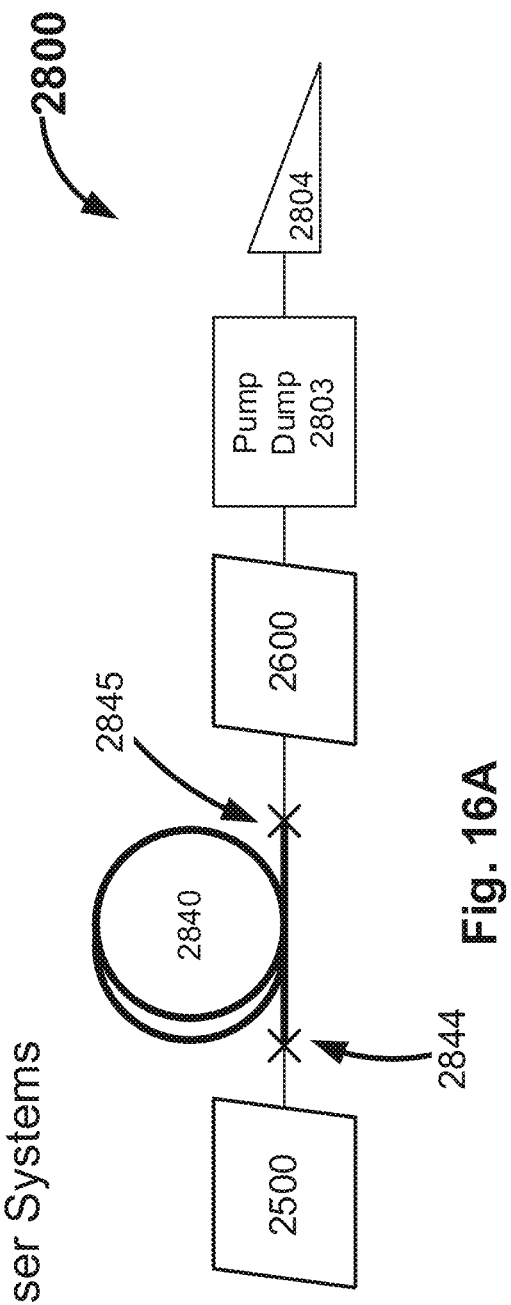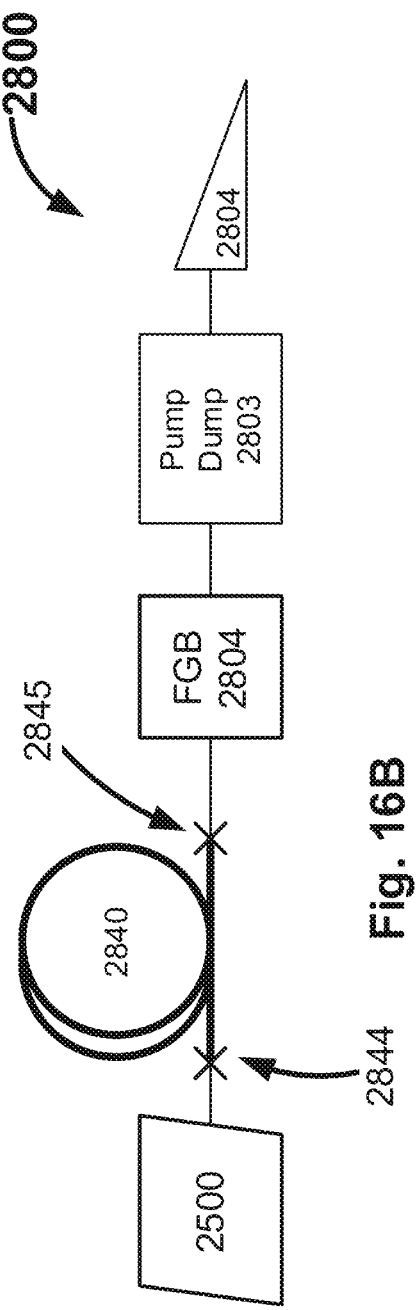

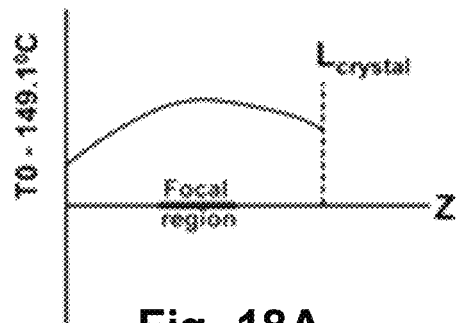
Fig. 18A
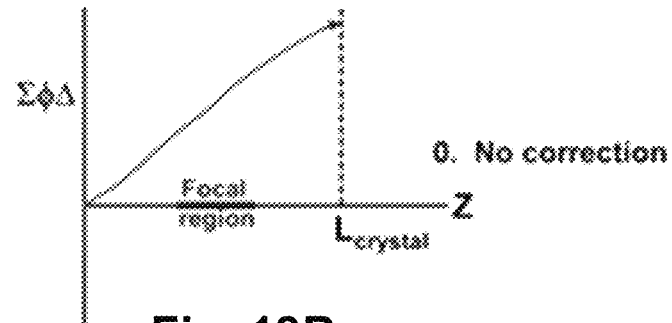
Fig. 18B
Fig. 19A Fig. 19B
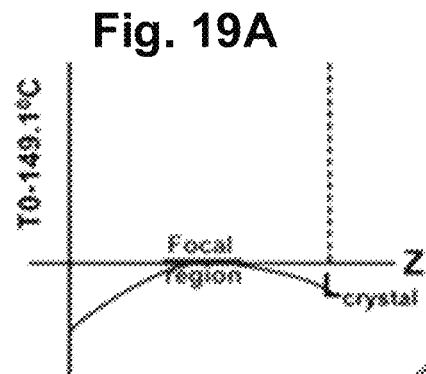
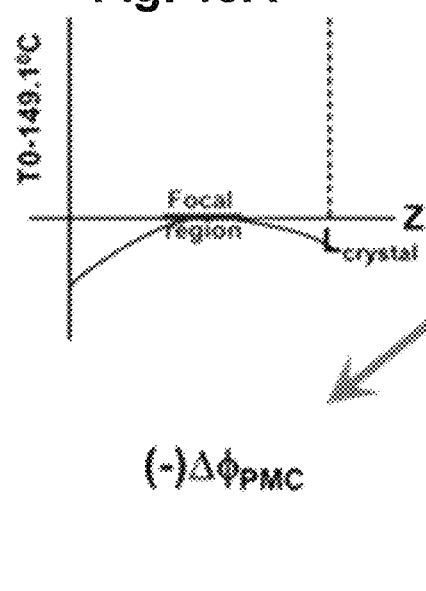
Fig. 19C

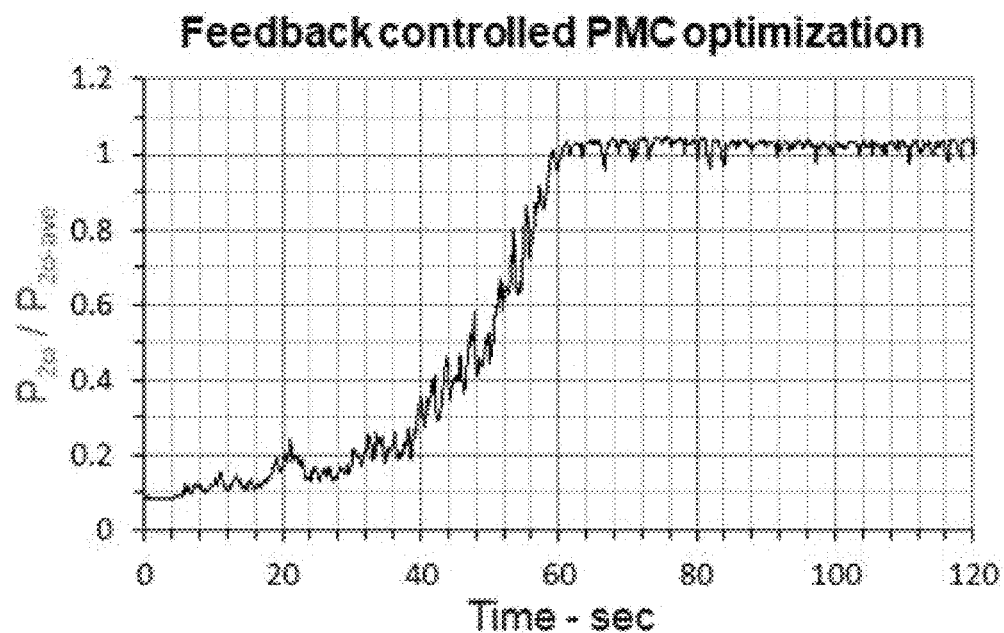
Fig. 30
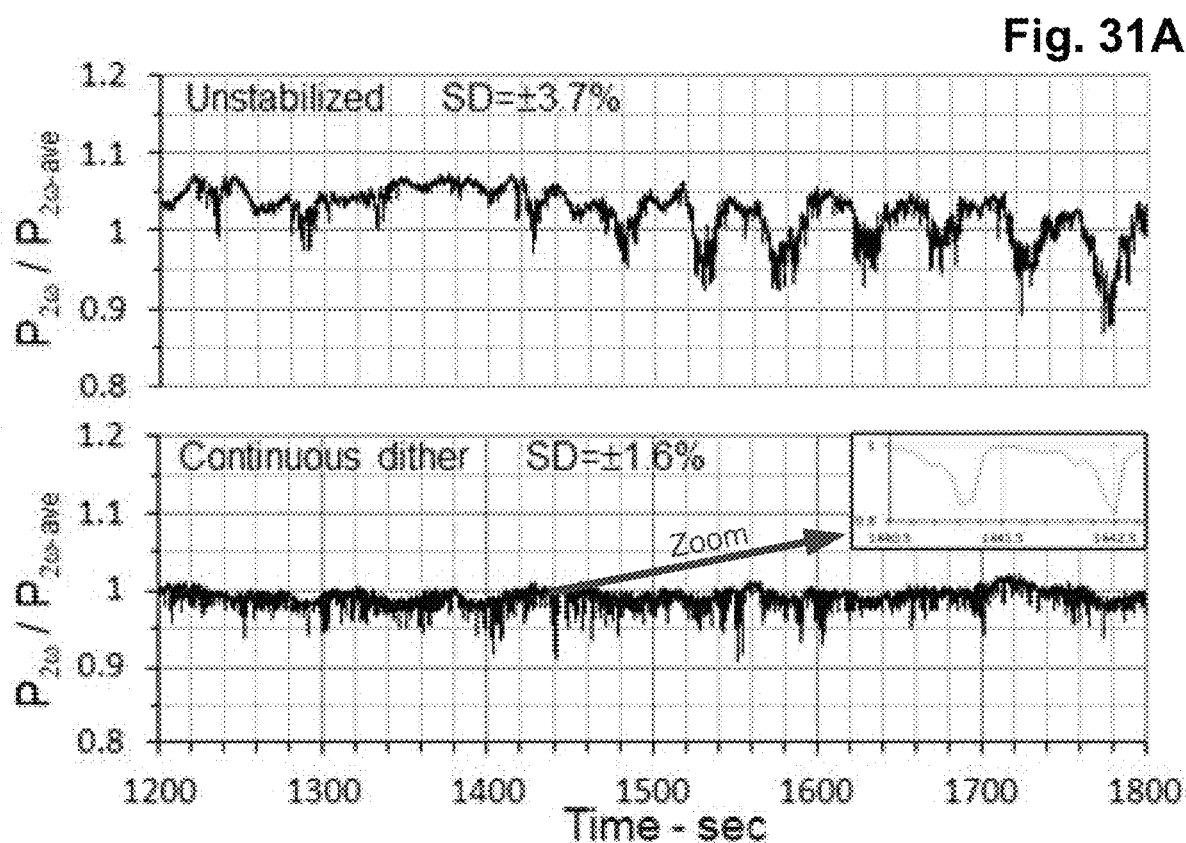
Fig. 31A
Fig. 31B

LASER BEAMS METHODS AND SYSTEMS

CROSS-REFERENCE TO RELATED APPLICATIONS

This application is a continuation of application of U.S. patent application Ser. No. 17/054,776, filed on Nov. 12, 2020, which is a National Phase Application of PCT International Application No. PCT/IL2019/050536, International Filing Date: May 13, 2019, claiming priority of:

IL Patent Application No. 259364, filed May 14, 2018,
IL Patent Application No. 259366, filed May 14, 2018,
U.S. Provisional Patent Application No. 62/777,787, filed Dec. 11, 2018, and
U.S. Provisional Patent Application No. 62/827,210, filed Apr. 1, 2019; which are hereby incorporated by reference.

BACKGROUND OF THE INVENTION

The ability to manipulate beams emerging from lasers, laser beam arrays and fiber optic arrays has become important in a variety of fields, including: welding, cutting, surveying, garment industry, laser nuclear fusion, communication, laser printing, CDs and optical discs, spectroscopy, heat treatment, barcode scanners, laser cooling, tracking and targeting technologies. Applications of lasers, in these and other related fields, frequently require high speed activating and deactivating of the laser beam.

Presently, the methods used for manipulating (activating/deactivating) fiber optic beams require the manipulation of the power of the laser systems. For example turning "on"/turning "off" (shutting) the seed beam device, or transferring/blocking the seed beam, or turning off current thereof. These power manipulations are relatively slow (in the range of 1-5 KHz), for example due the spontaneous emission time of the fiber lasers, and can damage some of the components of the laser system when the laser emits amplified spontaneous emissions.

There is a long-felt need for a method and/or an apparatus that can allow a high rate manipulation (activation/deactivating) of high power laser beams, which may be used for example during beam scans and other fast material processing.

High power fiber lasers and fiber amplifiers require high brightness pump source and efficient techniques to be coupled with a doped fiber, in order to excite the ions and initiate a lasing process. Coupling a signal power with a fiber core is also critical.

A common method to couple a pump and/or a signal light with a doped fiber is via a fused coupler, which is a fiber combiner or a fused tapered fiber bundle (TFB), based on end face pumping technique. A TFB combiner with signal feedthrough includes a central input signal fiber and an output pigtail (curled) double-clad (DC) fiber, which combines the signal and pump light in a single pigtail fiber. The use of a TFB includes guiding the signal light, surrounded by several multi-mode fibers and guiding the pump light. In order to match the diameter of the fiber bundle to the diameter of the output pigtail fiber, the bundle is slowly melted and tapered. After the tapering process the fiber bundle is cleaved around the taper waist and fusion spliced to the output pigtail DC fiber. However, tapering of the fiber bundle inherently involves increasing the numerical aperture (NA) of the pump light and a change of the mode field diameter (MFD) of the signal light. Hence, the necessary optical matching and mechanical alignment requirements between the tapered fiber bundle and the output pigtail DC fiber can lead to several drawbacks of the TFB structure, for example:

less flexibility in the choice of input fibers that can match the output pigtail DC fiber, after the tapering process;
a slight mismatch or misalignment between the signal mode field diameters (MFD) of the tapered input signal fiber and the output pigtail DC fiber leads to a degradation of the beam quality, primarily in conjunction with signal insertion loss and which could also lead to catastrophic damage to the fiber at high power operation;
in the case of a backward propagating signal, e.g. for a counter-propagation pumped fiber amplifier, the signal insertion loss (up to 10%) can cause damage to the pump diodes due to their insufficient isolation against amplified signal light.

Another common technique includes a monolithic all-fiber combiner like a gradually transferred (GT) wave coupler, with the employment of a tapered capillary around a multi-clad fiber or direct fusion of one or more tapered multi-mode fibers to the outermost cladding of multi-clad fibers.

However, the coupling efficiencies of the current combiners are not sufficient to permit their use in very high-power amplifiers and lasers. In addition, as the signal fiber is tapered down along with the pump fibers, the resulting small core diameter of the signal fiber creates significant mismatch problems for coupling with large mode area double clad fibers. These large mode field diameter mismatches cause unacceptably high signal loss, which probably cause temperature increase and damage to the TFB.

Another drawback is their susceptibility to parasitic nonlinear processes, primarily stimulated Brillouin scattering (SBS), which occurs when the laser signal has a line-width narrower than a few tens of megahertz. This is due to the long interaction length (due to the component additional fiber length) of the optical signal field and the core material of the fiber Accordingly, there is a need for a new technique that overcome the above-mentioned deficiencies, can reduce the number of fusion points and can reduce energy loss.

The present invention relates in some embodiments to frequency conversion of high-average power laser beams, in Non-Linear Crystals (NLCs). It deals with a means for correcting deleterious Mismatched Phase (MP) between the fundamental-frequency input-beam(s) and the frequency-converted output-beam that may occur in the first of a single- or multiple-NLC chain.

Past efforts to achieve high-average power harmonic conversion have reached a limit determined by damage thresholds (damage within the bulk of the crystal or on its anti-reflection coatings), or by absorption induced thermal effects.

Improvements to the crystals and their Anti-Reflection (AR) coatings have left Thermally induced Mismatched Phase (TMP) as a prime limiter of high average power performance. One option to control the TMP is to use ultra-low absorption crystals. One example would be Lithium triborate (LBO) for frequency doubling of 1064 nm lasers.

Nevertheless, at some power level, heating of the crystal starts to degrade performance and it is then that some compensation method must be employed.

One approach that has been reported in the literature is to use two crystals with an intermediate Phase Mismatch Compensator (PMC). The PMC is an optical element that exhibits chromatic dispersion and/or polarization dependent refractive index. This dispersion may be an inherent property of the material [D. Fluck, and P. Gunter, "*Efficient second-harmonic generation by lens wave-guiding in KNbO crystals*", Optics Comm. 147, 305-308 (1998); A. K Hansen, M. Tawfieq, O. B. Jensen, P. E. Andersen, B. Sumpf, G. Erbert, and P. M. Petersen, "*Concept for power scaling second harmonic generation using a cascade of nonlinear crystals*" Optics Express 23, 15921-15934 (2015); A. K. Hansen, O. B. Jensen, B. Sumpf, G. Erbert, A. Unterhuber, W. Drexler, P. E. Andersen, P. M.l Petersen, "*Generation of 3.5 W of diffraction-limited green light from SHG of a single tapered diode laser in a cascade of nonlinear crystals*" Proc. of SPIE Vol. 8964 (2016); X. Liu, X. Shen, J. Yin, and X. Li, "*Three-crystal method for thermally induced phase mismatch compensation in second-harmonic generation*", J. Opt. Soc. Am. B 34, 383-388 (2017)]; or it may be imposed by an external field (an electric field applied to an electro-optic material such as in a Pockels cell) [Z. Cui, D. Liu, l, M. Sun, J. Miao, and J. Zhu, "*Compensation method for temperature-induced phase mismatch during frequency conversion in high-power laser systems*" JOSA B 3, 525-534 (2016)].

PMCs were proven in the lab and in simulations to be very effective in compensating MP in the second crystal of a two crystal frequency doubling chain. However, at a sufficiently high input power, there is a need to better deal with the MP in the first frequency conversion crystal.

Frequency doubling modules, used to convert the wavelength of input laser light, may consist of one or more nonlinear crystals (NLCs) placed in series. The input light is focused into the first crystal and then relay-imaged between subsequent crystals with achromatic optics, so as to maximize the doubling per crystal and per doubling system. The crystals may be separated by Phase Mismatch Compensators (PMCs), whose function is to correct for any phase mismatch between fundamental beam and harmonic beam, incurred during the doubling process, prior to any particular crystal's high intensity interaction zone.

In general, such systems are regarded as static systems, even though some degree of control may be attempted, by changing the crystals' operating temperatures. Current frequency doubling systems are configured to operate at a single operating point, with PMCs tuned to maintain a fixed amount of phase difference. Accordingly, there is a need for an active PMC to provide enhanced capabilities.

SUMMARY OF THE INVENTION

In some embodiments a method is provided for modulating a laser beam is provided by a laser system comprising at least one seed laser device and a coherent beam combining (CBC) system configured to receive a seed beam of the seed laser device and to selectively provide an amplified laser beam; the CBC system comprising:
plurality of phase modulators configured in (direct or indirect) optical connections with: the seed beam, plurality of optical amplifiers, at least one beam splitter, and optionally at least one beam combiner; all arranged to enable constructive or destructive beam interference, at a CBC point; and
at least one control circuitry, configured to monitor the beam interference, at the CBC point, and to accordingly control at least one of the phase modulators;

the method comprising steps of:
activating the laser beam by controlling the phase modulators to provide the constructive beam interference, at the CBC point, thereby providing the laser beam;
deactivating the laser beam by controlling the phase modulators to provide the destructive beam interference at the CBC point, thereby preventing the laser beam.

In some embodiments, the step of activating by controlling the phase modulators to provide the constructive beam interference comprises tuning the phase modulators to provide the constructive beam interference with maximum intensity.

In some embodiments, the step of deactivating by controlling the phase modulators to provide the destructive interference comprises controlling half of the tuned phase modulators to add a half phase (n) to their beams.

In some embodiments, the step of deactivating by controlling the phase modulators to provide the destructive interference comprises modifying some of the tuned phase modulators.

In some embodiments, each of the tuned phase modulators is differently modified.

In some embodiments, the method further comprising a step of tuning the laser beam, by modifying some of the phase modulators, which were tuned to provide maximum beam intensity, the modifying is configured to cause the intensity of the laser beam to equal to a predetermined percentage of the maximum intensity.

In some embodiments, the step of deactivating by controlling the phase modulators to provide the destructive beam interference comprises tuning the phase modulators to provide the beam interference with minimum intensity.

In some embodiments a method is provided for modulating a laser beam, provided by a laser system comprising:
at least one seed laser device;
a fast optical modulator (FOM), configured to receive a seed beam of the seed laser device and modulate a bandwidth thereof;
a coherent beam combining (CBC) system, configured to receive the modulated seed beam and accordingly provide an amplified laser beam;
the method comprising steps of:
activating the laser beam by controlling the FOM to provide the seed beam with a first (narrow) bandwidth ($\Delta\omega_2$) configured to enable a constructive interference, at a CBC point of the CBC system, thereby providing the laser beam;
deactivating the laser beam by controlling the FOM to provide the seed beam with a second (wide) bandwidth ($\Delta\omega_2$, where $\Delta\omega_2 > \Delta\omega_1$) configured to disable a constructive interference, at the CBC point, thereby preventing the laser beam.

In some embodiments, wherein the CBC system comprising:
plurality of phase modulators configured in (direct or indirect) optical connections with: the modulated seed beam, plurality of optical amplifiers, at least one beam splitter, and optionally at least one beam combiner; all arranged to enable a constructive beam interference, at the CBC point; and
at least one control circuitry, configured to monitor the beam interference, at the CBC point, and to accordingly control at least one of the phase modulators;
and wherein the step of activating further comprises controlling the phase modulators to provide the constructive beam interference.

In some embodiments, wherein the step of controlling the phase modulators to provide the constructive beam interference comprises tuning the phase modulators to provide the constructive beam interference with maximum intensity.

In some embodiments a method is provided for modulating a laser beam, provided by a laser system comprising:

- a coherent beam combining (CBC) system, configured to receive a seed laser beam and accordingly provide an amplified laser beam;
- a first seed laser device, configured to provide a first seed beam having a first wavelength ($\lambda_1$);
- a second seed laser device, configured to provide a second seed beam having a second wavelength ($\lambda_2$), different from the first wavelength ($\lambda_2 \neq \lambda_1$); and
- an optical switch, configured to link only one of the first and second seed beams to the CBC system;
- the CBC system comprising:
- plurality of phase modulators configured in (direct or indirect) optical connections with: the linked (first or second) seed laser beam, plurality of optical amplifiers, at least one beam splitter, and optionally at least one beam combiner; all arranged to enable a constructive beam interference a CBC point; and
- at least one control circuitry, configured to monitor the beam interference, at the CBC point, and to accordingly control at least one of the phase modulators;
- the method comprising steps of:
- activating the laser beam by controlling the optical switch to link the first seed beam to the CBC system and controlling the phase modulators to provide the constructive beam interference, thereby providing the laser beam;
- deactivating the laser beam by controlling the optical switch to link the second seed beam to the CBC system, thereby disabling the constructive beam interference and preventing the laser beam.

In some embodiments, the controlling the phase modulators to provide the constructive beam interference comprises tuning the phase modulators to provide the constructive beam interference with maximum intensity.

In some embodiments a method is provided for modulating a laser beam provided by a laser system comprising:

- a coherent beam combining (CBC) system, configured to receive a seed laser beam and accordingly provide an amplified laser beam;
- a first seed laser device, configured to provide a first seed laser beam having a first bandwidth ($\Delta\omega_1$);
- a second seed laser device, configured to provide a second seed laser beam having a second bandwidth ($\Delta\omega_2$), larger than the first bandwidth ($\Delta\omega_2 > \Delta\omega_1$); and
- an optical switch, configured to link only one of the first and second seed beams to the CBC system;
- wherein the first bandwidth ($\Delta\omega_1$) is configured to enable a constructive beam interference, at a CBC point of the CBC system, and wherein the second bandwidth ($\Delta\omega_2$) is configured to disable a constructive beam interference, at the CBC point; the method comprising steps of:
- activating the laser beam by controlling the optical switch to link the first seed laser beam to the CBC system, thereby enabling a constructive interference and providing the laser beam;
- deactivating the laser beam by controlling the optical switch to link the second seed laser beam to the CBC system, thereby disabling a constructive interference and preventing the laser beam.

In some embodiments, the CBC system comprising:

- plurality of phase modulators configured in (direct or indirect) optical connections with: the linked (first or second) seed beam, plurality of optical amplifiers, at least one beam splitter, optionally and at least one beam combiner; all arranged to enable a constructive beam interference, at the CBC point; and
- at least one control circuitry, configured to monitor the beam interference, at the CBC point, and to accordingly control at least one of the phase modulators;
- and wherein the step of activating further comprises controlling the phase modulators to provide the constructive beam interference.

In some embodiments, the controlling the phase modulators to provide the constructive beam interference comprises tuning the phase modulators to provide the constructive beam interference, with maximum intensity.

In some embodiments a method is provided for modulating a laser beam, provided by a laser system comprising:

- a coherent beam combining (CBC) system, configured to receive a seed beam and provide an amplified laser beam;
- a first seed laser, configured to provide a first seed beam having a first wavelength ($\lambda_1$);
- a second seed laser, configured to provide a second seed beam having a second wavelength ($\lambda_2$), different from the first wavelength ($\lambda_2 \neq \lambda_1$);
- an optical switch, configured to link only one of the first and second seed beams to the CBC system; and
- a dichroic mirror, configured to receive the amplified laser beam, transmit beams having the first wavelength ($\lambda_1$) to output of the laser system, and reflect beams having the second wavelength ($\lambda_2$), therefore selectively provide the output laser beam;
- the method comprising steps of:
- activating the laser beam by controlling optical switch to link the first seed beam to the CBC system, thereby transferring and providing the laser beam;
- deactivating the laser beam by controlling optical switch to link the second seed beam to the CBC system, thereby reflecting and averting the laser beam.

In some embodiments, the CBC system comprising:

- plurality of phase modulators configured in (direct or indirect) optical connections with: the linked (first or second) seed beam, plurality of optical amplifiers, at least one beam splitter, and optionally at least one beam combiner; all arranged to enable a constructive beam interference, a CBC point; and
- at least one control circuitry, configured to monitor the beam interference, at the CBC point, and to accordingly control at least one of the phase modulators; and wherein the method further comprises controlling the phase modulators to provide the constructive beam interference, at the CBC point, at least during the step of activating.

In some embodiments, the controlling the phase modulators to provide the constructive beam interference comprises tuning the phase modulators to provide the constructive beam interference with maximum intensity.

In some embodiments a method is provided for modulating a laser beam provided by a laser system comprising:

- a master oscillator power amplifier (MOPA), configured to receive a seed beam and provide an amplified laser beam;
- a first seed laser, configured to provide a first seed beam having a first wavelength ($\lambda_1$);

a second seed laser, configured to provide a second seed beam having a second wavelength ($\lambda_2$), different from the first wavelength ($\lambda_2 \neq \lambda_1$);

an optical switch, configured to link only one of the first and second seed beams to the MOPA; and a dichroic mirror, configured to receive the amplified laser beam, transmit beams having the first wavelength ($\lambda_1$) to output of the laser system, and reflect beams having the second wavelength ($\lambda_2$), therefore selectively provide the output laser beam;

the method comprising steps of:

activating the laser beam by controlling optical switch to link the first seed beam to the MOPA, thereby transferring and providing the laser beam;

deactivating the laser beam by controlling optical switch to link the second seed beam to the MOPA, thereby reflecting and averting the laser beam.

In some embodiments a method is provided for modulating a laser beam provided by a laser system comprising:

at least one seed laser device;

an optical polarization combiner (OPC), configured to receive a seed laser beam of the seed laser device and to modulate polarization directions thereof; wherein the modulation comprises providing the seed beam with at least two polarization components, wherein one of the polarization components comprising a predetermined polarization direction ($P_1$);

a coherent beam combining (CBC) system, configured to receive the polarization modulated seed beam and provide an amplified laser beam; and a polarization beam splitter (PBS) configured to receive the amplified laser beam and transmit only beams having the predetermined polarization direction ($P_1$) to output of the laser system and reflect beams having other polarization directions, thereby selectively provide the laser beam;

the method comprising steps of:

activating the laser beam by controlling the OPC to provide the beam component having the predetermined polarization direction ($P_1$) with an intensity ($I_1$) larger than 50% of the overall intensity of the seed laser beam, thereby providing the laser beam;

deactivating the laser beam by controlling the OPC to provide the beam component having the predetermined polarization direction ($P_1$) with an intensity ($I_1$) equal or smaller than 50% of the overall intensity of the seed laser beam, thereby averting the laser beam.

In some embodiments, the method further comprising a step of tuning the laser beam, by controlling the OPC to provide the beam component having the predetermined polarization direction ($P_1$) with an intensity ($I_1$) equal to a predetermined percentage of the overall intensity of the seed laser beam.

In some embodiments, the CBC system comprising:

plurality of phase modulators configured in (direct or indirect) optical connections with: the polarization modulated seed beam, plurality of optical amplifiers, at least one beam splitter, and optionally at least one beam combiner; all arranged to enable a constructive beam interference, at a CBC point; and at least one control circuitry, configured to monitor the beam interference, at the CBC point, and to accordingly control at least one of the phase modulators; and wherein the method further comprises controlling the phase modulators to provide the constructive beam interference, at the CBC point, at least during the step of activating In some embodiments, the OPC comprises:

a beam splitting assembly, configured to receive an input beam with a first polarization direction ($P_1$) and to output a first beam ($B_1(I_1, P_1)$) having the first polarization direction ($P_1$) and a first intensity ($I_1$) and a second beam ($B_2(I_2, P_1)$) having the first polarization direction ($P_1$) and a second intensity ($I_2$), wherein the sum of the first and second intensities ($I_1+I_2$) equals to the intensity of the input beam;

a polarization convertor, configured to receive one of the beam splitting assembly output beams ($B_1$ or $B_2$) and to convert its polarization (from S to P, or from P to S, therefore $P_1 \neq P_2$, $B_2(I_2, P_2)$); and a polarization beam splitter (PBS) configured to receive the first output beam ($B_1(I_1, P_1)$) and the second converted output beam ($B_2(I_2, P_2)$) and to combine them into a third beam, provided as an input to the CBC system; or, a coupler configured to receive the first output beam ($B_1(I_1, P_1)$) and the second converted output beam ($B_2(I_2, P_2)$), combine them, and split them into two output beams, wherein only one of the two output beams is provided as an input to the CBC system.

In some embodiments, the beam splitting assembly comprises:

a beam splitter, configured to receive an input beam and split the input beam into two beams;

a phase modulator, configured to modulate the phase of one of the two beams;

a coupler, configured to receive the two beams (after modulating the phase of one of the beams) and to provide their interference at two locations, thereby to provide the first output beam ($B_1(I_1, P_1)$) and the second output beam ($B_2(I_2, P_1)$);

an electronic controller, configured to monitor one of the two interference locations (optionally via a TAP and a diode) and control the phase modulator to accordingly enable a constructive or a destructive beam interference, at the monitored location, and wherein the non-monitored interference location is thereby provided with a destructive or a constructive beam interference, respectively;

and wherein the steps of controlling the OPC comprising controlling the phase modulator (via controller).

In some embodiments a method is provided for modulating a laser beam provided by a laser system comprising:

at least one seed laser device;

at least one optical polarization combiner (OPC), configured to receive a seed beam of the seed laser device and to modulate polarization directions thereof; wherein the modulation comprises providing the seed beam with at least two polarization components, wherein one of the polarization components comprising a predetermined polarization direction ($P_1$);

a master oscillator power amplifier (MOPA), configured to receive the modulated seed beam and provide an amplified laser beam; and a polarization beam splitter (PBS) configured to receive the amplified laser beam and transmit only beams having the predetermined polarization direction ($P_1$) to output of the laser system and reflect beams having other polarization directions, thereby selectively provide the laser beam;

the method comprising steps of:

activating the laser beam by controlling the OPC to provide the beam component having the predetermined polarization direction ($P_1$) with an intensity ($I_1$) larger than 50% of the overall intensity of the beam, thereby providing the laser beam;

deactivating the laser beam by controlling the OPC to provide the beam component having the predetermined polarization direction ($P_1$) with an intensity ($I_1$) equal or smaller than 50% of the overall intensity of the beam, thereby averting the laser beam.

In some embodiments a laser system is provided configured for modulating a laser beam comprising:

at least one seed laser device;

at least one optical polarization combiner (OPC), configured to receive a seed beam of the seed laser device and to modulate polarization directions thereof; wherein the modulation comprises providing the seed beam with at least two polarization components, wherein one of the polarization components comprising a predetermined polarization direction ($P_1$);

a coherent beam combining (CBC) system, configured to receive the polarization modulated seed beam and provide an amplified laser beam;

a polarization beam splitter (PBS) configured to receive the amplified laser beam and transmit only beams having the predetermined polarization direction ($P_1$) to output of the laser system and reflect beams having other polarization directions, therefore selectively provide the laser beam; and an electronic controller configured to:

activate the laser beam by controlling the OPC to provide the beam component having the predetermined polarization direction ($P_1$) with an intensity ($I_1$) larger than 50% of the overall intensity of the beam, therefore provide the laser beam;

to deactivate the laser beam by controlling the OPC to provide the beam component having the predetermined polarization direction ($P_1$) with an intensity ($I_1$) equal or smaller than 50% of the overall intensity of the beam, therefore avert the laser beam.

In some embodiments, the CBC system comprising:

plurality of phase modulators configured in (direct or indirect) optical connections with: the polarization modulated seed beam, plurality of optical amplifiers, at least one beam splitter, and optionally at least one beam combiner; all arranged to enable a constructive beam interference, at a CBC point; and at least one control circuitry, configured to monitor the beam interference, at the CBC point, and to accordingly control at least one of the phase modulators to provide the constructive interference, at a CBC point.

In some embodiments, the OPC comprises:

a beam splitting assembly, configured to receive an input beam with a first polarization direction ($P_1$) and to output a first beam ($B_1(I_1,P_1)$) having the first polarization direction ($P_1$) and a first intensity ($I_1$) and a second beam ($B_2(I_2,P_1)$) having the first polarization direction ($P_1$) and a second intensity ($I_2$), wherein the sum of the first and second intensities ($I_1+I_2$) equals to the intensity of the input beam;

a polarization convertor, configured to receive one of the beam splitting assembly output beams ($B_1$ or $B_2$) and to convert its polarization (from S to P, or from P to S, therefore $P_1 \neq P_2$, $B_2(I_2, P_2)$); and a polarization beam splitter configured to receive the first output beam ($B_1(I_1, P_1)$) and the second converted output beam ($B_2(I_2, P_2)$) and to combine them into a third beam, provided as an input to the CBC system; or, a coupler configured to receive the first output beam ($B_1(I_1, P_1)$) and the second converted output beam ($B_2(I_2, P_2)$), combine them, and split them into two output beams, wherein only one of the two output beams is provided as an input to the CBC system.

In some embodiments, the beam splitting assembly comprises:

a beam splitter, configured to receive an input beam and split the input beam into two beams;

a phase modulator, configured to modulate the phase of one of the two beams;

a coupler, configured to receive the two beams (after modulating the phase of one of the beams) and to provide their interference at two locations, thereby to provide the first output beam ($B_1(I_1, P_1)$) and the second output beam ($B_2(I_2, P_1)$);

an electronic controller, configured to monitor one of the two interference locations (optionally via a TAP and a diode) and control the phase modulator to accordingly enable a constructive or a destructive beam interference, at the monitored location, and wherein the non-monitored interference location is thereby provided with a destructive or a constructive beam interference, respectively.

In some embodiments of the invention, a hybrid fiber-coupled diode pump laser module (and in short, a pump module) is provided, configured to be coupled to an optical fiber having a core and at least one clad, the pump module comprising:

at least one focusing lens in optical path with the optical fiber;

plurality of diode modules, each configured to output a multi-mode beam in optical path with the clad;

at least one core associated module in optical path with the core configured to provide a function selected from a group of consisting of:

a) to output a single-mode beam towards the core;

b) to receive a beam from the core, and to couple the received beam to an output optical fiber;

c) to receive a beam from the core, and to reflect the received beam back to the core, and d) to receive a beam from the core, and to reflect a part of the received beam back to the core, and to couple another part of the received beam to an output optical fiber.

In some embodiments, the pump module further comprises a volume Bragg grating (VBG), configured to narrow and lock beams to a predetermined range of wavelength.

In some embodiments, the plurality of diode modules and the core associated module are arranged in at least one row, such that their output beams are parallel one to another, per each row.

In some embodiments, in the case of two rows or more, the pump module further comprises:

at least one polarizer beam combiner, in the path of a first beams' row;

one or more folding mirrors, each folding-mirror for each additional row, wherein each folding mirror is configured to redirect its corresponding row of parallel beams into the respective polarizer beam combiner.

In some embodiments, each of the diode modules comprises:

a broad area laser (BAL);

a BAL associated folding-mirror, configured with an optical path between its associated BAL and the clad; and optionally, at least one lens arranged between the BAL and its associated folding-mirror, configured to adjust shape of the BAL's beam.

In some embodiments, the core associated module comprises a seed module comprising:
  at least one seed input, configured to be coupled to a seed laser device;
  a seed associated folding-mirror, configured for optical path between the seed input and the core; and
  optionally, at least one lens arranged between the seed input and its associated folding-mirror, configured to adjust shape of the seed's beam.

In some embodiments, the seed associated module further comprises at least one of:
  a beam amplifier, configured to amplify the seed beam;
  a tap (not shown) or a partial mirror, configured to sample the seed beam, and a monitor configured monitor and alert of backward beam transmission; and
  an isolator, configured to allow transmission of light in one direction only.

In some embodiments, the core associated module comprises an output module comprising:
  an output fiber, optionally comprising an end-cap element;
  a folding-mirror associated with the output fiber, configured for optical path between the core and the output fiber;
  optionally, at least one lens, arranged between the output fiber and its associated folding-mirror, configured to adjust shape of the received core beam; and
  optimally, a pump dump.

In some embodiments, the core associated module comprises a high reflecting (HR) module comprising:
  an HR mirror;
  a folding-mirror associated with the HR mirror, configured for optical path between the core and the HR mirror; and
  optionally, at least one lens arranged between the HR mirror and its associated folding-mirror, configured to adjust shape of the associated beams.

In some embodiments, the HR module further comprises an intra cavity modulator arranged between the HR mirror and its associated folding-mirror, configured to modulate the reflected beam.

In some embodiments, the core associated module comprises a partial reflecting (PR) module comprising:
  an output fiber, optionally comprising an end-cap;
  a PR mirror, in optical path with the output fiber;
  a folding mirror associated with the PR mirror, configured for optical path between the core and the PR mirror; and
  optionally, at least one lens, arranged between the PR mirror and its associated folding-mirror, configured to adjust shape of the associated beams.

In some embodiments, the pump module further comprises at least one heat dispensing element selected from a group consisting: base surface, ribs, screws, and any combination thereof.

In some embodiments of the invention, a fiber amplifying system is provided comprising:
  an optical fiber, comprising a core and at least one clad;
  the pump module according to at least some of the above embodiments, coupled to a first end of the optical fiber.

In some embodiments, the system further comprises at least one selected from: a pump dump, an end-cap element.

In some embodiments, the fiber amplifying system, further comprises the pump module according to at least some of the above embodiments, coupled to a second end of the optical fiber.

In some embodiments of the invention, a fiber laser system is provided comprising:
  an optical fiber, comprising a core and at least one clad;
  the pump module according to at least some of the above embodiments, coupled to a first end of the optical fiber; and
  a Fiber Bragg Grating (FBG) or the hybrid pump module according to at least some of the above embodiments, coupled to a second end of the optical fiber.

In some embodiments, the fiber laser system further comprises at least one of: a pump dump and an end-cap element.

Some embodiments of the present invention are based on an addition of a weak $2^{nd}$ harmonic seed beam to a high power fundamental beam prior to the Power Frequency Doubler (PFD) Non-Linear Crystal (NLC). Accordingly, the phase difference between the seed and the fundamental beam is controlled, so as to provide a conjugate phase difference to that which will be incurred in the first PFD NLC. The net result is a minimal Mismatched Phase (MP) from the PFD's input and through the harmonic conversion region in the NLC.

In some embodiments, a temperature- and/or angle-tuned PFD NLC is provided, configured for optimal harmonic conversion in the zone of maximum conversion (the focal waist if a lens is used, or the entire crystal length, if the beam is collimated), and therefore, with addition of the seed beam, sufficient parameters are provided to reach conversion efficiencies within 5% of that achieved in the absence of MP.

In some embodiments of the invention, a new apparatus is provided configured for frequency doubling of optical radiation, the apparatus comprising at least two sequential nonlinear crystals (NLCs):
  a first NLC configured to receive a fundamental beam, at a fundamental frequency ($F_F$), and to emit a weak second harmonic beam, at a second harmonic frequency ($F_H$) together with a strong residual beam, at the fundamental frequency ($F_F$); the power ratio between the weak second harmonic beam and the fundamental beam is smaller than $5 \times 10^{-3}$ to 1, respectively; and
  at least one second NLC, configured to receive a residual beam, at the fundamental frequency ($F_F$), and a second harmonic beam, at the second harmonic frequency ($F_H$), of a previous NLC, and to emit a strong frequency doubled beam, at the second harmonic frequency ($F_H$), together with a residual beam, at the fundamental frequency ($F_F$); the power ratio between the strong frequency doubled beam and the fundamental beam is larger than 0.3 to 1, respectively.

In some embodiments, the apparatus as mentioned above, further comprises at least one phase mismatch compensator (PMC), configured to correct a phase relationship between a residual beam, at the fundamental frequency ($F_F$), and a second harmonic beam, at the second harmonic frequency ($F_H$), prior to being received by the second NLC.

In some embodiments, the apparatus as mentioned above, further comprises at least one feedback and control system, configured to sample the strong frequency doubled beam and accordingly to adjust the PMC to allow maximum power for the strong frequency doubled beam.

In some embodiments, the feedback and control system comprises: at least one measuring element, at least one processing element, and at least one adjusting element configured to adjust the PMC.

In some embodiments, the apparatus as mentioned above, further comprises at least one oven, each configured to adjust temperature of an NLC.

In some embodiments, the length ($L_S$) of the first NLC equals to 10% or less of the length ($L_D$) of the second NLC ($L_S \leq 0.1\ L_D$).

In some embodiments, the second NLC comprises LBO and its length ($L_D$) of is greater than 40 mm.

In some embodiments, the fundamental frequency ($F_F$) comprises a property of infra-red (IR) light ($\lambda_F$=1064 nm), therefore second harmonic frequency ($F_H$) comprises property of visible light ($\lambda_H$=532 nm).

In some embodiments, each of the NLCs is configured with a fundamental beam polarization along a crystallographic axis thereof or with a fundamental beam polarization at 45° to the crystallographic axis thereof.

In some embodiments, each of the NLCs comprises at least one material selected from the group consisting: BBO, KTP, LBO, CLBO, DKDP, ADP, KDP, LiIO3, KNbO3, LiNbO3, AgGaS2, AgGaSe2.

In some embodiments, dimensions of lateral area of each of the NLCs is larger than the dimensions of its received input beams.

In some embodiments, the apparatus as mentioned above, further comprises at least one converging element, configured to focus a beam into an NLC.

In some embodiments of the invention a new method is provided for frequency doubling of optical radiation, the method comprising:
providing a nonlinear crystal (NLC) with a fundamental beam, at a fundamental frequency ($F_F$), and a weak second harmonic beam, at a second harmonic frequency ($F_H$);
thereby emitting via the NLC a strong frequency doubled beam, at the second harmonic frequency ($F_H$), together with a residual beam, at the fundamental frequency ($F_F$);
wherein the power ratio between the provided weak second harmonic beam and the fundamental beam is smaller than $5 \times 10^{-3}$ to 1, respectively;
and wherein the power ratio between the emitted strong frequency doubled beam and the fundamental beam is larger than 0.3 to 1, respectively.

In some embodiments, the method's step of providing further comprises a step of phase mismatch compensating between the fundamental and the weak second harmonic beams; and wherein the method further comprises controlling the PMC to allow maximum power for the strong frequency doubled beam.

In some embodiments of the invention, an apparatus is provided configured to double frequency of an input of optical radiation and to provide an output beam comprising a second harmonic frequency. The apparatus comprising:
at least two sequential nonlinear crystals (NLCs); each NLC, configured to receive a first beam at a fundamental frequency ($F_F$), and optionally a second beam at a second harmonic frequency ($F_H$) from a previous NLC, and to emit a strong frequency doubled beam, at the second harmonic frequency ($F_H$), together with a residual beam, at the fundamental frequency ($F_F$);
at least one phase mismatch compensator (PMC), positioned between the two NLCs; the PMC is configured to correct a phase relationship between a residual beam, at the fundamental frequency ($F_F$), and a second harmonic beam, at the second harmonic frequency ($F_H$), prior to being received by the following NLC; and
a motorized rotation device per each the PMC, configured to actively rotate the PMC and therefore actively adjust the correction of the phase relationship between the residual beam and the second harmonic beam.

In some embodiments, the apparatus further comprising at least one feedback- and control-system, configured to sample the strong frequency doubled beam and accordingly to tilt the PMC, via the motorized rotation device, to allow maximum power for the strong frequency doubled beam.

In some embodiments, the feedback and control system comprising: at least one beam splitter, at least one measuring element, at least one processing element, and at least one control element configured to control the motorized rotation device.

In some embodiments, the PMC comprises an optically transparent window exhibiting chromatic dispersion, such that the distance through which the beams must pass through the window varies relative to its rotation angle. According to some embodiments, the PMC comprises a plate exhibiting chromatic dispersion, such that the distance through which the beams must pass through the window (e.g. an optically transparent plate polished on both sides) varies relative to its rotation angle.

In some embodiments, the motor is configured to rotate the PMC in a step-wise and/or a continuous motion.

In some embodiments, the motor is further configured to rotate the PMC in a Dither form bounded between upper- and lower-values.

In some embodiments, wherein feedback- and control-system is configured to use the Dither form to provide at least one of the following:
minimize back-conversion in the following NLC, thereby maximize power of the output beam;
maximize back-conversion in the following NLC, thereby minimize power of the output beam;
adjust the power of the output beam to a predetermined value between the maximum and the minimum, during static or dynamic operating conditions, which may include varying input laser power and/or varying oven temperatures.

In some embodiments, the motor is configured to rotate the PMC in a toggle mode, between maximum and minimum harmonic conversion states, such that the output beam is turned ON and OFF respectively.

In some embodiments, the motor is configured to rotate the PMC to provide flat-topped pulses of controlled rise and fall times, and of controllable duration.

In some embodiments, the motor is configured to rotate the PMC in accordance with look-up tables, and therefore to provide shaped harmonic pulses.

In some embodiments, the apparatus further comprising at least one dichroic beam splitter configured to separate at least part of the residual beam out of the output beam.

In some embodiments, the power ratio between the emitted strong frequency doubled beam and the emitted fundamental beam is larger than 0.3 to 1, respectively.

In some embodiments, the apparatus further comprising at least one oven, each configured to adjust temperature of the NLCs. In some embodiments, the apparatus further comprising at least two ovens, each oven configured to adjust temperature of a different NLC.

In some embodiments, the active control of the PMC is configured to minimize power variations caused by variations in the temperature of the ovens housing the NLCs.

In some embodiments, at least one of the NLCs comprises LBO and its length ($L_D$) is sufficient to achieve significant harmonic light. In some embodiments, at least one of the NLCs comprises LBO and its length ($L_D$) of is greater than 40 mm.

In some embodiments, the fundamental frequency ($F_F$) comprises a property of infra-red (IR) light ($\lambda_F$=1064 nm), therefore second harmonic frequency ($F_H$) comprises property of visible light ($\lambda_H$=532 nm).

In some embodiments, each of the NLCs is configured with a fundamental beam polarization along a crystallographic axis thereof or with a fundamental beam polarization at 45° to the crystallographic axis thereof.

In some embodiments, each of the NLCs comprises at least one material selected from the group consisting: BBO, KTP, LBO, CLBO, DKDP, ADP, KDP, LiIO3, KNbO3, LiNbO3, AgGaS2, AgGaSe2.

In some embodiments, dimensions of lateral area of each of the NLCs is larger than the dimensions of its received input beams.

In some embodiments, the apparatus further comprising at least one achromatic converging element, configured to focus the fundamental and harmonic beams into an NLC.

In some embodiments of the invention, a method is provided for activating ("ON") and/or deactivating ("OFF") a doubled frequency output beam from the above mentioned apparatus; the method comprising:

sampling and measuring the output beam;
determining if the output beam reached a required Maximum value, for an "ON" output (or a required Minimum, for an "OFF" output),
if "NO" rotating the PMC, and repeating the method from the sampling step;
if "YES" keeping the current angle $\alpha_{MAX}$ (or $\alpha_{MIN}$), and repeating the method from the sampling step, for any case of dynamic input beam and/or dynamic oven temperature.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIGS. 10A, 10B, 10C and 10D schematically illustrate hybrid pump modules, according to various embodiments of the invention;

FIGS. 16A and 16B schematically illustrate fiber laser systems, according to some embodiments of the invention;

FIG. 18A schematically demonstrates an example of a temperature variation along the optical axis in a single crystal placed in an oven, set for low power frequency doubling but, operated at high power, according to some embodiments of the invention;

FIG. 18B schematically demonstrates an example of the phase difference between the fundamental and doubled beams accumulated up to each point within the crystal;

FIGS. 19A, 19B and 19C schematically demonstrate temperature retuning of the PFD after addition of a $2^{nd}$ harmonic seed beam with conjugate phase difference for the purpose of achieving minimum MP and optimum temperature in the focal region;

FIG. 30 demonstrates experiment results of Dithered control with feedback, used to optimize the PMC angle, after a change in operating conditions, according to some embodiments of the invention;

FIGS. 31A and 31B demonstrate experiment results of maintaining harmonic power at a maximum value, while reducing fluctuations with respectively a static- and dynamic-PMC, according to some embodiments of the invention;

Figure 1:
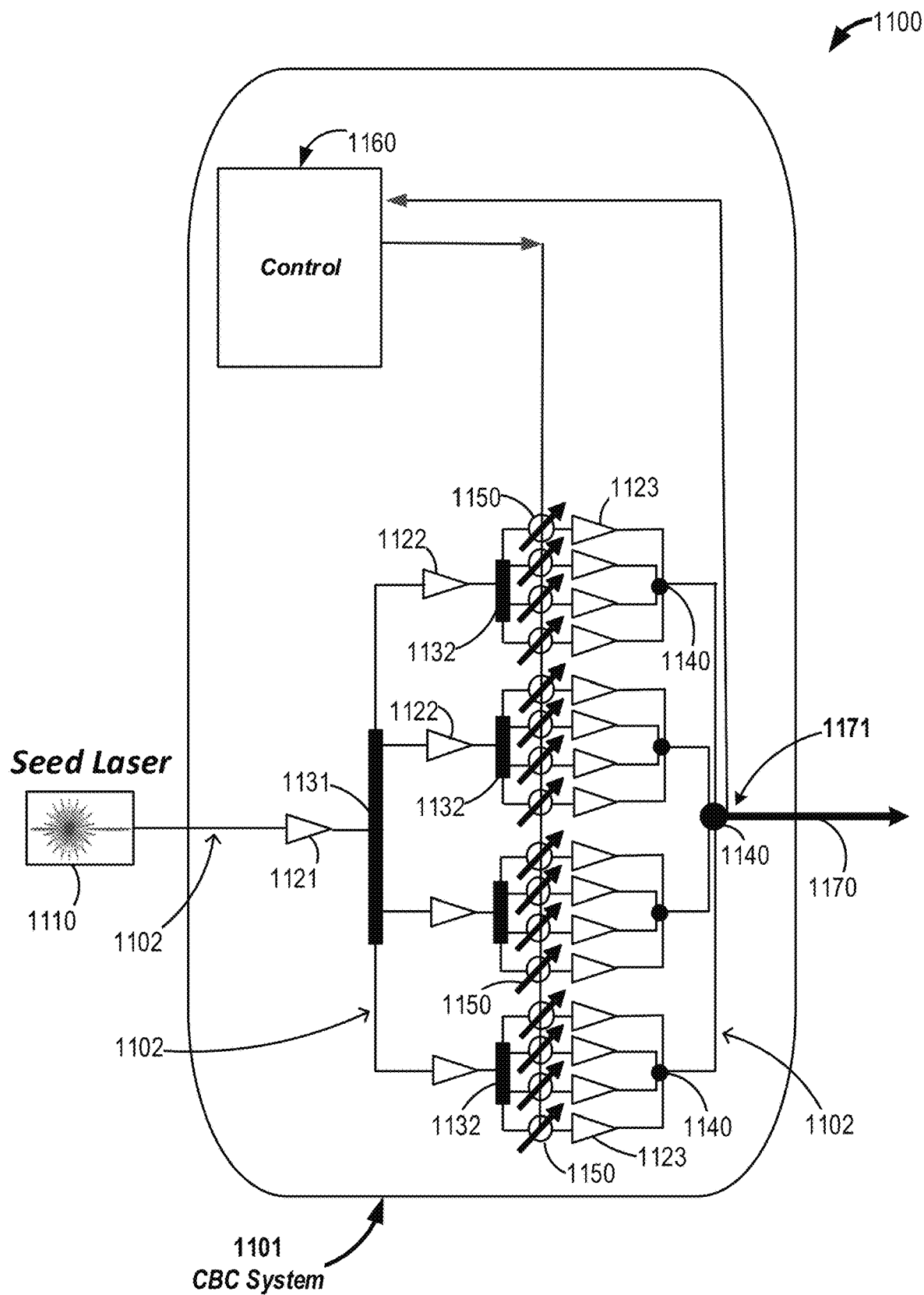
FIG. 1 schematically illustrates a prior art example for a coherent beam combining (CBC) system.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

As used herein, in one embodiment the term "about" refers to ±10%. In another embodiment, the term "about" refers to ±9%. In another embodiment, the term "about" refers to ±9%. In another embodiment, the term "about" refers to ±8%. In another embodiment, the term "about" refers to ±7%. In another embodiment, the term "about" refers to ±6%. In another embodiment, the term "about" refers to ±5%. In another embodiment, the term "about" refers to ±4%. In another embodiment, the term "about" refers to ±3%. In another embodiment, the term "about" refers to ±2%. In another embodiment, the term "about" refers to ±1%.

Methods and Systems for Modulating a Laser Beam

The present invention relates to methods and apparatuses for manipulating and modulating of laser beams from lasers, laser beam arrays and fiber-optic arrays. More specifically, the present invention provides methods and apparatuses that enable activating and deactivating of laser beams, while the laser systems maintain their operating power, for example, without turning off or reducing the system's source of power or without blocking the seed laser beam. Therefore, without damaging components such as for example the amplifiers, and saving (shortening) operating time by means of enabling higher operation frequency (for example modulation frequency can reach 10 GHz).

An example for a laser amplifying system, a coherent beam combining (CBC) system, is disclosed in U.S. publication 2013/0107343, which demonstrates a laser system including a seed laser and an optical amplification subsystem, receiving an output of the seed laser and providing an amplified laser output; the optical amplification subsystem includes a first plurality of amplifier assemblies, each of the first plurality of amplifier assemblies includes a second plurality of optical amplifiers, and phase control circuitry which includes phase modulating functionality associated with each of the first plurality of amplifier assemblies.

A general or typical model/design for a coherent beam combining (CBC) is demonstrated in FIG. 1. The system 1100 includes a seed laser 1110, configured to provide a seed beam to the CBC system 1101. The CBC system 1101 comprises a first optical amplifier 1121, receiving an output of the seed laser 1110 and providing a first amplified output beam. A first beam splitter 1131 splits the first output beam into a first plurality of input beams, to be received by a second plurality of optical amplifiers 1122, arranged in parallel configuration. The second plurality of optical amplifiers 1122 is configured to provide a second plurality of amplified output beams. The second plurality of output beams are then split by a second plurality of beam splitters 1132, which provide a second plurality of input beams, received by a third plurality of optical amplifiers 1123, arranged in parallel configuration, providing a third plurality of amplified output beams. The third plurality of amplified output beams is then coherently combined into a single CBC output beam 170. The coherent combination can be provided, for example, by at least one beam combiner 1140, which is/are configured to provide the beam interference, at a location noted as a CBC point 1171, thereby the CBC output beam. The coherent beam combination can be alternatively provided in free space (free space collimated, without any combiners; not shown), where the beam interference occurs at the location noted as CBC point 1171.

The CBC system further comprises a phase control circuitry 1160 including phase modulating functionality 1150, associated with each of the second plurality of input beams. The control circuitry 1160 is configured to monitor the beam interference at the CBC point 1171 and to control the phase of each of the second plurality input beams, via the plurality of the phase modulators 1150, such that a constructive beam interference is received at the CBC point 1171. It is noted that, all optical connections can be provided via optical fibers 1102. It is also noted that, the optical amplifiers 1121, 1122, 1123 may be configured for same- or different-intensity features; beam combiners 1140 may be configured as described in U.S. publication 2013/0107343, FIGS. 4A and 4B.

Pulsed operation of lasers refers to any laser which is not classified as continuous wave (CW), so that the optical power appears in pulses of some duration at some repetition rate. This use of laser waves encompasses a wide range of technologies addressing a number of different motivations. Some lasers are pulsed simply because they cannot be run in continuous mode. In other cases, the application requires the production of pulses having as large an energy as possible. Since the pulse energy equals to the average power divided by the repetition rate, this goal can sometimes be satisfied by lowering the rate of pulses so that more energy can be built up in between pulses. Other applications rely on the peak pulse power (rather than the energy in the pulse), especially in order to obtain nonlinear optical effects. For a given pulse energy, this requires creating pulses of the shortest possible duration. Quasi continuous wave (QCW) operation of a laser means that its pump source is switched "on" only for certain time intervals, which are short enough to reduce thermal effects significantly, but still long enough that the laser process is close to its steady state, i.e. the laser is optically in the state of continuous-wave operation. The duty cycle (percentage of "on" time) may be, e.g., a few percent, thus strongly reducing the heating and all the related thermal effects, such as thermal lensing and damage through overheating. Therefore, QCW operation allows the operation with higher output peak powers, at the expense of a lower average power. Taken from: https://en.wikipedia.org/wiki/Pulsed_laser; (see also: https://en.wikipedia.org/wiki/Wikipedia: Text of Creative Commons Attribution-ShareAlike 3.0 Unported License).

A skilled artisan would appreciate that the term "fast optical modulator/s (FOM)" may refer to an electro-optic modulator (EOM) (or electrooptic modulator), which is configured to be used for controlling the power, phase or polarization of a laser beam with an electrical control signal. In some embodiments, the principle of operation may be based on the linear electro-optic effect (also called the Pockels effect), i.e., the modification of the refractive index of a nonlinear crystal by an electric field in proportion to the field strength.

A skilled artisan would appreciate that the term "phase modulator/s" may refer to an optical modulator, which can be used to control the optical phase of a laser beam. Frequently used types of phase modulators are electro-optic modulators based on Pockels cells, and liquid crystal modulators, but it is also possible e.g. to exploit thermally induced refractive index changes or length changes e.g. of an optical fiber, or induce length changes by stretching. Various kinds of phase modulators are used within the area of integrated optics, where the modulated light propagates in waveguides.

A skilled artisan would appreciate that the term "master oscillator power amplifier/s (MOPA)" may refer to a configuration consisting of a master laser (or seed laser) and an optical amplifier to boost the output power. In some embodiments, the power amplifier is a fiber device. According to other embodiments, a MOPA may consist of a solid-state bulk laser and a bulk amplifier, or of a tunable external-cavity diode laser and semiconductor optical amplifier.

A skilled artisan would appreciate that the term "beam splitter" may refers to an optical device, which is configured to split an incident light beam (e.g. a laser beam) into two or more beams, which may or may not have the same optical power. In some embodiments, beam splitters are used as beam combiners, for combining few beams into a single beam. In some embodiments, beam splitters are required for interferometers, auto-correlators, cameras, projectors and laser systems. In some embodiments, beam splitters can include at least one of:

- Dielectric mirror, which may be any partially reflecting mirror that can be used for splitting light beams. In laser technology, dielectric mirrors are often used for such purposes. The angle of incidence, also determining the angular separation of the output beams, for example 45°, which is often convenient, but it can also have other values, and influences the characteristics of the beam splitter. A wide range of power splitting ratios can be achieved via different designs of the dielectric coating.
- Cubes, where the beam separation occurs at an interface within the cube. Such a cube is often made of two triangular glass prisms, which are glued together with some transparent resin or cement. The thickness of that layer can be used to adjust the power splitting ratio for a given wavelength.
- Fiber optic splitter, which is a type of fiber coupler that is used as fiber-optic beam splitters. Such a device can be made by fusion-combining fibers, and may have two or more output ports. As for bulk devices, the splitting ratio may or may not strongly depend on the wavelength and polarization of the input.
- Planar Lightwave Circuit (PLC) Splitters. PLC are either optical integrated circuits (ICs) or optical circuit boards made using optical waveguides to route photons.
- Grating is an optical component with a periodic structure that splits and diffracts light into several beams travelling in different directions. The directions of these beams depend on the spacing of the grating and the wavelength of the light. In some embodiments, grating can be used as beam combiner as well.
- Multimode interference (MMI), which is an optical waveguide having a spatially inhomogeneous structure for guiding light, i.e. for restricting the spatial region in which light can propagate. MMIs can be employed for splitting and combining light beams, e.g. in integrated optical interferometers.

A skilled artisan would appreciate that the term "fiber coupler" or "coupler" may refer to an optical fiber device with one or more input fibers and one or several output fibers. Light from an input fiber can appear at one or more outputs, with the power distribution potentially depending on the wavelength and polarization.

A skilled artisan would appreciate that the term "tap" may refer to a coupler configured for a coupling output ratio of 50:50, 75:25, 90:10, or 99:1. Fiber tapping may use a network tap method that extracts signal from an optical fiber without breaking the connection. Tapping of optical fiber can allow diverting some of the signal being transmitted in the core of the fiber into another fiber or a detector.

A skilled artisan would appreciate that the term "beam interference" or "Interference" may refer to a phenomenon in which two or more light waves superpose to form a resultant wave of greater, lower, or the same amplitude. In a situation, where the resultant wave is bigger than either of the two original, is called "constructive interference"; when the sum of two waves is be less than either wave, alone, which can even equal to zero, is called "destructive interference".

A skilled artisan would appreciate that the term "optical amplifier" may refer to a device which receives some input signal and generates an output signal with higher optical power. In some embodiments, inputs and outputs are laser beams, either propagating in free space or in a fiber. The amplification occurs in a so-called gain medium, which has to be "pumped" (i.e., provided with energy) from an external source. In some embodiments, optical amplifiers are optically, chemically or electrically pumped.

A skilled artisan would appreciate that the term "dichroic mirror" may refer to a mirror with significantly different reflection or transmission properties at two different wavelengths.

A skilled artisan would appreciate that the term "seed laser" may refer to a laser the output which is injected into an amplifier or another laser. Typical types of seed lasers are small laser diodes (single-frequency or gain-switched), short-cavity fiber lasers, and miniature solid-state lasers such as nonplanar ring oscillators (NPROs).

Figure 2:
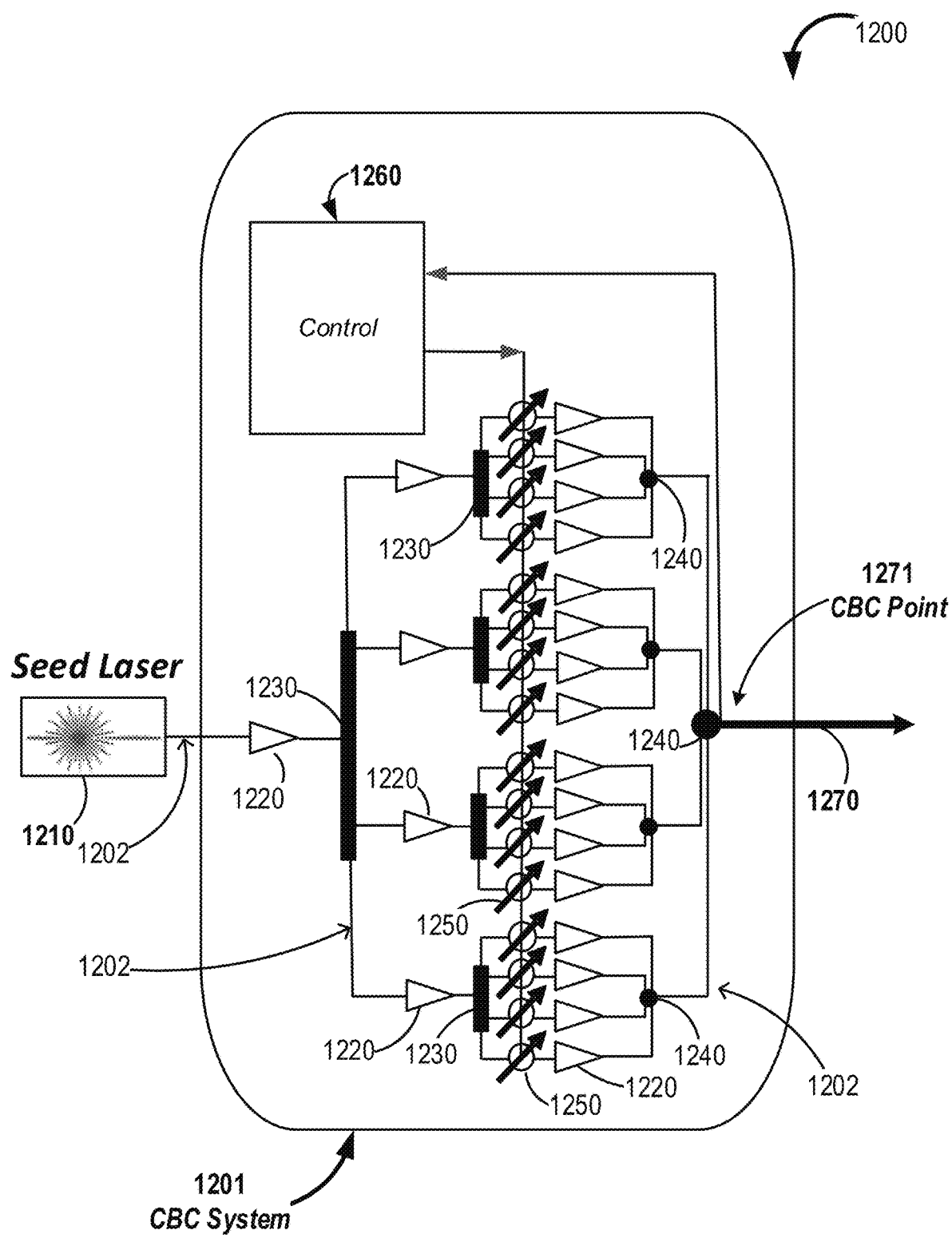
FIG. 2 schematically illustrates a laser system, according to some embodiments, comprising a seed laser device and a coherent beam combining (CBC) system, all configured for modulating an amplified laser beam.

Reference is now made to FIG. 2, which demonstrates a laser system 1200 configured to provide and modulate a laser beam 1270 (more specifically high-power laser beam), according to some embodiments of the invention. The system 1200 comprising:

a coherent beam combining (CBC) system; and at least one seed laser device 1210, configured to provide at least one input seed beam to the CBC system 1201;

the output laser beam 1270 is selectively provided by the CBC system.

In some embodiments of the invention, the components of the CBC system can be provided in many different designs and configurations, some of which are known in the art, for a non-limited example the CBC system 1101 as demonstrated in FIG. 1, or for another on-limited example the CBC system 1101 as demonstrated in FIG. 1, or for another non-limited example the CBC system 1201, as demonstrated in FIG. 2, comprising:

plurality of phase modulators 1250 configured in direct- or indirect-optical connections 1202 (for example via optical fibers) with: the seed beam provided by the seed laser device, plurality of optical amplifiers 1220, at least one beam splitter 1230, and optionally at least one beam combiner 1240 (the beam coherent combination may be provided without any combiners, for example free space collimated; not shown), all arranged to enable constructive or destructive beam interference, at a CBC point 1271; and at least one control circuitry 1260, configured to monitor the beam interference, at the CBC point 1271, and to accordingly control at least one of the phase modulators 1250 to provide a constructive or a destructive beam interference.

In some embodiments, the laser system 1200 is configured to provide a fast and effective modulation of the output laser beam 1270, according to the following method, comprising:

for activating the laser beam 1270 (in other words, when the laser beam 1270 is required to be "on"), controlling the phase modulators 1250, via the control circuitry 1260, to enable a constructive interference, at the CBC point 1271, thereby providing the output laser beam 1270;

for deactivating the laser beam 1270 (in other words, when the laser beam 1270 is required to be "off"), controlling the phase modulators 1250, via the control circuitry 1260, to enable a destructive interference, at the CBC point 1271, thereby preventing the output laser beam 1270.

In some embodiments, the controlling of the phase modulators to enable the constructive interference comprises tuning the phase modulators to provide the laser beam with maximal intensity, at the CBC point 1271.

In some related embodiments, the controlling of the phase modulators to enable the destructive interference comprises controlling half of the phase modulators 1250, which were previously tuned to provide the maximal beam intensity, to add a half phase (n) to their previously tuned beams.

According to other related embodiments, the controlling of the phase modulators to enable the destructive interference comprises modifying some of the phase modulators 1250, which were previously tuned to provide the maximum beam intensity; the modifying can be same, or different one from another.

In some embodiments, a constructive interference is considered, if the laser intensity is larger than 50% the maximum intensity; wherein preferably a constructive interference is considered, if the laser intensity is about 100% of the maximum intensity. In some embodiments, a destructive interference is considered, if the laser intensity is equal or less than 50% the maximum intensity; wherein preferably a destructive interference is considered, if the laser intensity is about 0% of the maximum intensity.

In some other related embodiments, the method further comprises a step of tuning the laser beam 1270, by modifying some of the phase modulators (via controller 1260), which were tuned to provide the maximum beam intensity, wherein the modifying is configured to cause the intensity of the output laser beam 1270 to equal to a predetermined percentage ranging between 0% and 100% (for example: 5%, 10%, 25%, 50%, 75%, 90%, 95% or any other percentage) of the previously provided maximum intensity.

In some embodiments, the controlling of the phase modulators, via controller 1260, to enable the destructive interference comprises modifying the phase modulators to provide the laser beam with minimal intensity, at the CBC point 1271.

Figure 3:
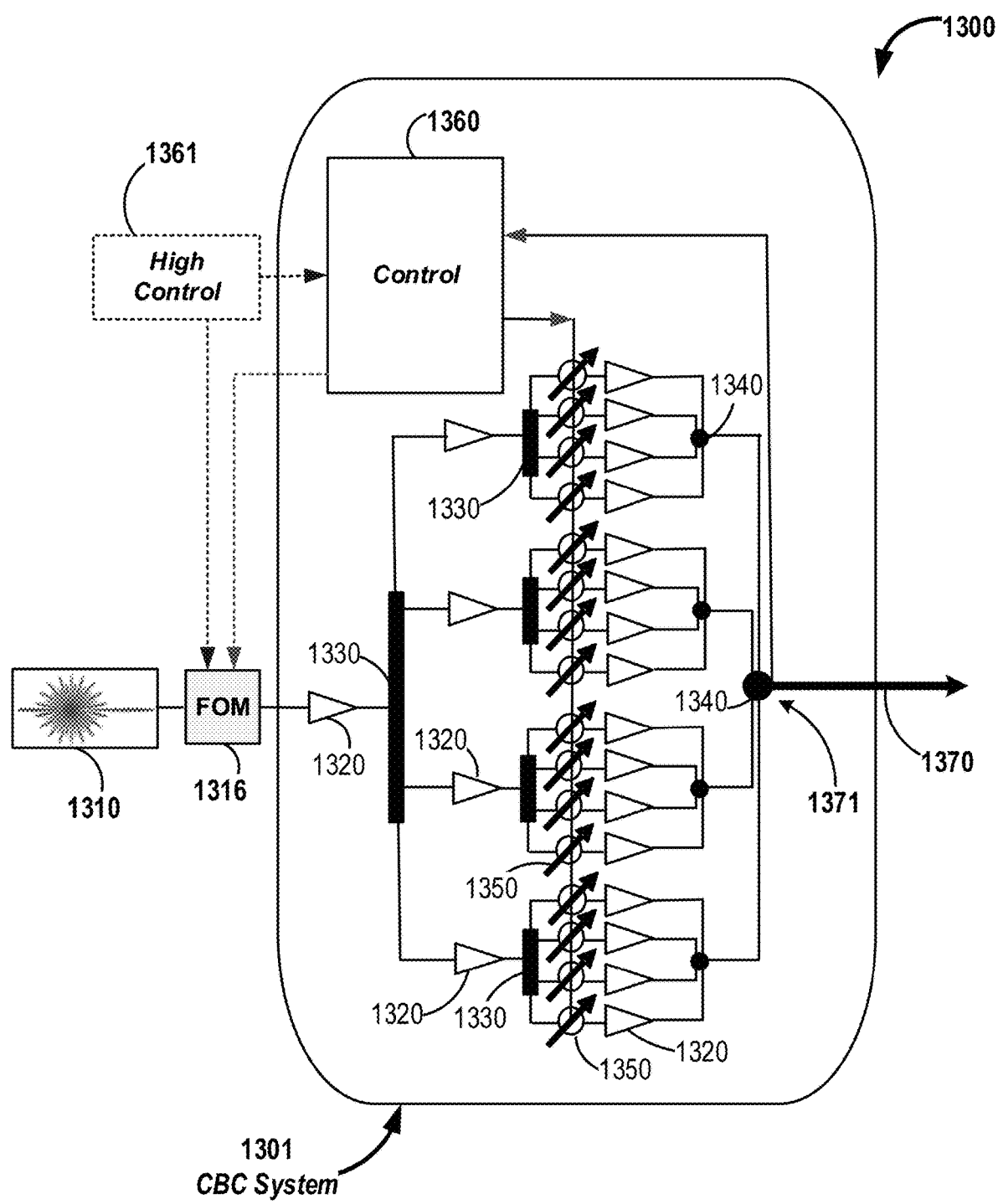
FIG. 3 schematically illustrates a laser system, according to some embodiments, comprising a seed laser device, a fast optical modulator (FOM) and a coherent beam combining (CBC) system, all configured for modulating an amplified laser beam.

Reference is now made to FIG. 3, which demonstrates another laser system 1300 configured to provide and modulate a laser beam 1370 (more specifically high-power laser beam), according to some embodiments of the invention. The system 1300 comprising:

- at least one seed laser device 1310;
- a fast optical modulator (FOM) 1316, configured to receive a seed laser beam of the seed laser device and modulate a bandwidth thereof;
- a coherent beam combining (CBC) system 1301, configured to receive the modulated seed beam and accordingly provide an amplified laser beam 1370.

In some embodiments, the FOM 1316 modulation is configured to select between two predetermined bandwidths a first bandwidth ($\Delta\omega_1$) or a second bandwidth ($\Delta\omega_2$), where the second band width is larger than the first bandwidth ($\Delta\omega_2 > \Delta\omega_1$).

In some embodiments, the first bandwidth ($\Delta\omega_1$) is selected such that it's coherence length $Lc_1$ is longer than the root mean square (RMS) of the optical path difference (OPD) between different channels in the system, $Lc_1 > OPD$; and wherein the second bandwidth ($\Delta\omega_2$) is selected such that it's coherence length $Lc_2$ is shorter than the RMS of the OPD between different channels in the system, $Lc_2 < OPD$.

In some embodiments of the invention, the components of the CBC system can be provided in many different designs and configurations, some of which are known in the art, for a non-limited example the CBC system 1101 as demonstrated in FIG. 1, or for another non-limited example the CBC system 1301, as demonstrated in FIG. 3, comprising:

- plurality of phase modulators 1350 configured in direct- or indirect-optical connections (for example via optical fibers) with: the seed beam provided by the seed laser device 1310, plurality of optical amplifiers 1320, at least one beam splitter 1330, and optionally at least one beam combiner 1340 (beam combination can be provided without any combiners, for example free space collimated; not shown), all arranged to enable constructive or destructive beam interference, at a CBC point 1371; and
- at least one control circuitry 1360, configured to monitor the beam interference, at the CBC point 1371, and to accordingly control at least one of the phase modulators 1350 to provide a constructive or a destructive beam interference.

In some embodiments, the laser system 1300 is configured to provide a fast and effective modulation of the output laser beam 1370, according to the following method, comprising:

- for activating the laser beam 1370, controlling the FOM 1316 to provide the seed laser beam with a narrow bandwidth ($\Delta\omega_1$) configured to enable a constructive interference, at a CBC point 1371, thereby providing the output laser beam 1370;
- for deactivating the laser beam 1370, controlling the FOM 1316 to provide the seed laser beam with a wide bandwidth ($\Delta\omega_2$, where $\Delta\omega_2 > \Delta\omega_1$) configured to disable a constructive interference, at the CBC point 1371, thereby preventing the output laser beam 1370.

In some embodiments, wherein the step of controlling the FOM 1316 to provide the seed laser beam with a narrow bandwidth further comprises controlling the phase modulators 1350, via the control circuitry 1360, to enable a constructive interference, at the CBC point 1371.

In some embodiments, the step of controlling the phase modulators to provide the constructive beam interference comprises tuning the phase modulators to provide the constructive beam interference with maximum intensity.

In some embodiments, a constructive interference is considered, if the laser intensity is larger than 50% the maximum intensity; wherein preferably a constructive interference is considered, if the laser intensity is about 100% of the maximum intensity. In some embodiments, a destructive interference is considered, if the laser intensity is equal or less than 50% the maximum intensity; wherein preferably a destructive interference is considered, if the laser intensity is about 0% of the maximum intensity.

In some embodiments, the controlling of the FOM 1316, is provided by at least one control circuitry 1360 of the CBC system 1301. According to other embodiments, the control of the FOM 1316 is provided by higher control circuity 1361 configured to control both the FOM 1316 and the at least one control circuitry 1360 of the CBC system 1301.

Figure 4:
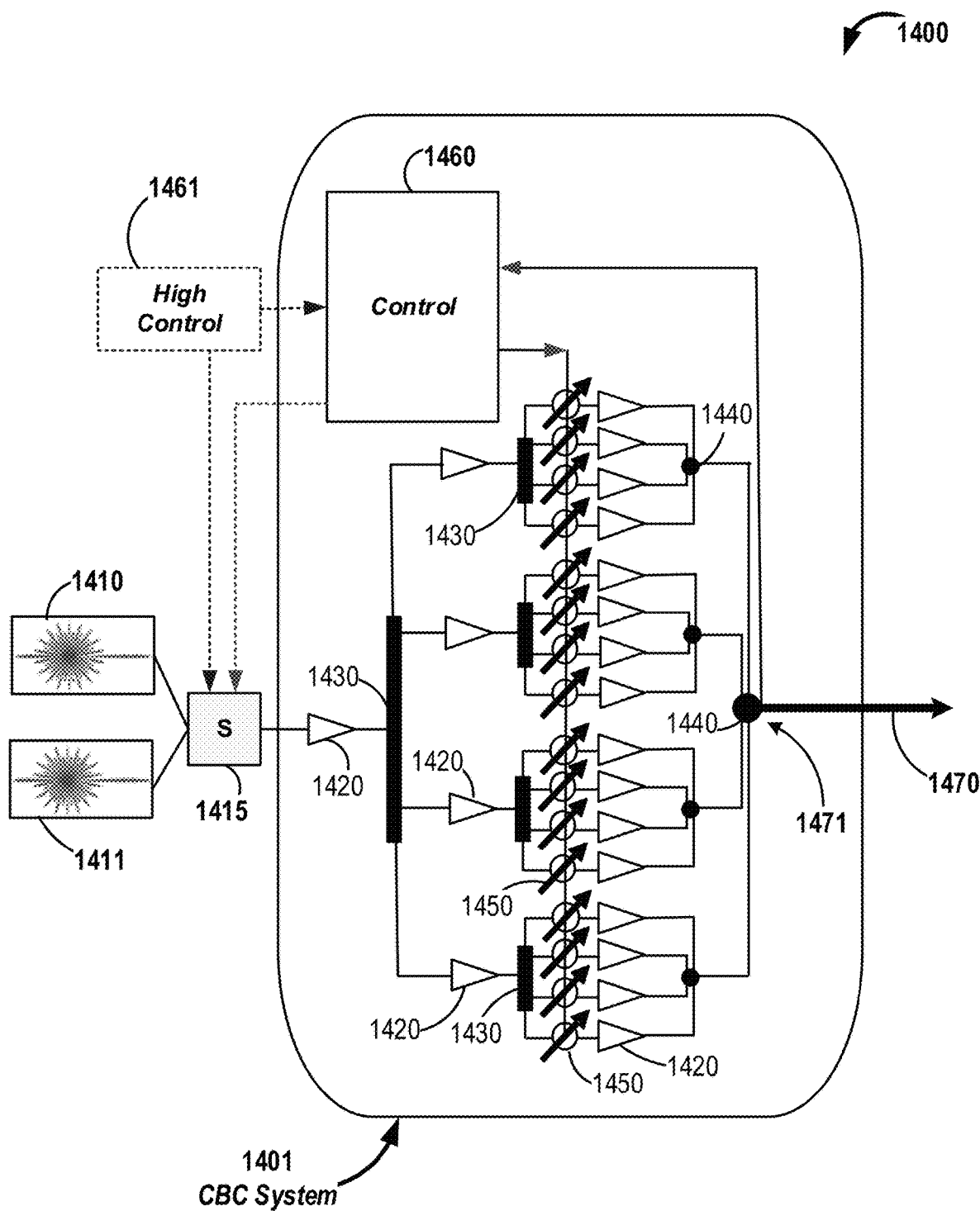
FIG. 4 schematically illustrates a laser system, according to some embodiments, comprising two seed laser devices each providing seed beam with a different wavelength, an optical switch and a coherent beam combining (CBC) system, all configured for modulating an amplified laser beam.

Reference is now made to FIG. 4, which demonstrates another laser system 1400 configured to provide and modulate a laser beam 1470 (more specifically high-power laser beam), according to some embodiments of the invention. The system 1400 comprising:

- a coherent beam combining (CBC) system 1401, configured to receive a seed laser beam and accordingly provide an amplified laser beam 1470;
- a first seed laser device 1410, configured to provide a first seed beam having a first wavelength ($\lambda_1$);
- a second seed laser device 1411, configured to provide a second seed beam having a second wavelength ($\lambda_2$), different from the first wavelength ($\lambda_2 \neq \lambda_1$); and
- an optical switch 1415, configured to link only one of the first and second seed laser beams to the CBC system 1401;

the output laser beam 1470 is accordingly provided by the CBC system 1401.

In some embodiments of the invention, the components of the CBC system can be provided in many different designs and configurations, some of which are known in the art, for a non-limited example the CBC system 1101 as demonstrated in FIG. 1, or for another non-limited example the CBC system 1401, as demonstrated in FIG. 4, comprising:

- plurality of phase modulators 1450 configured in direct- or indirect-optical connections (for example via optical fibers) with: the linked (first or second) seed laser beam, plurality of optical amplifiers 1420, at least one beam splitter 1430, and optionally at least one beam combiner 1440 (beam combination can be provided without any combiners, for example free space collimated; not shown); all arranged to enable a constructive beam interference at a CBC point 1471; and
- at least one control circuitry 1460, configured to monitor the beam interference, at the CBC point 1471, and to accordingly control at least one of the phase modulators.

In some embodiments, the second wavelength ($\lambda_2$) is selected such that it can not provide a constructive beam interference, at the CBC point 1471, if the phase modulators 1450 are tuned to allow a constructive interference, based on the first wavelength ($\lambda_1$).

In some embodiments, the at least one beam combiner 1440 is a diffractive optical element (DOE), which is sensitive to the wavelength, thereby configured to combine beams having a specific wavelength, that is the first wavelength ($\lambda_1$) and to scatter beams having other wavelengths, including the second wavelength ($\lambda_2$). A non-limiting example for such a combiner is a Dammann grating, where the optimal angles between the combined beams are very sensitive to the wavelength. Accordingly, the beams are arranged to achieve maximum combining efficiency for the first seed laser beam having a first wavelength ($\lambda_1$). Therefore, when seed laser beam is switched to the second laser beam having the second wavelength ($\lambda_2$, where $\lambda_2 \neq \lambda_1$), the combining efficiency is dropped down and thus the output beam 1470 is disabled.

In some embodiments, the laser system 1400 is configured to provide a fast and effective modulation of the output laser beam 1470, according to the following method, comprising:

for activating the laser beam 1470, controlling optical switch 1415 to link the first seed beam to the CBC system 1401, and controlling the phase modulators 1450, via the control circuitry 1460, to enable a constructive interference, at a CBC point 1471, thereby providing the output laser beam 1470;

for deactivating the laser beam 1470, controlling optical switch 1415 to link the second seed beam to the CBC system 1401 (without modifying the phase modulators 1450), thereby disabling a constructive interference, at the CBC point 1471, and preventing the output laser beam 1470.

For clarification is noted that, after activating the laser beam 1470, the phase modulators 1450 are tuned to enable a constructive interference at CBC point 1471, based on the first wavelength ($\lambda_1$) of the first seed laser beam 1410, accordingly when the optical switch 1415 links the second seed laser beam having the second wavelength ($\lambda_2$, $\lambda_2 \neq \lambda_1$), the phase modulators 1450 are not re-adjusted, therefore a constructive interference could not occur, thereby disabled. Accordingly, when the optical switch 1415 links the first seed laser beam having the first wavelength ($\lambda_1$) again, the phase modulators 1450 are already adjusted.

In some embodiments $\lambda_1$ and $\lambda_2$ are selected such that their difference ($\lambda_2 \neq \lambda_1$) allows the beam activating and deactivating, according to the above mentioned embodiments and their selected features.

In some embodiments, the step of controlling the phase modulators 1450 to provide the constructive beam interference comprises tuning the phase modulators to provide the constructive beam interference with a maximum intensity.

In some embodiments, a constructive interference is considered, if the laser intensity is larger than 50% the maximum intensity; wherein preferably a constructive interference is considered, if the laser intensity is about 100% of the maximum intensity. In some embodiments, a destructive interference is considered, if the laser intensity is equal or less than 50% the maximum intensity; wherein preferably a destructive interference is considered, if the laser intensity is about 0% of the maximum intensity.

In some embodiments, the controlling of the optical switch 1415, is provided by the at least one control circuitry 1460 of the CBC system 1401. According to other embodiments, the control of the optical switch 1415 is provided by higher control circuity 1461 configured to control both the optical switch 1415 and the at least one control circuitry 1460 of the CBC system 1401.

Figure 5:
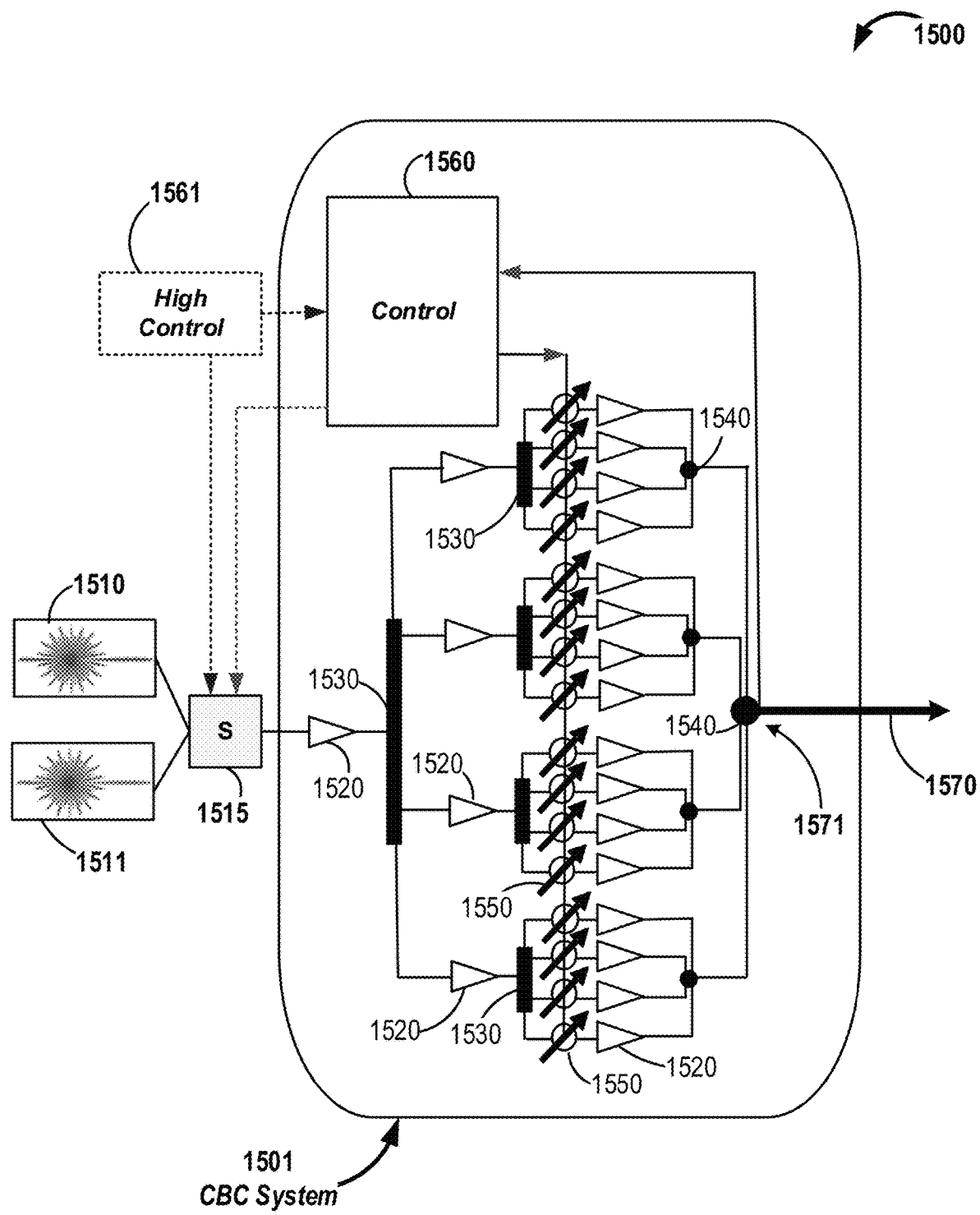
FIG. 5 schematically illustrates a laser system, according to some embodiments, comprising two seed laser devices each providing seed beam with a different bandwidth, an optical switch and a coherent beam combining (CBC) system, configured to modulate an amplified laser beam.

Reference is now made to FIG. 5, which demonstrates a laser system 1500 configured to provide and modulate a laser beam 1570 (more specifically high-power laser beam), according to some embodiments of the invention. The system 1500 comprising:

a coherent beam combining (CBC) system 1501, configured to receive a seed laser beam and accordingly provide an amplified laser beam;

a first seed laser device 1510, configured to provide a first seed laser beam having a narrow bandwidth ($\Delta\omega_1$);

a second seed laser device 1511, configured to provide a second seed laser beam having a wide bandwidth ($\Delta\omega_2$), larger than the first bandwidth (where $\Delta\omega_2 > \Delta\omega_1$); and an optical switch 1515, configured to link only one of the first and second seed laser beams to the CBC system 1501;

wherein the narrow bandwidth ($\Delta\omega_1$) is configured to enable a constructive beam interference, at a CBC point 1571 of the CBC system 1501, and wherein the wide ($\Delta\omega_2$) is configured to disable a constructive beam interference, at the CBC point 1571; the output laser beam 1570 is accordingly provided by the CBC system 1501.

In some embodiments, the first bandwidth ($\Delta\omega_1$) is selected such that it's coherence length $Lc_1$ is longer than the RMS of the optical path difference (OPD) between different channels in the system, $Lc_1 > OPD$; and wherein the second bandwidth ($\Delta\omega_2$) is selected such that it's coherence length $Lc_2$ is shorter than the RMS of the OPD between different channels in the system, $Lc_2 < OPD$.

In some embodiments of the invention, the components of the CBC system can be provided in many different designs and configurations, some of which are known in the art, for a non-limited example the CBC system 1101 as demonstrated in FIG. 1, or for another non-limited example the CBC system 1501, as demonstrated in FIG. 5, comprising:

plurality of phase modulators 1550 configured in direct- or indirect-optical connections (for example via optical fibers) with: the linked (first or second) seed laser beam, plurality of optical amplifiers 1520, at least one beam splitter 1530, and optionally at least one beam combiner 1540 (beam combination can be provided without any combiners, for example free space collimated; not shown); all arranged to enable a constructive beam interference a CBC point 1571; and at least one control circuitry 1560, configured to monitor the beam interference, at the CBC point 1571, and to accordingly control at least one of the phase modulators.

In some embodiments, the laser system 1500 is configured to provide a fast and effective modulation of the output laser beam 1570, according to the following method, comprising:

for activating the laser beam 1570, controlling optical switch 1515 to link the first seed laser beam to the CBC system 1501, thereby enabling a constructive interference, at the CBC point 1571, and providing the output laser beam 1570;

for deactivating the laser beam 1570, controlling optical switch 1515 to link the second seed laser beam to the CBC system 1501, thereby disabling a constructive interference, at the CBC point 1571, and preventing the output laser beam 1570.

In some embodiments, the step of activating further comprises controlling the phase modulators 1550, via the controller 1560, to enable a constructive interference, at the CBC point 1571.

In some embodiments, the step of controlling the phase modulators 1550 to provide the constructive beam interference comprises tuning the phase modulators to provide the constructive beam interference with a maximum intensity.

In some embodiments, a constructive interference is considered, if the laser intensity is larger than 50% the maximum intensity; wherein preferably a constructive interference is considered, if the laser intensity is about 100% of the maximum intensity. In some embodiments, a destructive interference is considered, if the laser intensity is equal or less than 50% the maximum intensity; wherein preferably a destructive interference is considered, if the laser intensity is about 0% of the maximum intensity.

In some embodiments, the controlling of the optical switch 1515, is provided by the at least one control circuitry 1560 of the CBC system 1501. According to other embodiments, the control of the optical switch 1515 is provided by higher control circuitry 1561 configured to control both the optical switch 1515 and the at least one control circuitry 1560 of the CBC system 1501.

Figure 6A:
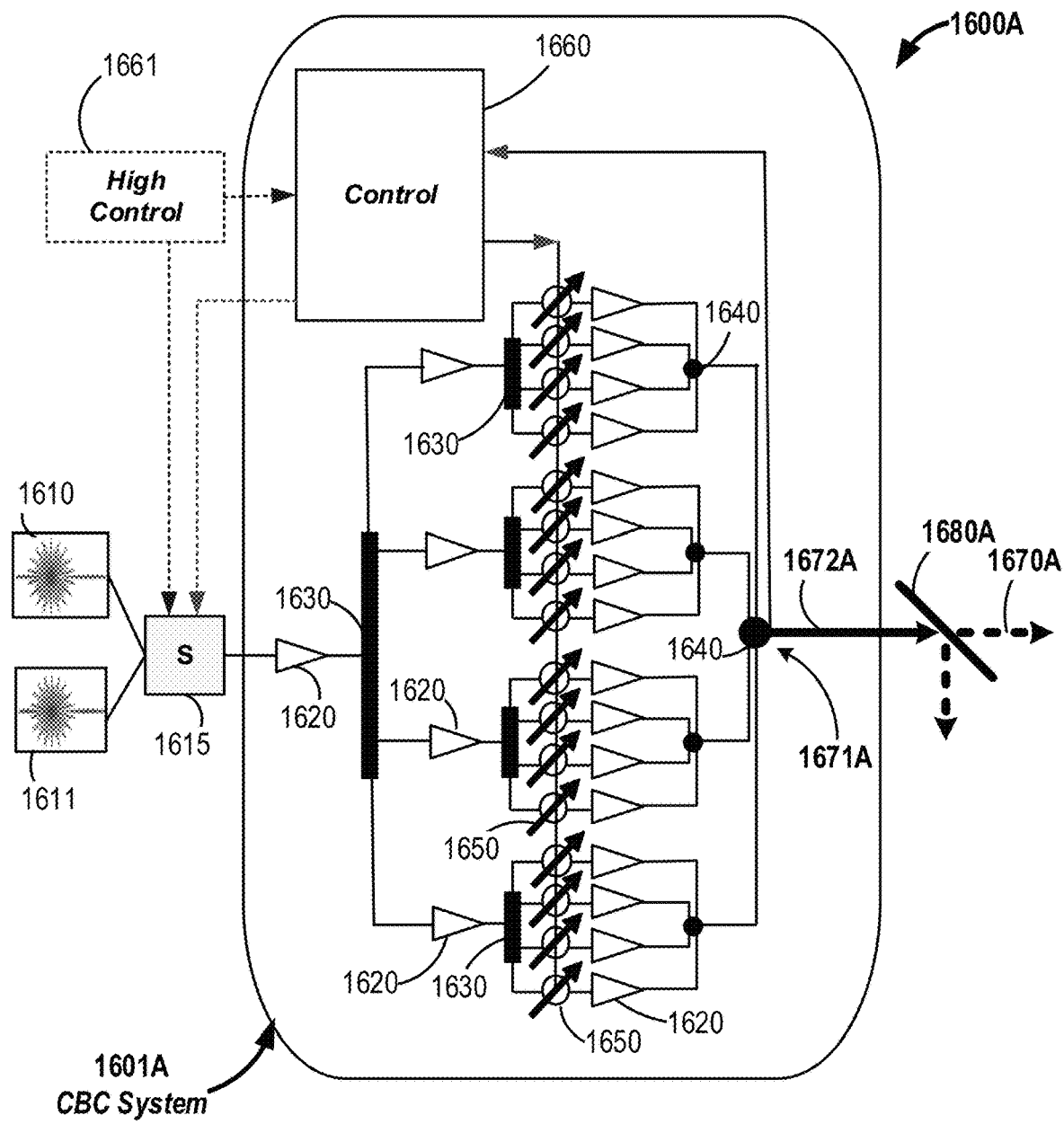
FIG. 6A schematically illustrates a laser system, according to some embodiments, comprising two seed laser devices each providing seed beam with a different wavelength, an optical switch, a dichroic mirror and a coherent beam combining (CBC) system, all configured for modulating an amplified laser beam.
Figure 6B:
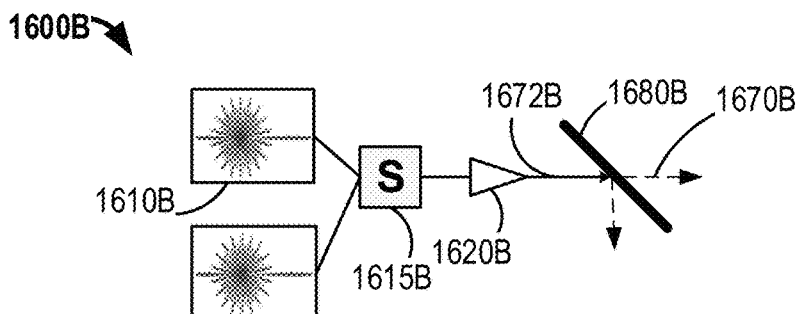
FIG. 6B schematically illustrates a laser system, according to some embodiments, comprising two seed laser devices each providing seed beam with a different wavelength, an optical switch, a dichroic mirror and a master oscillator power amplifier (MOPA), all configured for modulating an amplified laser beam.
Figure 6C:
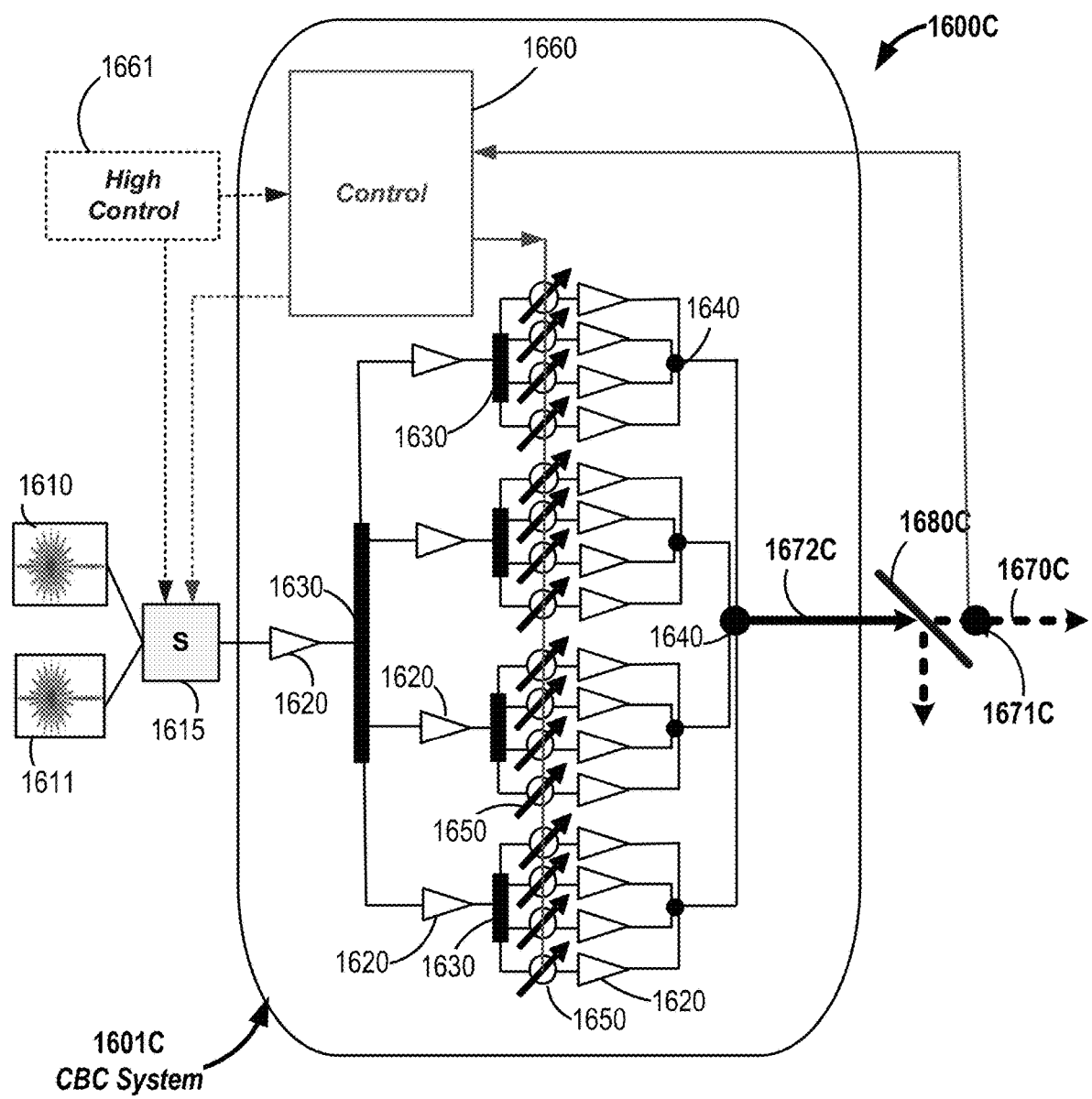
FIG. 6C schematically illustrates another laser system, according to some embodiments, comprising two seed laser devices each providing seed beam with a different wavelength, an optical switch, a dichroic mirror and a coherent beam combining (CBC) system, all configured for modulating an amplified laser beam.

Reference is now made to FIGS. 6A and 6C, which demonstrate laser systems 1600A/1600C configured to provide and modulate a laser beam 1670A/1670C (more specifically high-power laser beam), according to some embodiments of the invention.

The system 1600A, as demonstrated in FIG. 6A comprising:
- a coherent beam combining (CBC) system 1601A, configured to receive a seed beam and provide an amplified laser beam 1672A;
- a first seed laser 1610, configured to provide a first seed beam having a first wavelength ($\lambda_1$);
- a second seed laser 1611, configured to provide a second seed beam having a second wavelength ($\lambda_2$), different from the first wavelength ($\lambda_2 \neq \lambda_1$);
- an optical switch 1615, configured to link only one of the first and second seed beams to the CBC system 1601A; and
- a dichroic mirror 1680A, configured to receive the amplified laser beam 1672A, transmit beams having the first wavelength ($\lambda_1$) to output of the laser system 1600A, and reflect beams having the second wavelength ($\lambda_2$), therefore selectively provide the output laser beam 1670A.

In some embodiments, the first wavelength ($\lambda_1$), the second wavelength ($\lambda_2$) and the dichroic mirror 1680A are selected such that the dichroic mirror 1680A passes more 50% (preferably about 100%) of the beam, when having the first wavelength ($\lambda_1$); and reflects more 50% (preferably about 100%) of the beam, when having the second wavelength ($\lambda_2$).

The system 1600C, as demonstrated in FIG. 6C comprising:
- a coherent beam combining (CBC) system 1601C, configured to receive a seed beam and provide an amplified laser beam 1672C;
- a first seed laser 1610, configured to provide a first seed beam having a first wavelength ($\lambda_1$);
- a second seed laser 1611, configured to provide a second seed beam having a second wavelength ($\lambda_2$), different from the first wavelength ($\lambda_2 \neq \lambda_1$);
- an optical switch 1615, configured to link only one of the first and second seed beams to the CBC system 1601C; and
- a dichroic mirror 1680C, configured to receive the amplified laser beam 1672C, transmit beams having the first wavelength ($\lambda_1$) to output of the laser system 1600C, and reflect beams having the second wavelength ($\lambda_2$), therefore selectively provide the output laser beam 1670C.

In some embodiments, the first wavelength ($\lambda_1$), the second wavelength ($\lambda_2$) and the dichroic mirror 1680C are selected such that the dichroic mirror 1680A passes more 50% (preferably about 100%) of the beam, when having the first wavelength ($\lambda_1$); and reflects more 50% (preferably about 100%) of the beam, when having the second wavelength ($\lambda_2$).

In some embodiments of the invention, the components of the CBC system can be provided in many different designs and configurations, some of which are known in the art, for a non-limited example the CBC system 1101 as demonstrated in FIG. 1, or for another non-limited example the CBC system 1601A, as demonstrated in FIG. 6A, comprising:
- plurality of phase modulators 1650 configured in (direct or indirect) optical connections with: the linked (first or second) seed beam, plurality of optical amplifiers 1620, at least one beam splitter 1630, and at least one beam combiner 1640; all arranged to enable a constructive beam interference, a CBC point 1671A; and
- at least one control circuitry 1660, configured to monitor the beam interference, at the CBC point 1671A, and to accordingly control at least one of the phase modulators.

In some embodiments, for the CBC system configuration 1601A, as demonstrated in FIG. 6A, which comprises at least one beam combiner 1640, the dichroic mirror 1680A can be placed beyond the CBC point 1671A. In some embodiments, the dichroic mirror 1680A can be placed before the CBC point.

According to other embodiments of the invention, the CBC system configuration 1601C is as demonstrated in FIG. 6C, comprising:
- plurality of phase modulators 1650 configured in (direct or indirect) optical connections with: the linked (first or second) seed beam, plurality of optical amplifiers 1620, at least one beam splitter 1630, and where the beam combining is configured to take place in the free space (free space collimated); all arranged to enable a constructive beam interference, at a CBC point 1671C, which in this demonstration is provided at a far field; and
- at least one control circuitry 1660, configured to monitor the beam interference, at the CBC point 1671C, and to accordingly control at least one of the phase modulators.

According to the embodiment presented in FIG. 6C, the dichroic mirror 1680C is placed before the CBC point 1671C.

In some embodiments, the laser systems 1600A/1600C of both configurations shown in FIGS. 6A and 6C are configured to provide a fast and effective modulation of the output laser beam 1670A/1670C, according to the following method, comprising:
- for activating the laser beam 1670A/1670C, controlling optical switch 1615 to link the first seed laser beam to the CBC system 1601A/1601C, thereby transferring and providing the output laser beam 1670A/1670C;
- for deactivating the laser beam 1670A/1670C, controlling optical switch 1615 to link the second seed laser beam to the CBC system 1601A/1601C, thereby reflecting and averting the output laser beam 1670A/1670C.

In some embodiments, the method further comprises a step of controlling the phase modulators 1650, via the control circuitry 1660, to enable a constructive interference, at the CBC point 1671A/1671C. In some embodiments, this step of controlling the phase modulators may take place only during the step of activating the laser beam, and where no phase modulation may accrue during the deactivating.

In some embodiments, the controlling of the phase modulators 1650 to provide the constructive beam interference comprises tuning the phase modulators to provide the constructive beam interference with maximum intensity.

In some embodiments, a constructive interference is considered, if the laser intensity is larger than 50% the maximum intensity; wherein preferably a constructive interference is considered, if the laser intensity is about 100% of the maximum intensity. In some embodiments, a destructive interference is considered, if the laser intensity is equal or less than 50% the maximum intensity; wherein preferably a destructive interference is considered, if the laser intensity is about 0% of the maximum intensity.

In some embodiments, the controlling of the optical switch 1615, is provided by the at least one control circuitry 1660 of the CBC system 1601A/1601C. According to other embodiments, the control of the optical switch 1615 is provided by higher control circuity 1661 configured to control both the optical switch 1615 and the at least one control circuitry 1660 of the CBC system 1601A/1601C.

Reference is now made to FIG. 6B, which demonstrates a laser system 1600B configured to provide and modulate a laser beam 1670B. The system 1600B comprising:

a master oscillator power amplifier (MOPA) 1620B, configured to receive a seed beam and to provide an amplified laser beam 1672B;

a first seed laser 1610B, configured to provide a first seed laser beam having a first wavelength ($\lambda_1$);

a second seed laser 1611B, configured to provide a second seed laser beam having a second wavelength ($\lambda_2$), different from the first wavelength ($\lambda_2 \neq \lambda_1$);

an optical switch 1615B, configured to link only one of the first and second seed laser beams to the MOPA 1620B; and a dichroic mirror 1680B, configured to receive the amplified laser beam 1672B, transmit beams having the first wavelength ($\lambda_1$) to output of the laser system 1600B, and reflect beams having the second wavelength ($\lambda_2$), therefore selectively provide the output laser beam 1670B.

The laser system 1600B is configured to provide a fast and effective modulation of the output laser beam 1670B, according to the following method, comprising:

for activating the laser beam 1670B, controlling optical switch 1615B to link the first seed beam to the MOPA 1620B, thereby transferring and providing the laser beam 1670B;

for deactivating the laser beam 1670B, controlling optical switch 1615B to link the second seed beam to the MOPA 1620B, thereby reflecting and averting the laser beam 1670B.

In some embodiments $\lambda_1$ and $\lambda_2$ are selected such that their difference ($\lambda_2 \neq \lambda_1$) allows the beam activating and deactivating, according to the above mentioned embodiments and their selected features.

Figure 7A:
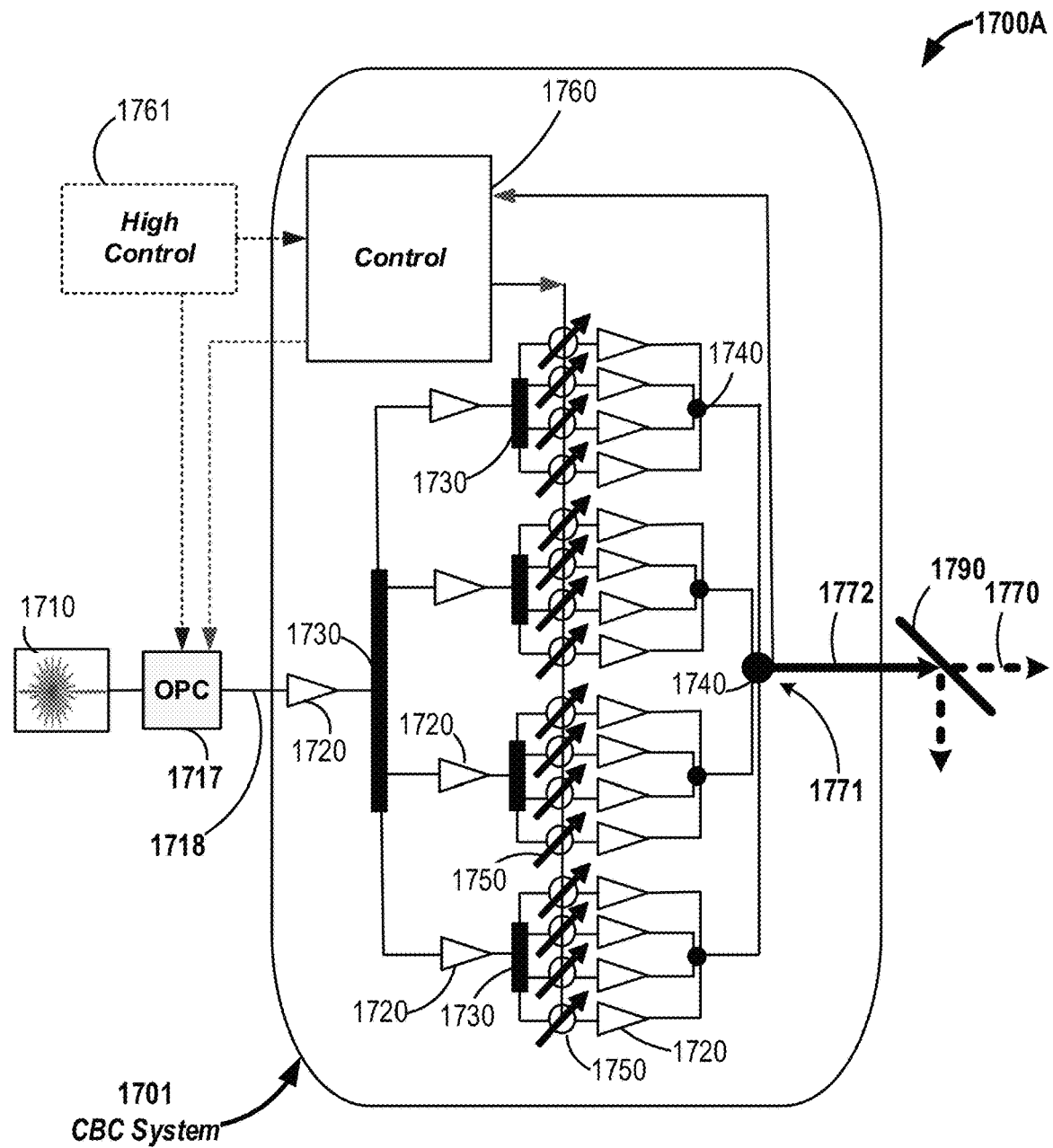
FIG. 7A schematically illustrates a laser system, according to some embodiments, comprising a seed laser device, an optical polarization combiner (OPC), a polarization beam splitter (PBS) and a coherent beam combining (CBC) system, all configured for modulating an amplified laser beam.

Reference is now made to FIG. 7A, which demonstrates a laser system 1700A configured to provide and modulate a laser beam 1770 (more specifically high-power laser beam), according to some embodiments of the invention. The system 1700A comprising:

at least one seed laser device 1710;

an optical polarization combiner (OPC) 1717, configured to receive a seed laser beam of the seed laser device and to modulate polarization directions thereof (its output beam is noted with reference 1718); wherein the modulation comprises providing the seed beam with at least two polarization components, wherein one of the polarization components comprising a predetermined polarization direction ($P_1$);

a coherent beam combining (CBC) system 1701, configured to receive the polarization modulated seed laser beam 1718 and to provide an amplified laser beam 1772; and a polarization beam splitter (PBS) 1790 configured to receive the amplified laser beam 1772 and transmit only beams having the predetermined polarization direction ($P_1$) to output of the laser system 1700A and reflect beams having other polarization directions, therefore selectively provide the laser beam 1770;

the output laser beam 1770 is accordingly provided via the CBC system 1701.

In some embodiments of the invention, the components of the CBC system can be provided in many different designs and configurations, some of which are known in the art, for a non-limited example the CBC system 1101 as demonstrated in FIG. 1, or for another non-limited example the CBC system 1701, as demonstrated in FIG. 7, comprising:

plurality of phase modulators 1750 configured in (direct or indirect) optical connections with: the polarization modulated seed beam 1718, plurality of optical amplifiers 1720, at least one beam splitter 1730, and optionally at least one beam combiner 1740; all arranged to enable a constructive beam interference, at a CBC point 1771; and at least one control circuitry 1760, configured to monitor the beam interference, at the CBC point 1771, and to accordingly control at least one of the phase modulators.

In some embodiments, the laser system 1700A is configured to provide a fast and effective modulation of the output laser beam 1770, according to the following method, comprising:

for activating the laser beam 1770, controlling the OPC 1717 to provide the beam component having the predetermined polarization direction ($P_1$) with an intensity ($I_1$) larger than 50% (preferably about 100%) of the overall intensity of the seed laser beam, thereby providing the output laser beam 1770;

for deactivating the laser beam 1770, controlling the OPC 1717 to provide the beam component having the predetermined polarization direction ($P_1$) with an intensity ($I_1$) equal or less than 50% (preferably about 0%) of the overall intensity of the seed laser beam, thereby averting the output laser beam 1770.

In some embodiments, the method further comprising a step of tuning the laser beam, by controlling the OPC 1717 to provide the beam component having the predetermined polarization direction ($P_1$) with an intensity ($I_1$) equal to a predetermined percentage of the overall intensity of the seed laser beam.

In some embodiments, the method further comprises a step of controlling the phase modulators 1750, via the control circuitry 1760, to enable a constructive interference, at the CBC point 1771. In some embodiments, this step of controlling the phase modulators, may take place only during the step of activating the laser beam, and where no modulation may accrue during the deactivating.

In some embodiments, the controlling of the phase modulators 1750 to provide the constructive beam interference comprises tuning the phase modulators to provide the constructive beam interference with maximum intensity.

In some embodiments, a constructive interference is considered, if the laser intensity is larger than 50% the maximum intensity; wherein preferably a constructive interference is considered, if the laser intensity is about 100% of the maximum intensity. In some embodiments, a destructive interference is considered, if the laser intensity is equal or less than 50% the maximum intensity; wherein preferably a destructive interference is considered, if the laser intensity is about 0% of the maximum intensity.

Figure 8A:
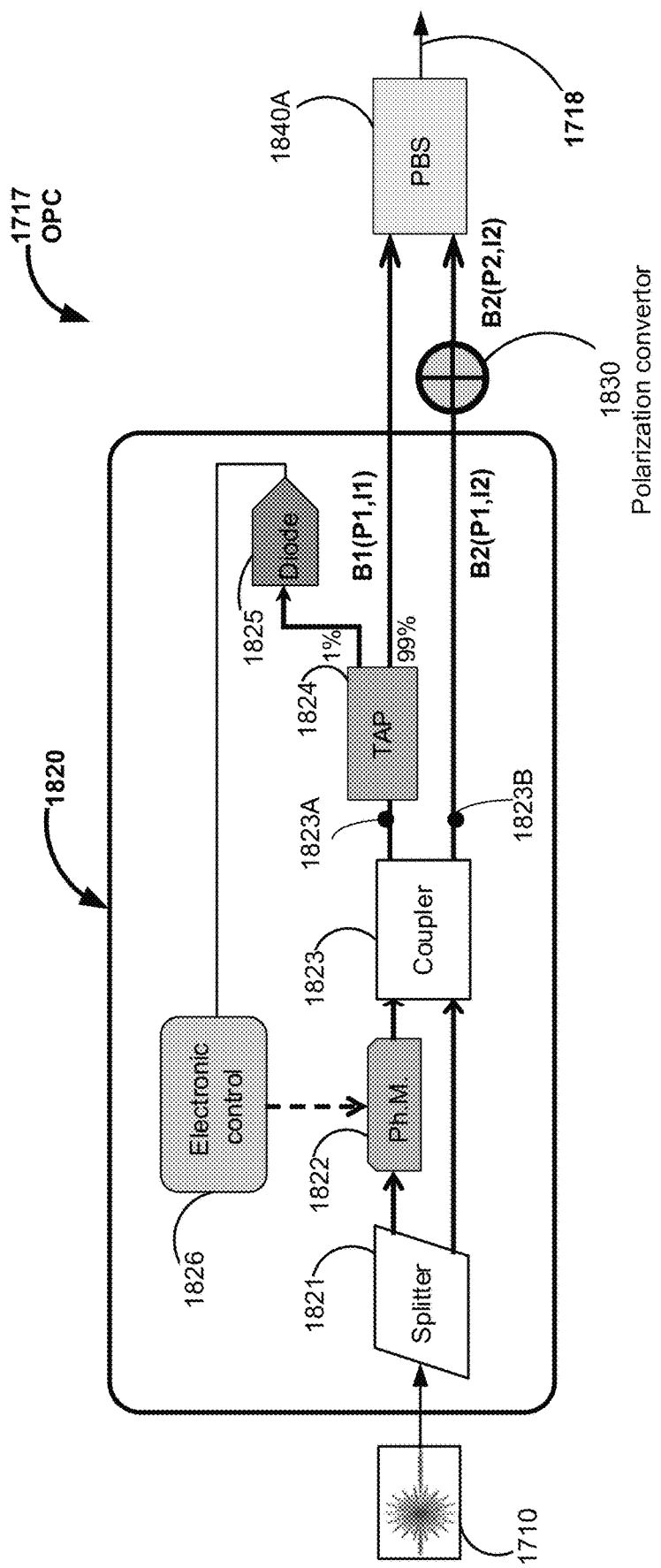
FIG. 8A schematically illustrates an optical polarization combiner (OPC), according to some embodiments.
Figure 8B:
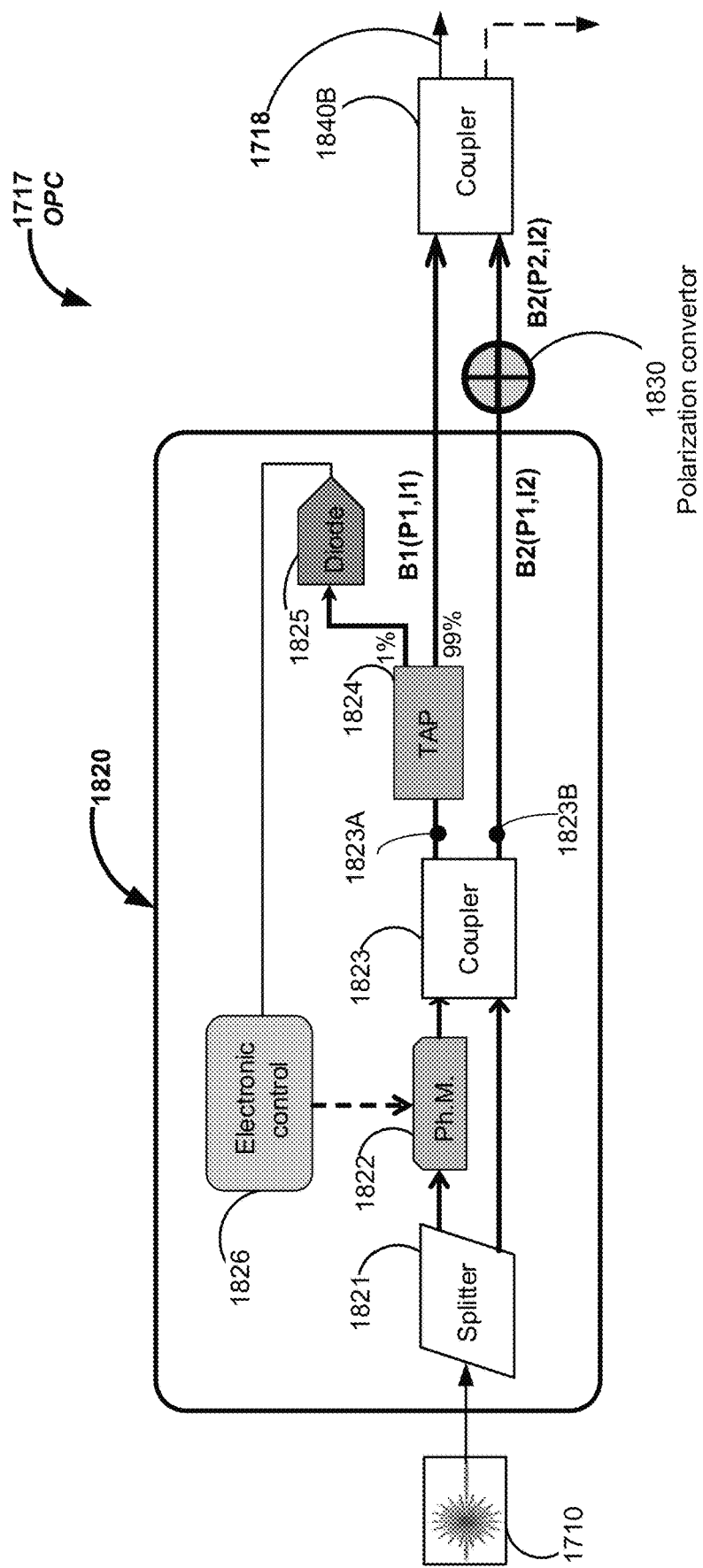
FIG. 8B schematically illustrates another optical polarization combiner (OPC), according to some embodiments.

In some embodiments, and as demonstrated in FIGS. 8A and 8B, the optical polarization combiner (OPC) 1717 comprises:
- a beam splitting assembly 1820, configured to receive an input beam with a first polarization direction ($P_1$) and to output a first beam ($B_1(I_1, P_1)$) having the first polarization direction ($P_1$) and a first intensity ($I_1$) and a second beam ($B_2(I_2, P_1)$) having the first polarization direction ($P_1$) and a second intensity ($I_2$), wherein the sum of the first and second intensities ($I_1+I_2$) equals to the intensity of the input seed beam;
- a polarization convertor 1830, configured to receive one of the beam splitting assembly 1820 output beams ($B_1$ or $B_2$) and to convert its polarization; from S to P, or from P to S, therefore $P_1 \neq P_2$; for example, $B_1(I_1, P_1)$ and $B_2(I_2, P_2)$, in the case the polarization of $B_2$ is converted (as shown in FIGS. 8A and 8B); or for another example, $B_1(I_1, P_2)$ and $B_2(I_2, P_1)$, in the case the polarization of $B_1$ is converted (not shown); and
- a polarization beam splitter (PBS) 1840A (shown in FIG. 8A) configured to receive the first output beam ($B_1(I_1, P_1)$) and the second converted output beam ($B_2(I_2, P_2)$) and to combine them (superimpose) into a third beam, provided as an input to the CBC system 1701; or, a coupler 1840B (shown in FIG. 8B) configured to receive the first output beam ($B_1(I_1, P_1)$) and the second converted output beam ($B_2(I_2, P_2)$), combine them (superimpose), and then split them into two output beams, wherein only one of the two output beams is provided as an input to the CBC system 1701. In some embodiments, the other output beam can be used by another system.

In some embodiments, the beam splitting assembly 1820 comprises:
- a beam splitter 1821, configured to receive an input beam and split the input beam into two output beams; In some embodiments, the relation between the intensities of the two output beams is constant.
- a phase modulator 1822, configured to modulate the phase of one of the two beams;
- a coupler 1823, configured to receive the two beams (after modulating the phase of one of the beams) and to provide their interference at two locations 1823A and 1823B, thereby to provide the first output beam ($B_1(I_1, P_1)$) and the second output beam ($B_2(I_2, P_1)$);
- an electronic controller 1826, configured to monitor one of the two interference locations 1823A, via a TAP 1824 and a diode 1825, and control the phase modulator 1822 to accordingly enable a constructive- or a destructive-beam interference, at the monitored location 1823A, and wherein the non-monitored interference location 1823B is thereby provided with a destructive- or a constructive-beam interference, respectively; thereby determining the first intensity ($I_1$);
- and wherein the method steps of controlling the OPC 1717 comprising controlling the phase modulator 1822 (via controller 1826).

In some embodiments, the controlling of the OPC 1717, is provided by the at least one control circuitry 1760 of the CBC system 1701. According to other embodiments, the control of the optical switch 1717 is provided by higher control circuity 1761 configured to control both the optical switch 1717 and the at least one control circuitry 1760 of the CBC system 1701.

Figure 7B:
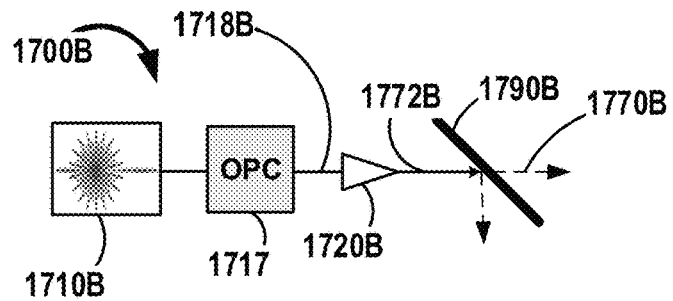
FIG. 7B schematically illustrates a laser system, according to some embodiments, comprising a seed laser device, an optical polarization combiner (OPC), a polarization beam splitter (PBS) and a master oscillator power amplifier (MOPA), all configured for modulating an amplified laser beam.

Reference is now made to FIG. 7B, which demonstrates a laser system 1700B configured to provide and modulate a laser beam 1770B, according to some embodiments of the invention. The system 1700B comprising:
- a seed laser device 1710B;
- an optical polarization combiner (OPC) 1717, configured to receive a seed laser beam of the seed laser device and to modulate polarization directions thereof (its output beam is noted with reference 1718B); wherein the modulation comprises providing the seed beam with at least two polarization components, wherein one of the polarization components comprising a predetermined polarization direction ($P_1$);
- a master oscillator power amplifier (MOPA) 1720B, configured to receive a seed beam and provide an amplified laser beam 1772B; and
- a polarization beam splitter (PBS) 1790B configured to receive the amplified laser beam 1772B and transmit only beams having the predetermined polarization direction ($P_1$) to output of the laser system 1700B and reflect beams having other polarization directions, therefore selectively provide the output laser beam 1770B.

The laser system 1700B is configured to provide a fast and effective modulation of the output laser beam 1770B, according to the following method, comprising:
- for activating the laser beam 1770B, controlling the OPC 1717 to provide the beam component having the predetermined polarization direction ($P_1$) with an intensity ($I_1$) larger than 50% (preferably about 100%) of the overall intensity of the beam, thereby providing the laser beam 1770B;
- for deactivating the laser beam 1770B, controlling the OPC 1717 to provide the beam component having the predetermined polarization direction ($P_1$) with an intensity ($I_1$) equal or less than 50% (preferably about 0%) of the overall intensity of the beam, thereby averting the laser beam 1770B.

It is noted that all embodiments of the invention provide laser modulating methods and/or systems that keep the seed lasers and the CBC systems (and its various components) active during both modulation states (beam "on"/beam "off"), thereby preventing any of damage that may occur from seed beam "shutting" or "blocking", as described in the background.

In some embodiments of the invention, the laser modulating methods and/or systems 1200, 1300, 1400, 1500, 1600A, 1600B, 1600C, 1700A, 1700B mentioned above can be controlled, via their controllers, and be used for quasi continuous wave (QCW) operation of a laser means, at very high frequencies up to 10's of GHz (for example: 10 MHz, 100 MHz, 1 GHz, 10 GHz, 100 GHz and any combination thereof), depends on the limitation of the switching elements. In some embodiments of the invention, the laser modulating methods and/or systems 1200, 1300, 1400, 1500, 1600A, 1600B, 1600C, 1700A, 1700B mentioned above can be controlled, via their controllers, and be used for quasi continuous wave (QCW) operation of a laser means, at various duty cycle measures ranging between 0% and 100% (for example: 1%, 5%, 10%, 25%, 50%, 75%, 95%, 99%, and any combination thereof).

In some embodiments of the invention, at least some of the above mentioned methods using the above mentioned systems 1200, 1300, 1400, 1500, 1600A, 1600B, 1600C, 1700A, 1700B, can be combined into one laser system, for more flexible operating of a laser beam.

Hybrid Fiber-Coupled Diode Pump Laser Module

In some embodiments, the present invention relates to methods and apparatuses configured to provide optical signal amplifiers and more specifically a hybrid fiber-coupled diode pump laser module (and in short, a hybrid pump module), configured to be coupled to an optical fiber. A skilled artisan would appreciate that the term "hybrid" refers may refer to according to some embodiments the combination of pump and signal.

A skilled artisan would appreciate that a fiber amplifying system is configured to absorb and couple energy from several multi-mode pumps and usually one single-mode seed device, and amplify it to output a high-power single-mode beam.

Figure 9:
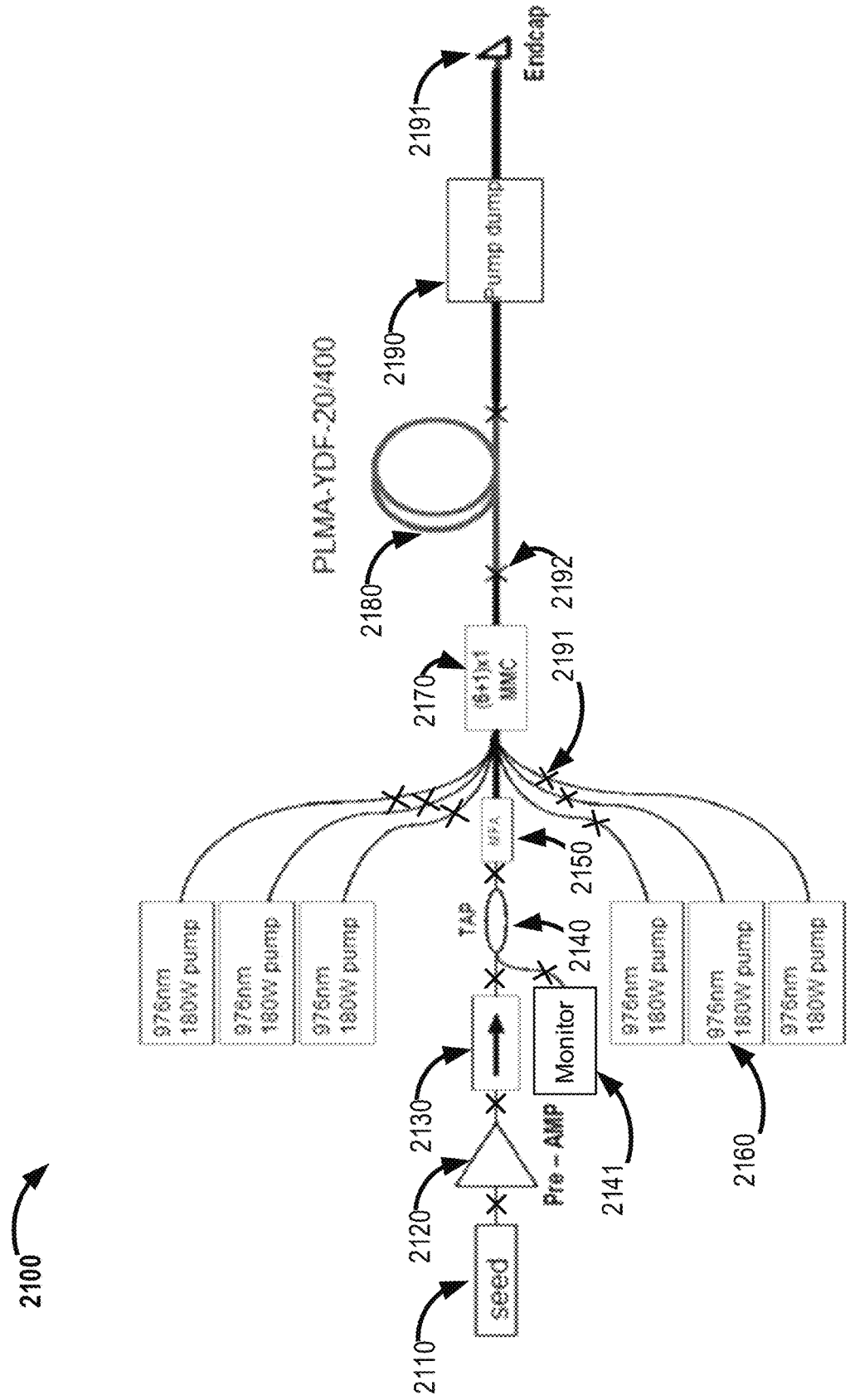
FIG. 9 schematically illustrates a prior art example for a fiber amplifying system.

A general or typical model/design for a fiber amplifying system is demonstrated in FIG. 9. The fiber amplifying system 2100 includes: a seed lasing device 2110, connected via optical fibers (marked with lines – and fusion point signs ×) to an amplifier 2120, an isolator 2130, a tap element 2140 and a monitor 2141, and mode field adaptor (MFA) 2150, all as an input for a multi-mode combiner (MMC) 2170, which is configured to combine the optical fibers of the six pump modules 2160 together with the one optical fiber originating from the seed device into the active fiber 2180. The active fiber is configured to receive an input signal and generate an output signal with higher optical power. As shown, the active fiber is connected at first end to the MMC (as mentioned above) and at the second end to a pump dump 2190, configured to dump the residual pump power and scattered signal in the clad, where the output of the system is usually via an output fiber having an end-cap 2191. As demonstrated the use of optical fibers for transferring light beams require multiple fusion points 2192, symbolically signed with an "×".

A skilled artisan would appreciate that the above mentioned "fusion points" are also known as fusion splices. A skilled artisan would appreciate that fusion splicing is the act of joining two optical fibers end-to-end using heat. The goal is to fuse the two fibers together in such a way that light passing through the fibers is not scattered or reflected back by the splice, and so that the splice and the region surrounding it are almost as strong as the original fiber itself. Prior to the removal of the spliced fiber from the fusion splicer, a proof-test is performed to ensure that the splice is strong enough to survive handling, packaging and extended use. The bare fiber area is protected either by recoating or with a splice protector. Accordingly, there is a need for a fiber amplifying system that can reduce the number of fusion points, can reduce energy loss and production costs.

A skilled artisan would appreciate that the term "multi-mode combiner (MMC)" may refer to an optical component configured to combine the several fibers into one fiber (in the example of FIG. 9: six pump connected fibers +one seed connected fiber), which is compatible with a fiber amplifier, such that the light from the pump modules enters the clad and the light from the seed enters the core. The MMC is a complicated device (e.g. need special features to dispense heat) and therefore expensive.

A skilled artisan would appreciate that the term "fiber amplifier" or "active fiber amplifier" may refer, according to some embodiments, to a doped fiber that receives power from several pump modules and a seed module (e.g. FIG. 9: six multi-mode beams+one single-mode beam) and outputs a single-mode beam (due to the single-mode seed) having enhancement. Over all diameter can be about 400 micro-meter where the core diameter can be about 20 micro-meter. The light from the pump modules enters the clad and the light from the seed enters the core. For example, fiber amplifiers are based on "active" fibers, having a fiber core, which is doped with laser-active ions such as Er3+, Nd3+ or Yb3+. Normally a fiber coupler is used to introduce some "pump light" in addition to the input signal light. This pump light is absorbed by the laser-active ions, transferring them into excited electronic states and thus allowing the amplification of light at other wavelengths via stimulated emission.

A skilled artisan would appreciate that the term "pump dump" may refer, according to some embodiments of the invention, to a beam dump, which is a device designed to absorb or deflect residual un-absorbed pump power or scattered signal in the clad. For the example of FIG. 9, absorbing emission left in the clad of the active fiber.

A skilled artisan would appreciate that the term "isolator" may refer, according to some embodiments of the invention, to an optical element configured to allow transmission of light in one direction only.

A skilled artisan would appreciate that the term "pump modules" may refer, according to some embodiments of the invention, to modules with diodes therein providing multi-mode beams. A skilled artisan would appreciate that the term "broad area laser (BAL) diodes" may refer to diodes providing multi-mode beams with an oval shape cross section. BALs (also called broad stripe or broad emitter laser diodes, single-emitter laser diodes, and high brightness diode lasers) are edge-emitting laser diodes, where the emitting region at the front facet has the shape of a broad stripe.

A skilled artisan would appreciate that the term "single-mode" may refer, according to some embodiments of the invention, an optical beam having only one transverse mode excited.

A skilled artisan would appreciate that the term "polarizer beam combiner" may refer, according to some embodiments of the invention, to an optical element that is configured to combine together two signals with perpendicular polarizations.

A skilled artisan would appreciate that the term "volume Bragg grating (VBG)" may refer, according to some embodiments of the invention, to an optical means comprising a grating within a glass block configured to reflect an incident beam with an angel relative to the incident beam wavelength. A typical application of volume Bragg gratings is the wavelength stabilization of lasers, most often of laser diodes.

A skilled artisan would appreciate that the term "end cap" may refer, according to some embodiments of the invention, to an optical means configured to expand a beam's cross section. Fiber end caps are created by fusion splicing or laser fusing short lengths of material to the fiber end face. Fiber end caps are required for a number of applications including the creation of collimators, to allow expansion of high power fiber laser beams to reduce the power density at the air/silica interface and to protect structured fibers against environmental ingress.

A skilled artisan would appreciate that the term "phase modulator/s" may refer, according to some embodiments of the invention, to an optical modulator, which can be used to control the optical phase of a laser beam. Frequently used types of phase modulators are electro-optic modulators based on Pockels cells, Litium Niobate (LiNbO3) Electro Optic Modulatorsd and liquid crystal modulators, but it is also possible e.g. to exploit thermally induced refractive index changes or length changes e.g. of an optical fiber or induce length changes by stretching. Various kinds of phase modulators are used within the area of integrated optics, where the modulated light propagates in waveguides.

A skilled artisan would appreciate that the term "beam splitter" may refer, according to some embodiments of the invention, to an optical device, which is configured to split an incident light beam (e.g. a laser beam) into two or more beams, which may or may not have the same optical power. In some embodiments, beam splitters are used as beam combiners, for combining few beams into a single beam. In some embodiments, beam splitters are required for interferometers, auto-correlators, cameras, projectors and laser systems. In some embodiments, beam splitters can include:

dielectric mirror, which may be any partially reflecting mirror that can be used for splitting light beams. In laser technology, dielectric mirrors are often used for such purposes. The angle of incidence, also determining the angular separation of the output beams, for example 45°, which is often convenient, but it can also have other values, and influences the characteristics of the beam splitter. A wide range of power splitting ratios can be achieved via different designs of the dielectric coating.

cubes, where the beam separation occurs at an interface within the cube. Such a cube is often made of two triangular glass prisms, which are glued together with some transparent resin or cement. The thickness of that layer can be used to adjust the power splitting ratio for a given wavelength.

fiber optic splitter, which is a type of fiber coupler that is used as fiber-optic beam splitters. Such a device can be made by fusion-combining fibers, and may have two or more output ports. As for bulk devices, the splitting ratio may or may not strongly depend on the wavelength and polarization of the input.

grating is an optical component with a periodic structure that splits and diffracts light into several beams travelling in different directions. The emerging coloration is a form of structural coloration. The directions of these beams depend on the spacing of the grating and the wavelength of the light so that the grating acts as the dispersive element. In some embodiments, grating can be used as beam combiner as well.

A skilled artisan would appreciate that the term "fiber coupler" or "coupler" may refer, according to some embodiments of the invention, to an optical fiber device with one or more input fibers and one or several output fibers. Light from an input fiber can appear at one or more outputs, with the power distribution potentially depending on the wavelength and polarization.

A skilled artisan would appreciate that the term "tap" or "tap element" may refer, according to some embodiments of the invention, to a coupler configured for a coupling output ratio of 50:50, 75:25, 90:10, or 99:1. Fiber tapping may use a network tap method that extracts signal from an optical fiber without breaking the connection. Tapping of optical fiber can allow diverting some of the signal being transmitted in the core of the fiber into another fiber or a detector or a monitor.

A skilled artisan would appreciate that the term "optical amplifier" may refer, according to some embodiments of the invention, to a device which receives some input signal and generates an output signal with higher optical power. In some embodiments, inputs and outputs are laser beams, either propagating in free space or in a fiber. The amplification occurs in a so-called gain medium, which has to be "pumped" (i.e., provided with energy) from an external source. In some embodiments, optical amplifiers are optically, chemically or electrically pumped.

A skilled artisan would appreciate that the term "dichroic mirror" may refer, according to some embodiments, to a mirror with significantly different reflection or transmission properties at two different wavelengths.

A skilled artisan would appreciate that the term "seed laser" may refer to, according to some embodiments of the invention, a laser the output which is injected into an amplifier or another laser. Typical types of seed lasers are small laser diodes (single-frequency or gain-switched), short-cavity fiber lasers, and miniature solid-state lasers such as nonplanar ring oscillators (NPROs).

Figure 12:
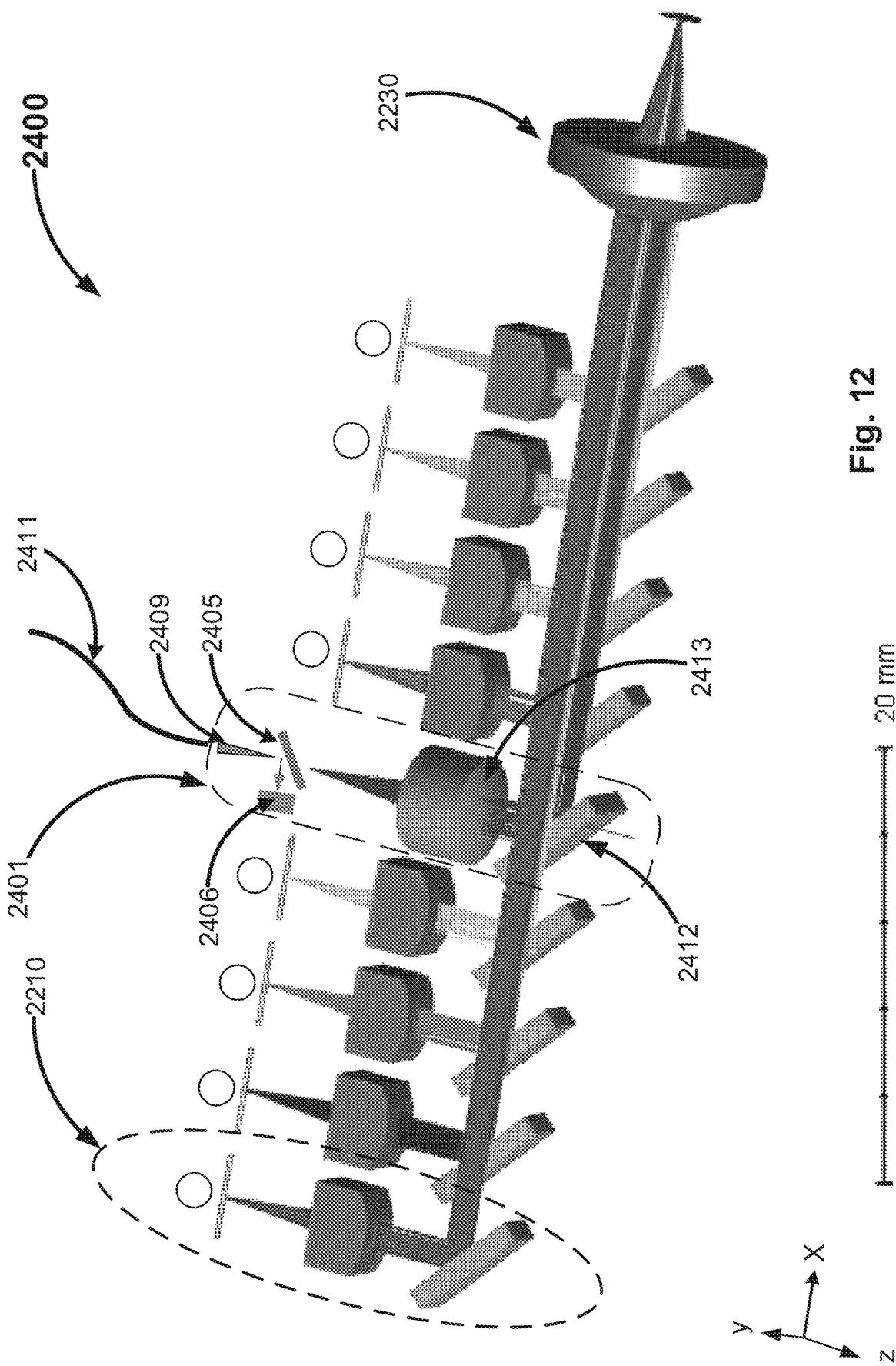
FIG. 12 schematically illustrates a hybrid pump module, where a core associated module is an output module, according to some embodiments of the invention.
Figure 14:
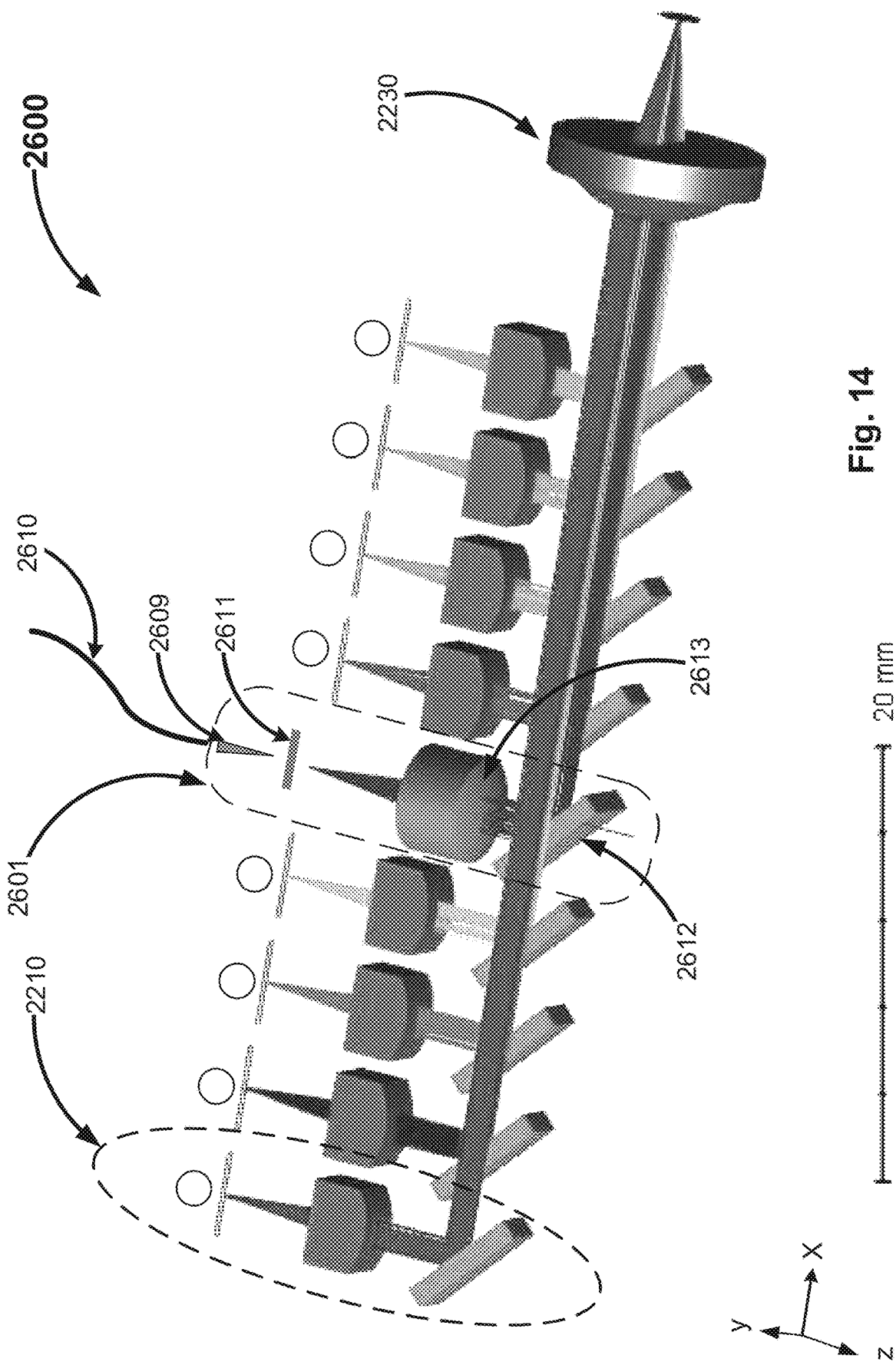
FIG. 14 schematically illustrates a hybrid pump module, where a core associated module is a partial reflecting module, according to some embodiments of the invention.

Reference is now made to FIGS. 10A, 10B, 10C and 10D which schematically demonstrate a hybrid pump module configured to be coupled to an optical fiber 2240. In some embodiments, the optical fiber can be a doped (active) fiber or a passive fiber (data format transparent). The optical fiber comprises a core 2241 and at least one clad 2242. As shown in FIGS. 10A, 10B, 10C and 10D the pump module 2200 comprises:

at least one focusing lens 2230 in free space optical path with the optical fiber 2240;

plurality of diode modules 2210, each configured to output a multi-mode beam which is in free space optical path with the clad 2242 of the optical fiber, via the optical lens;

at least one core associated module 2220 in free space optical path with the core 2241 of the optical fiber, configured to provide a function selected from a group consisting of:

a) to output a single-mode beam towards the core 2241 of the optical fiber, via the optical lens;

b) to receive a beam from the core 2241 of the optical fiber, via the focusing lens, and to couple the received beam to an output optical fiber 2411 (FIG. 12);

c) to receive a beam from the core 2241 of the optical fiber, via the focusing lens, and to reflect the received beam back to the core 2241, again via the focusing lens; and d) to receive a beam from the core 2241 of the optical fiber, via the focusing lens, and to reflect a part of the received beam back to the core, again via the focusing lens, and to couple another part of the received beam to an output optical fiber 2610 (FIG. 14).

In some embodiments, the term "single mode beam" refers to a beam consisting of one or few beam modes, in the range between 1 and 10 modes.

In some embodiments, the plurality of diode modules 2210 are in free space optical path with the clad 2242 of the optical fiber. In some embodiments this optical path does not include any optical fiber for the optical path. In some embodiments, some of the diode modules 2210 are in free space optical path with the core 2241 of the optical fiber as well.

In some embodiments, the core associated module 2220 is in free space optical path with the core 2241 of the optical fiber only; meaning no optical light is coupled into the clad 2242 of the optical fiber 2240. In some embodiments this optical path does not include any optical fiber for the optical path.

In some embodiments, the hybrid pump module 2200 further comprises a volume Bragg grating (VBG) 2250 configured to narrow and lock beams of the diodes to a narrow predetermined range of wavelength. In some embodiments, a common VGB is a 976 wavelength locked module, which is perfectly matched to the high absorption narrow linewidth Yttrium boride (Yb) ions. In some embodiments and as demonstrated in FIG. 10D the VGB is located between the focusing lens 2230 and the optical fiber 2240.

Figure 10A:
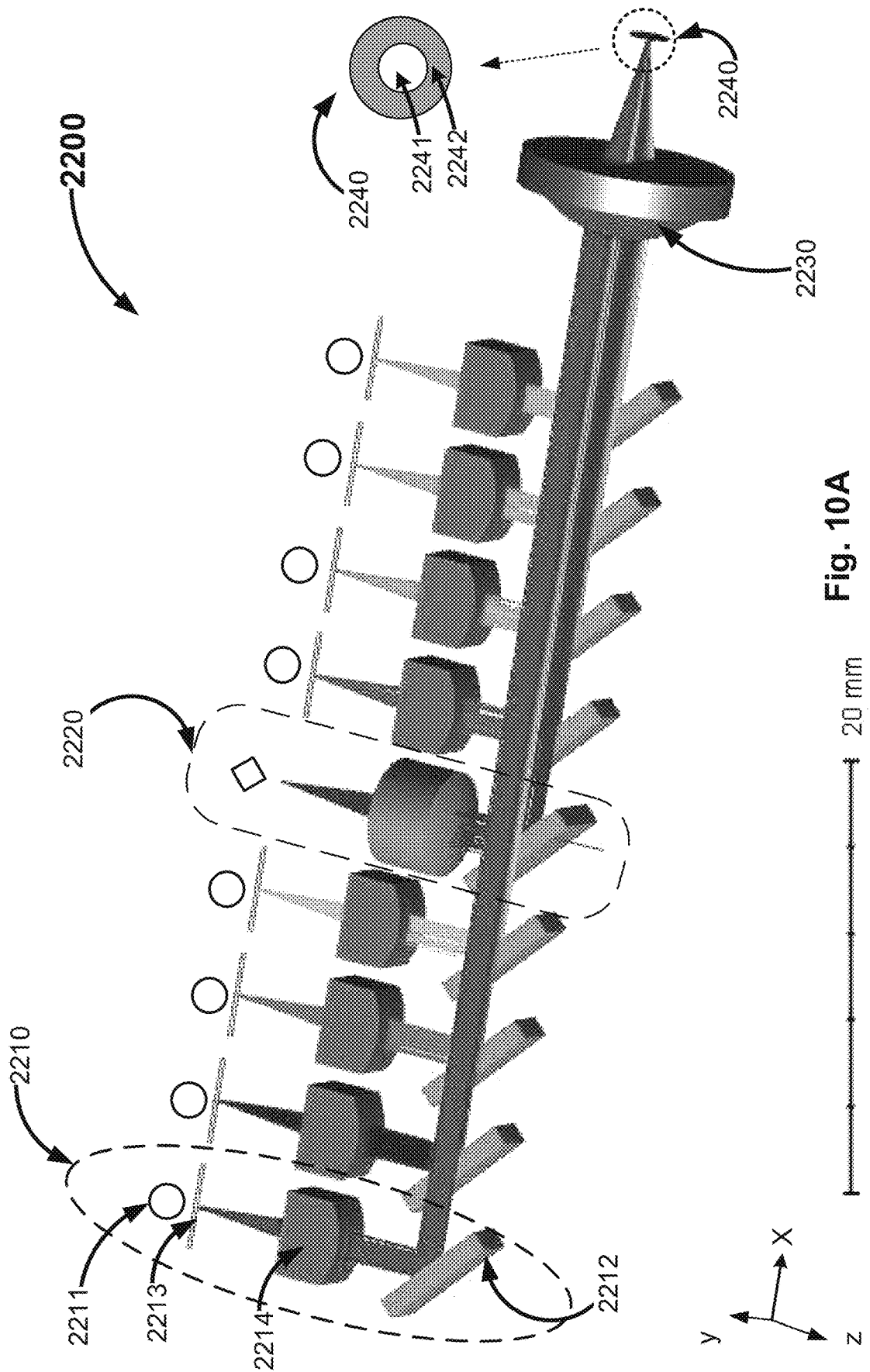
Figure 10B:
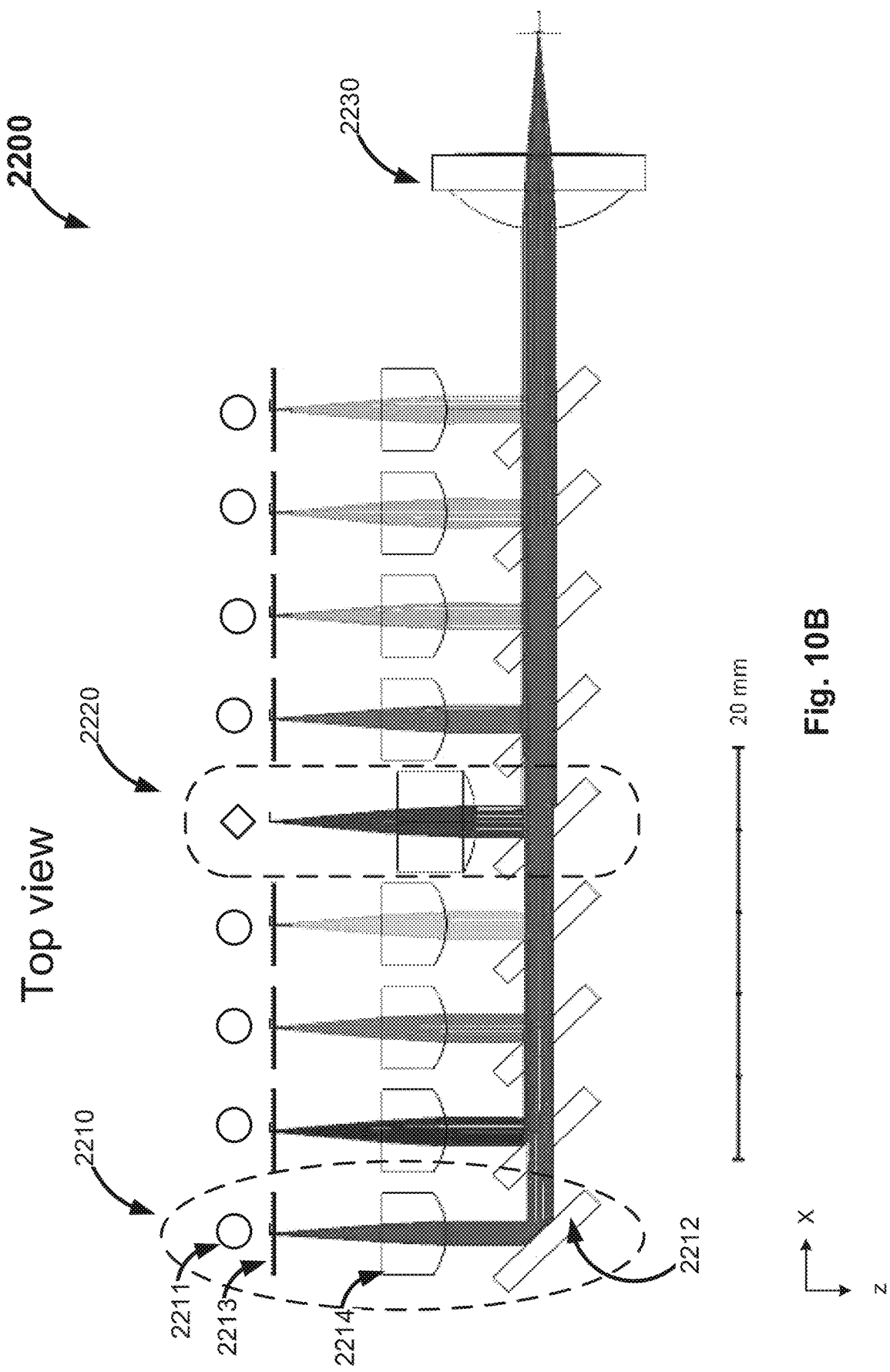
Figure 10D:
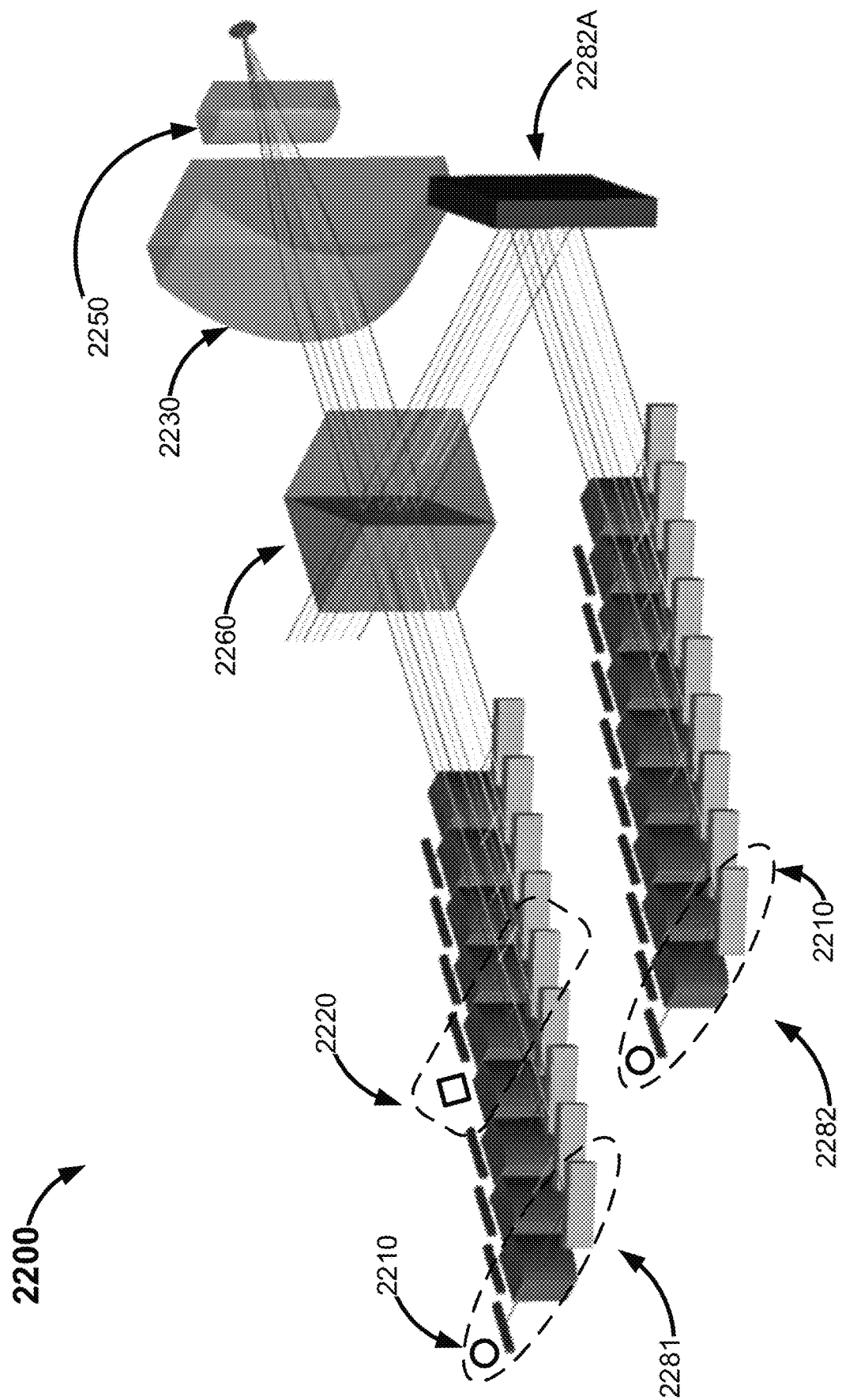

In some embodiments, the plurality of diode modules 2210 and the core associated module 2220 are arranged in at least one row 2281, such that their output beams are parallel one to another, per each row. FIGS. 10A, 10B and 10C demonstrate an isometric view, top view and front view of the system having the plurality of diode modules 2210 (in this example, eight diode modules) and the core associated module 2220 are arranged in a single row. FIG. 10D demonstrates an isometric the system having the plurality of diode modules 2210 (in this example, seventeen diode modules) and the core associated module 2220 are arranged in two rows 2281 and 2282.

In some embodiments, and as demonstrated in FIG. 10D, for the case of two rows or more 2181, 2182, the pump module further comprises:
- at least one polarizer beam combiner 2260, in the optical path of a first beams' row 2281;
- one or more folding mirrors 2282A, each folding-mirror for each additional row, wherein each folding mirror is configured to redirect its corresponding row of parallel beams into its' respective polarizer beam combiner.

In some embodiments, and as demonstrated in FIGS. 10A and 10B, each of the diode modules 2210 comprises:
- a broad area laser (BAL) 2211, configured to output a multi-mode beam;
- a BAL associated folding-mirror 2212, configured with an optical path between its associated BAL and the clad 2242 of the optical fiber (via the focusing lens 2230); and
- optionally, at least one lens 2213, 2214 arranged between the BAL and its associated folding-mirror 2212, configured to adjust shape of the BAL's beam.

Figure 11A:
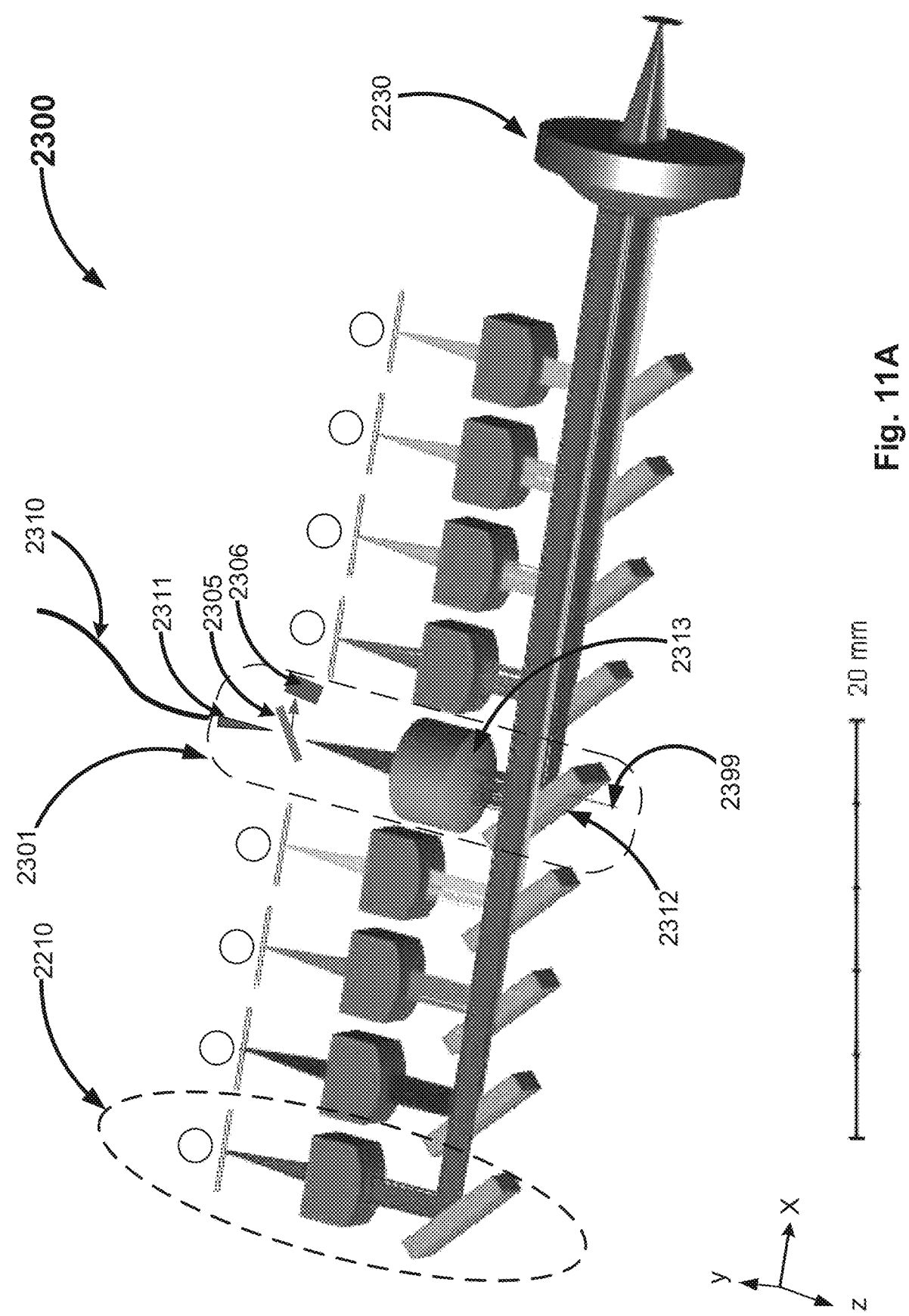
FIGS. 11A, 11B and 11C schematically illustrate hybrid pump modules, where a core associated module is a seed associated module, according to some embodiments of the invention.
Figure 11B:
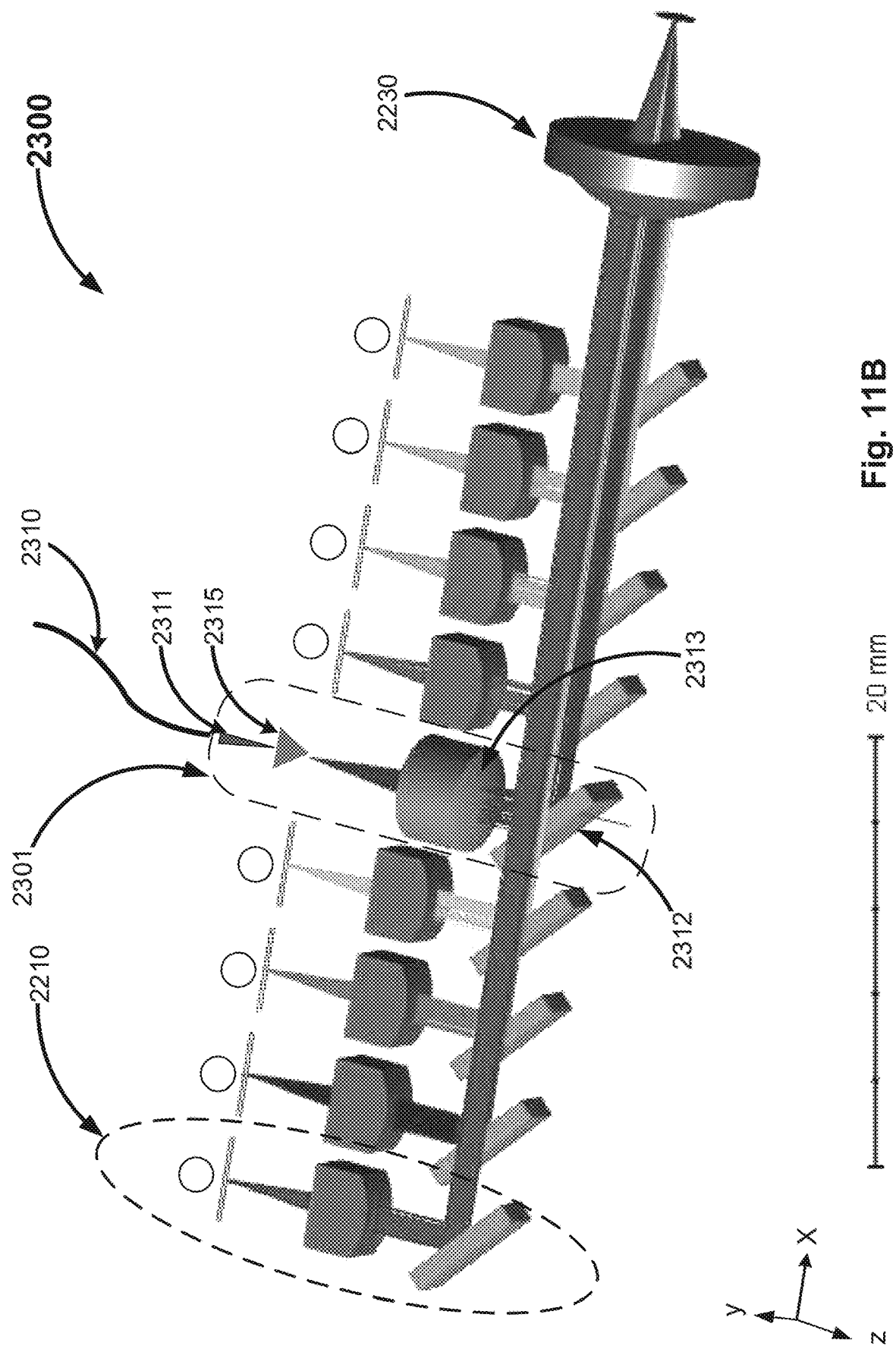
Figure 11C:
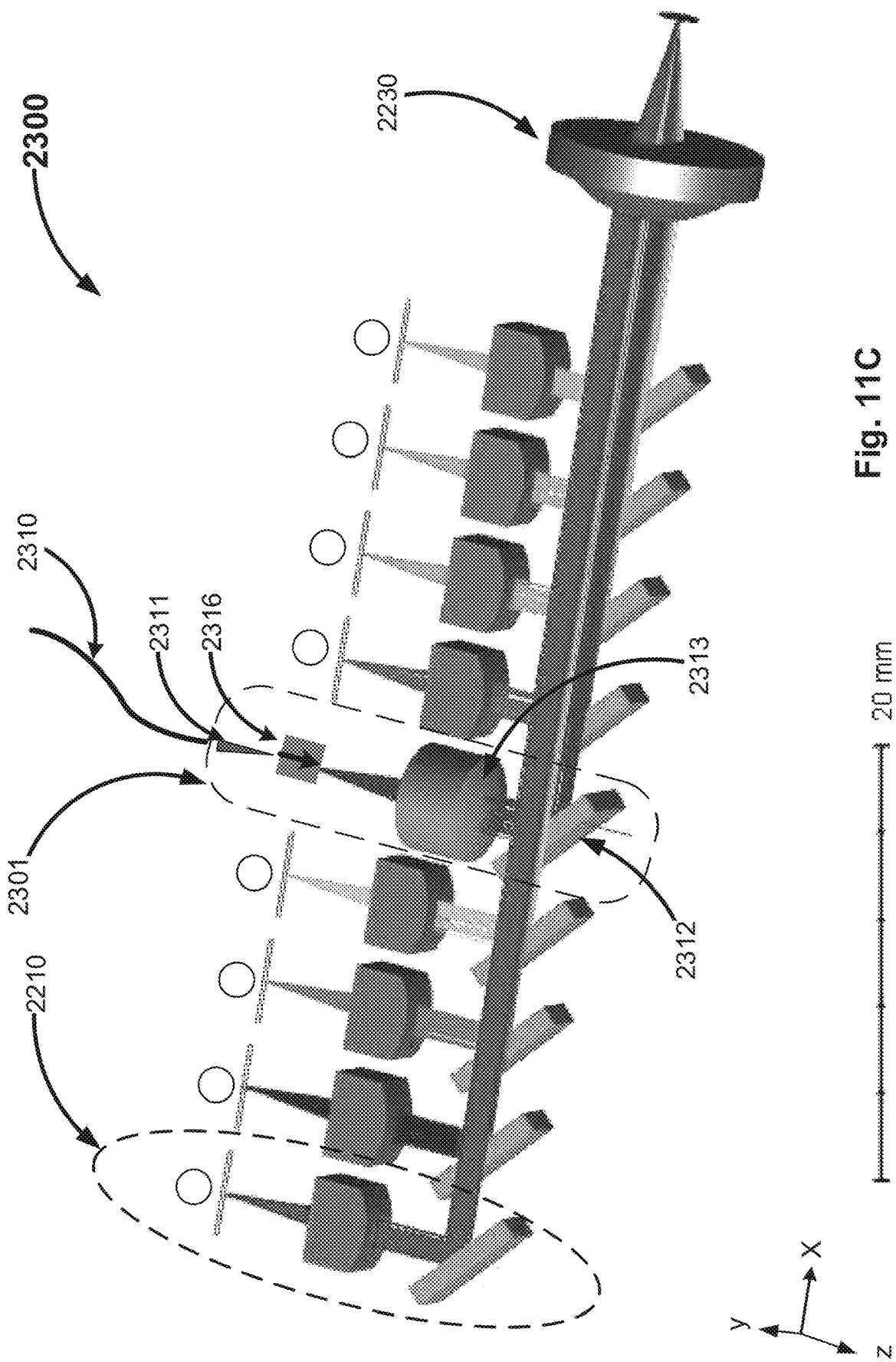

Reference is now made to FIGS. 11A, 11B and 11C, which schematically demonstrate hybrid pump modules 2300, comprising at least some of the features and elements as in the hybrid pump modules 2200 demonstrated in FIGS. 10A-10D. In some embodiments, the core associated module is a seed associated module 2301, configured to output a single-mode beam towards the core of the optical fiber, via the optical lens. The seed associated module 2301 comprising:
- at least one seed input 2311, configured to be coupled to a seed laser device 2702 (shown in FIG. 15), via an optical fiber 2310;
- a seed associated folding-mirror 2312, configured for optical path between the seed input and the core 2241 of the optical fiber, via the focusing lens 2230, and
- optionally, at least one lens 2313 arranged between the seed input and its associated folding-mirror 2312, configured to adjust shape of the seed's beam.

In some embodiments, wherein the seed associated module 2300 further comprises at least one of:
- a tap (not shown) or a partial mirror 2305 and a monitor 2306, as demonstrated in FIG. 11A, located between the seed input 2311 and the optimal lens 2313 or the folding-mirror 2312, configured to sample the seed beam, monitor it and alert of backward beam transmission (back to the seed input 2311);
- a beam amplifier 2315, as demonstrated in FIG. 11B, located between the seed input 2311 and the optimal lens 2313 or the folding-mirror 2312, configured to amplify the seed beam; and
- an isolator 2316, as demonstrated in FIG. 11C, located between the seed input 2311 and the optimal lens 2313 or the folding-mirror 2312, configured to allow transmission of light in one direction only.

Reference is now made to FIG. 12 schematically demonstrates a hybrid pump module 2400, comprising at least some of the features and elements as in the hybrid pump modules 2200 demonstrated in FIGS. 10A-10D. In some embodiments, the core associated module is an output module 2401, configured to receive a beam from the core of the optical fiber, via the focusing lens, and to couple the received beam to an output optical fiber 2411. The output module 2401 comprising:
- an output fiber 2411, optionally comprising an end-cap element 2409;
- a folding-mirror 2412 associated with the output fiber 2411, configured for optical path between the core 2241 of the optical fiber and the output fiber 2411;
- optionally, at least one lens 2413, arranged between the output fiber 2411 and its associated folding-mirror 2412, configured to adjust shape of the received core beam; and
- optimally, a pump dump (not shown).

In some embodiments, the output module 2400 further comprises a tap (not shown) or a partial mirror 2405 and a monitor 2406, located between the output fiber 2411 and the optimal lens 2413 or the folding-mirror 2412, configured to sample the seed beam, monitor it and alert of backward beam transmission (back to the folding mirror 2412).

Figure 13:
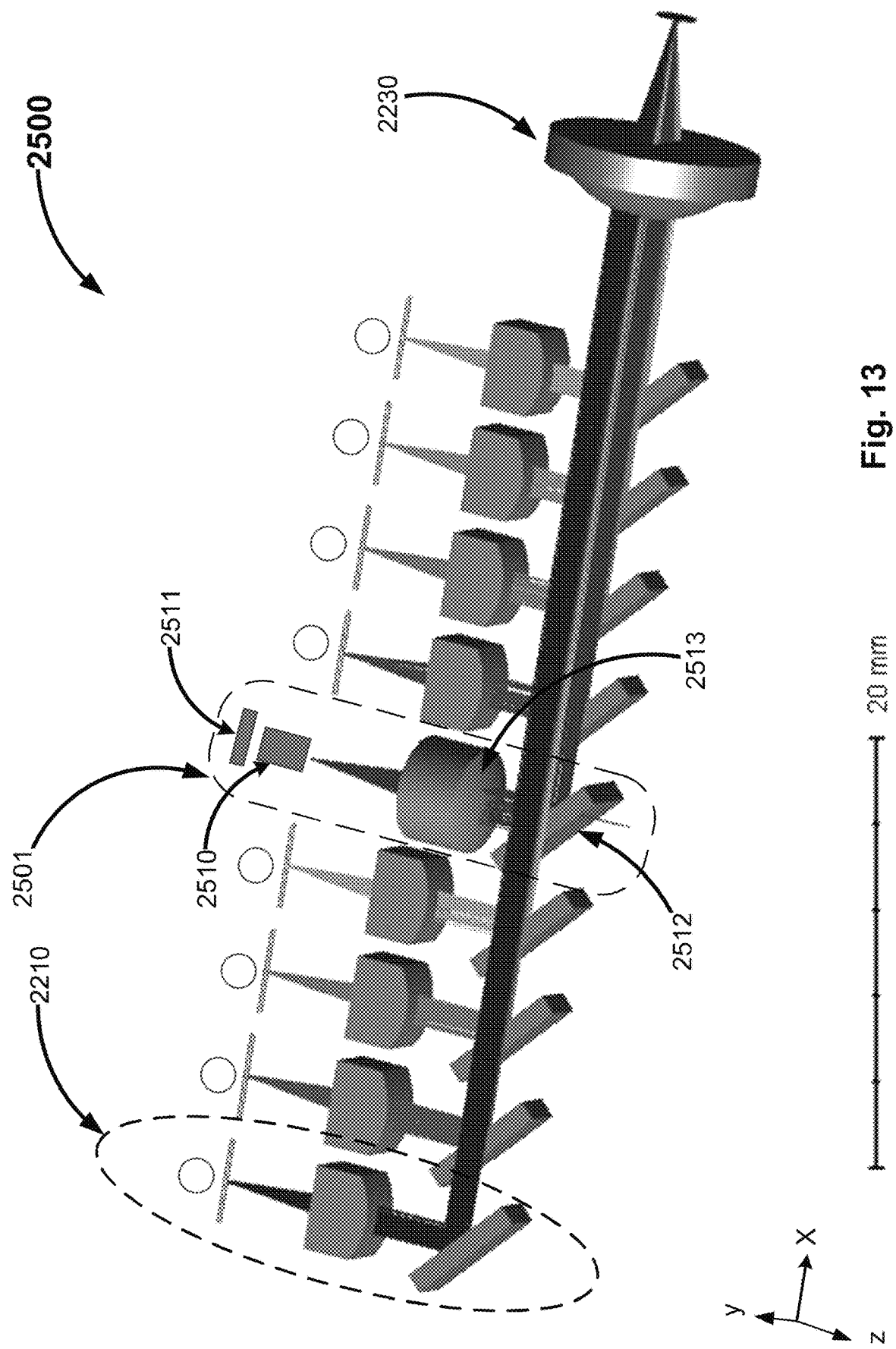
FIG. 13 schematically illustrates a hybrid pump module, where a core associated module is a high reflecting module, according to some embodiments of the invention.

Reference in snow made to FIG. 13 schematically demonstrates a hybrid pump module 2500, comprising at least some of the features and elements as in the hybrid pump modules 2200 demonstrated in FIGS. 10A-10D. In some embodiments, the core associated module is a high reflecting (HR) module 2501, configured to receive a beam from the core 2241 of the optical fiber, via the focusing lens, and to reflect the received beam back to the core 2241, again via the focusing lens. The (HR) module 2501 comprising:
- an HR mirror 2511,
- a folding-mirror 2512 associated with the HR mirror 2511, configured for optical path between the core 2241 of the optical fiber and the HR mirror, and
- optionally, at least one lens 2513 arranged between the HR mirror 2511 and its associated folding-mirror 2512, configured to adjust shape of the associated beams.

In some embodiments the (HR) module 2501 is configured to reflect the received beam back and forth in a form of fiber resonator.

In some embodiments, the HR module 2501 further comprises an intra cavity modulator 2510 arranged between the HR mirror 2511 and its associated folding-mirror 2512, configured to modulate the reflected beam's amplitude, or phase, or polarization or any combination thereof. In some embodiments the intra cavity modulator comprises an acusto-optic modulator, or an electro-optic modulator. In some embodiments, the intra cavity modulation allows pulse laser behavior.

Reference in snow made to FIG. 14 schematically demonstrates a hybrid pump module 2600, comprising at least some of the features and elements as in the hybrid pump modules 2200 demonstrated in FIGS. 10A-10D. In some embodiments, the core associated module is a partial reflecting (PR) module 2601 comprising:
- an output fiber 2610, optionally comprising an end-cap 2609;
- a PR mirror 2611, in optical path with the output fiber 2610;

a folding mirror 2612 associated with the PR mirror 2611, configured for optical path between the core 2241 of the optical fiber and the PR mirror 2611; and optionally, at least one lens 2613, arranged between the PR mirror 2611 and its associated folding-mirror 2612, configured to adjust shape of the associated beams.

In some embodiments the assembly of the hybrid pump module 2200, 2300, 2400, 2500, 2600 is configured to be aligned opto-mechanically, by measuring the beam paths and adjusting the location and/or orientation of the elements as mentioned above. In some embodiments, the adjustment is provided by a Jig vacuum catcher. In some embodiments, the adjusted element is at least one selected from: any one of the core modules, any one of the diode modules, any one the seed devices, any one of the BALs, any one of the folding-mirrors, any one of the lenses, any one of the beam amplifiers, any one of the taps or partial mirrors and monitors, any one of the isolators, any one of the HR mirrors, any one of the PR mirror, any one of the seed inputs, the focusing lens/es, the VGB.

In some embodiments, at least some of the lenses 2213, 2214, 2313, 2413, 2513, 2613, which are configured to shape a beam's cross section are selected from: fast access collimator (FAC) 2213 and slow access collimator (SAC) 2214.

In some embodiments, at least some of the folding mirrors 2212, 2312, 2412, 2512, 2612 are configured to tap (pass through) a fraction of the reflected beam, for further monitoring purposes (as demonstrated for example in FIG. 11A 2399).

Figure 15:
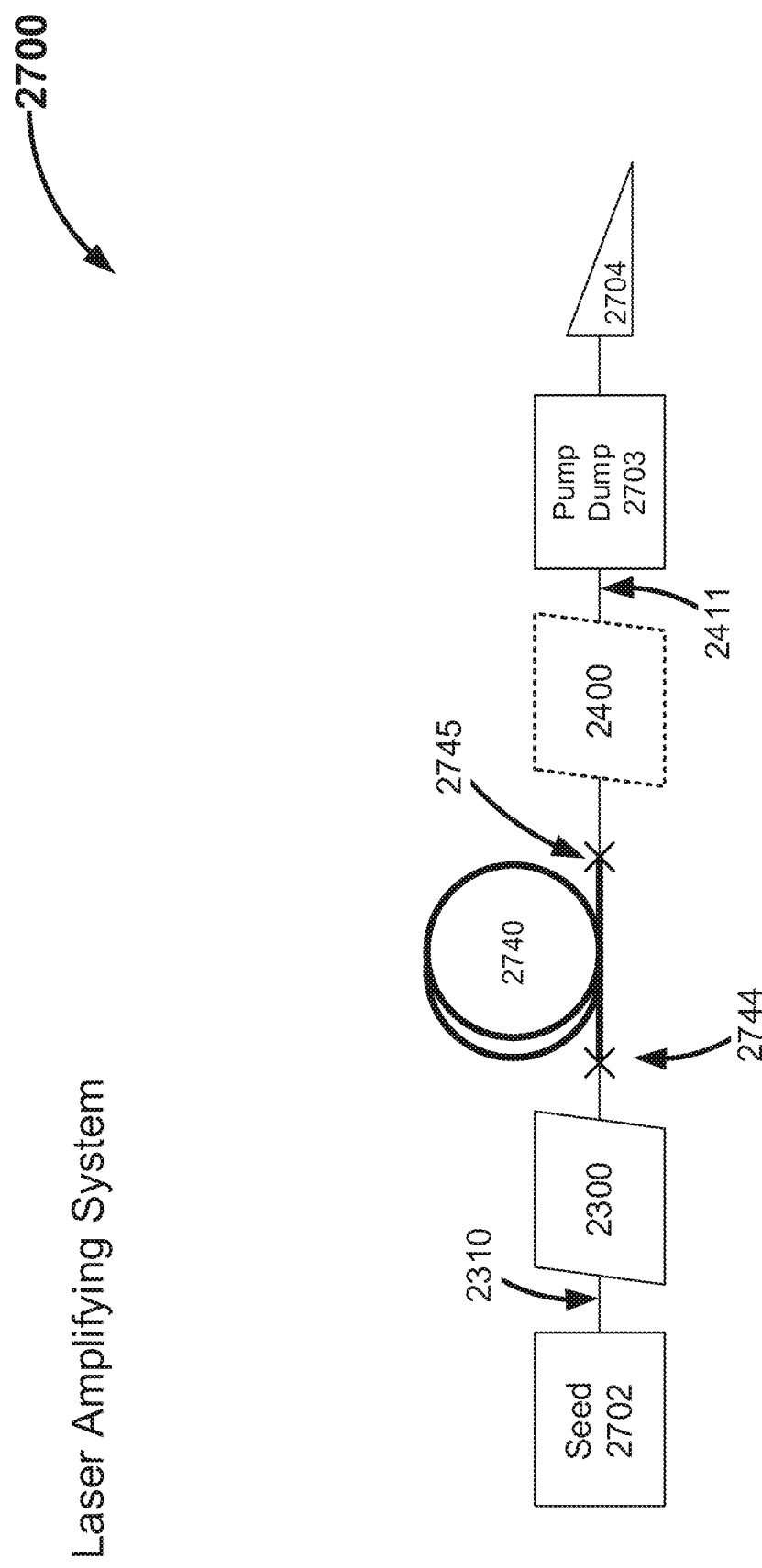
FIG. 15 schematically illustrates a fiber amplifying system, according to some embodiments of the invention.

Reference in snow made to FIG. 15 which schematically demonstrates a fiber amplifying system 2700. In some embodiments of the invention, the fiber amplifying system 2700 comprising:

an active optical fiber 2740, comprising a core and at least one clad;

the hybrid laser pump module 2300 comprising a seed associated module 2301, according to the above embodiments, coupled to a first end 2744 of the optical fiber.

As demonstrated in FIG. 15, the fiber amplifying system 2700 is configured to receive a seed laser beam from a seed laser device 2702 and to amplify it to high power single-mode laser beam.

In some embodiments, the fiber amplifying system 2700, further comprises the hybrid pump module 2400 of comprising an output module 2401, coupled to a second end 2745 of the optical fiber. An artisan would appreciate that the hybrid pump module 2400 is operative as a counter pump module configured to increase the beam amplification at the active optical fiber 2745.

In some embodiments, the fiber amplifying system 2700 further comprises at least one selected from: a pump dump 2703, an output fiber 2411 with an end-cap element 2704, coupled to a second end 2745 of the active optical fiber 2740.

An artisan would appreciate that the fiber amplifying system 2700, according to the various embodiments as demonstrated above, reduces significantly the number of required fusion splices, while allowing non-dependent number of diode modules. For example, the prior art system 2100 of FIG. 9 includes six diodes and requires at least nine (9) fusion splices. The current system 2700 includes at least eight (can be more) diode modules and yet requires only two (2) fusion splices.

Reference in snow made to FIGS. 16A and 16B, which schematically demonstrate fiber laser systems 2800, according to some embodiments of the invention, comprising:

an optical fiber 2840, comprising a core and at least one clad;

the hybrid laser pump module 2500 comprising the HR module 2501, coupled to a first end 2844 of the optical fiber; and a fiber Bragg grating (FBG) 2804 (as demonstrated in FIG. 16B), or the hybrid laser pump module 2600 comprising the PR module 2601 (as demonstrated in FIG. 16A), coupled to a second end 2845 of the optical fiber.

An artisan would appreciate that the hybrid pump module 2600 is operative as a counter pump module, configured to increase the beam amplification at the active optical fiber 2840.

In some embodiments, the fiber laser system 2800 further comprises at least one of: a pump dump 2803 and an output fiber comprising an end-cap element 2804.

Enhanced Frequency Conversion via a Weak High Frequency Seed Beam Colinearly Generated in the Primary Beam Some embodiments of the present invention relate to a frequency conversion of high-average power laser beams in Non-Linear Crystals (NLCs). In some embodiments, in an example of frequency doubling of light having a wavelength of 1064 nm, the term "high-average power" refers to a power greater than 300 W from a continuous laser, where in low absorption LBO, the "high power green" is greater than 100 W.

In some embodiments, the current invention provides a means for correcting deleterious Mismatched Phase (MP) between a fundamental-frequency input-beam and a frequency-converted output-beam, that may occur in the first of a single- or multiple-Power Frequency Doubler (PFD) chain of Non-Linear Crystals (NLCs).

The present application in some embodiments thereof, discloses "non-linear crystal", or in short "NLC", or "crystal"; it is noted that these terms are alternatively used. The present application in some embodiments thereof, discloses "power frequency doubler", or in short "PFD", or "doubling"; it is noted that these terms are alternatively used. The present application in some embodiments thereof, discloses "power frequency doubler of non-linear crystal", or in short "PFD NLC", or "doubling NLC", or "doubling crystal"; it is noted that these terms are alternatively used. The present application in some embodiments thereof, discloses "second harmonic", or in short "harmonic"; it is noted that these terms are alternatively used.

In some embodiments, two factors are controlled for efficient frequency conversion: temperature in the interaction region of the crystal, and the relative phase between the fundamental beam and the NLC's output harmonic beam/s.

According to the prior art, as relating to the first doubling NLC, only near optimal crystal parameters in the harmonic conversion region were maintained by an oven, which did not control the phase mismatch accumulated as the beams propagated from the first doubling NLC's entrance (where the first harmonic photons were generated) to the primary harmonic conversion region of that first doubling NLC. This resulted in poor high power frequency conversion. The reason for this is that a Uniform Temperature Oven (UTO) has only one parameter that can be varied (oven temperature) and because the MP of the beams near the input face of the ovens are determined by the local temperature at that position. In some embodiments, the current invention provides a means of imposing any phase difference, which is required between the beams, at the first doubling NLC's front face, so as to be optimum by the time the beams have propagated to the harmonic conversion zone.

An approach that was reported in the literature is the use of two PFD NLCs with an intermediate Phase Mismatch Compensator (PMC). The PMC is an optical element that exhibits chromatic dispersion and/or polarization dependent refractive index. This dispersion can be an inherent property of the material or it can be imposed by an external field; an electric field applied to an electro-optic material such as a Pockels cell.

An advantage of this in-line, crystal-PMC-crystal, approach is that the dispersive element is only acting to cause a controllable phase difference between co-propagating beams of two wavelengths and is not required to achieve interferometric (subwavelength) optical path length control to separately generated beams. This greatly reduces sensitivity and stability requirements.

Important points about prior work with phase mismatch correction are made:
i. Each NLC is configured to achieve maximum frequency conversion, i.e. each acts as a PFD. Lowest absorption grades are sought for each type of crystal used.
ii. The PMC corrects the TMP of the first crystal only after exiting the first crystal.
iii. The PMC together with temperature and/or angle tuning can correct for TMP in the second doubling crystal.
iv. Other than for temperature- or angle-tuning of the first PFD crystal, up until today there was no means for compensating TMP within the first crystal placed in a Uniform Temperature Oven (UTO), or alternately, for maintaining conditions for optimum harmonic conversion in the primary conversion zone (focal region, if a focusing lens is used).
v. A more complex Gradient Temperature Oven (GTO) can eliminate the generation of MP within a single oven. A GTO, however, requires control of the oven input and output temperatures, if a linear gradient is desired, or of the temperature at multiple points along the oven axis, if the temperature rise due to light absorption varies along the length of the crystal (as it does for a beam focused in the center of the crystal.

In some embodiments, the invention presented herein, relates to a means of overcoming the limitation mentioned in point (iv), means for compensating MP in the first PFD NLC, so as to improve the doubling efficiency in the first and subsequent PFDs.

Figure 17A:
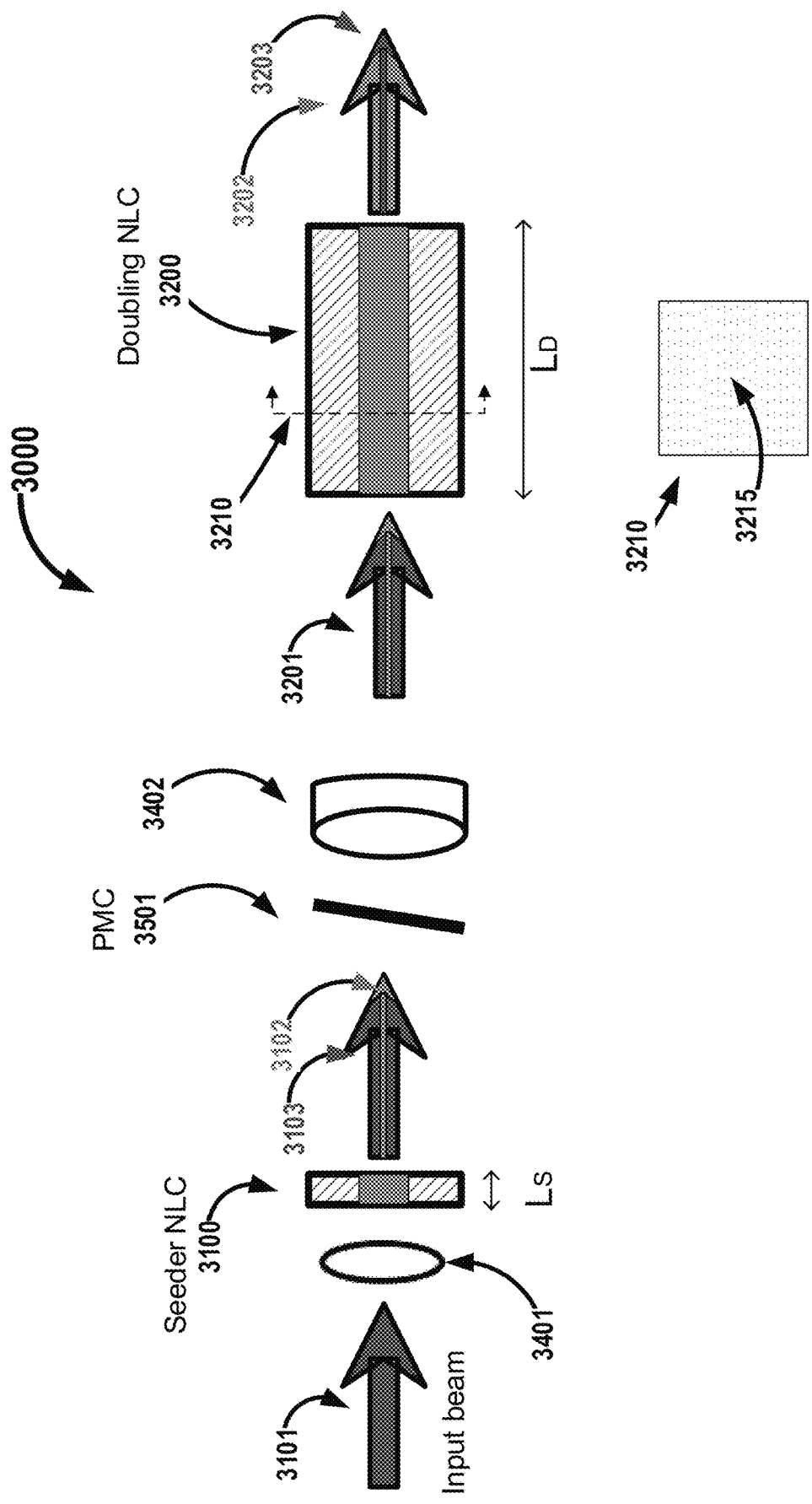
FIGS. 17A, 17B and 17C schematically demonstrate several setups for an apparatus for frequency doubling of radiation laser beam, according to some embodiments of the invention.

In some embodiment of the invention, and as demonstrated in FIG. 17A, the improvement is provided by generating a low power $2^{nd}$ harmonic seed beam in a "seeder" NLC 3100 placed in the high-power fundamental beam 3101, prior to a first PFD NLC 3200. The phase difference between the fundamental beam 3101 and harmonic beam/s 3202 from the seeder NLC is controlled by an addition of a PMC 3502. In some embodiments and as demonstrated in FIG. 17B, the seeder NLC 3100 is provided in a temperature controlled oven 3701. In some embodiments, the PMC 3502, placed after the seeder crystal 3100, is provided together with a feedback control system 3602 configured for sampling the harmonic light 3202 after the first PFD NLC 3200, and to control the PMC accordingly, for maximum harmonic light 3202.

It is important to emphasize that the seeder crystal 3100 needs only to produce a low power harmonic beam 3102, whose phase with relation to the fundamental beam 3101 can be controlled. Thus, there may not be any need to focus the fundamental beam to a small spot within the seeder crystal 3100 nor a need for a seeder crystal to have about same length (Ls) as that used for the first doubling NLC 3200.

Light absorption at high power generates transverse and axial temperature variations that affect harmonic conversion. Thus, at all positions along the propagation axis (from the front face, through any focus, and until the back face) the temperatures increase as the laser power increases. This requires the oven temperature to be lowered as the laser power increases.

In some embodiments, in all cases using Uniform Temperature Ovens (UTOs), the temperature along the optical axis varies because of varying absorption (green absorption is higher than IR absorption) so that heating becomes greater towards the latter part of the crystal, and because cooling depends on laser beam radius, if a focusing lens is employed to increase laser intensity. In prior art scenarios, there is no independent control of the initial Phase Matching between the fundamental and harmonic beams in the first PFD NLC. The only observable parameter is the output harmonic power, and this is affected by what happens along the entire crystal length. The prior art scenario is to maximize the amount of harmonic light produced by varying the oven temperature. For the case of phase matching of a focused beam, the primary concern is to maintain the correct temperature in the focal region. Changing the temperature for optimum harmonic conversion in the focal region, means that the temperature is not optimum at the beginning of the crystal. The resulting MP degrades harmonic conversion. The current invention provides improvements, as in the following.

In some embodiments, the oven temperature can be retuned to get phase matching at the focal region, however one cannot correct MP accumulated from the front face to the middle of the first PFD NLC, within a UTO.

In some embodiments, the addition of a weak $2^{nd}$ harmonic seed beam 3102 to a high power fundamental beam 3101 prior to the first PFD NLC 3200 is configured to enable an adjustment of the input phase difference prior to the first PFD NLC independently of controlling the phase-matching in the focal region.

According to embodiments of the invention, a "short" non-linear crystal (seeder-crystal) 3100 is provided prior to the first long PFD NLC 3200. The seeder-crystal 3100 is configured to generate a weak $2^{nd}$ harmonic beam that can be in controllable phase, relative to the strong fundamental beam.

In some embodiments, a PMC 3501 is provided to adjust the IR-green MP after the seeder NLC 3100, such that the seeder-NLC MP plus the first PFD's MP from the first half of the first PFD NLC equals zero, i.e., $$\Sigma MP = MP_{seeder} + MP_{1/2\ PFD} = 0$$

It is noted that MP accumulated at the $1^{st}$ half of the PFD crystal is more important than of the MP accumulated in the $2^{nd}$ half. This is because the MP up to the focus strongly affects doubling in the focal region. The accumulated MP after the focus zone, does not strongly degrade the doubling in that crystal, because the intensities are already dropping. In addition, this latter part of the MP can be corrected by a next PMC.

It is noted that, when heat is generated by an NLC absorption, the temperature deviates from that required for Phase Matching and in particular for Noncritical Phase Matching (NCPM). The negative consequences are:

Temperature, angular, spectral bandwidths decrease→Most critical in the focal region where most of the doubling occurs.

Phase mismatch builds-up as the beams propagate through the crystal; even in region of weak doubling. This Phase mismatch can later on reduce doubling efficiency or cause back-conversion. The build-up of MP is most critical between the entrance face and the end of focal region.

In some embodiments, a uniform oven temperature retuning technique is provided for alleviating some of the thermal effects.

In some embodiments, adjusting the oven temperature can only correct one effect: either to achieve $T=T_{Phase\ Matching}$ at the focus region, or to achieve $\Sigma MP=0$ up to the focus region of the NLC.

In some embodiments, adding a seeder NLC and a PMC allows the input phase to be set as the conjugate to the phase mismatch of the crystal, i.e.

$$\Delta\phi_{seeder}=(-)MP_{PFD}$$

independent of temperature in the focus of the PFD NLC.

In some embodiments, a PMC may not be necessary. The seeder crystal itself can generate the phase mismatch required for optimum doubling in the power doubling crystal. The source of this mismatch can be provided by a controlled level of heating the seeder crystal, during passage of the IR beam, or by an intentional shift caused by an operator imposed change in the oven temperature. It should however be recalled that, changing the oven temperature has a much slower response than rotating a PMC or applying a voltage to an electro-optic PMC device.

In some embodiments, a PMC can generate a required or a predetermined phase difference, no matter what phase difference (between the fundamental and the harmonic beams) exits the seeder crystal. In some embodiments, the PMC can be adjusted much faster than an oven temperature. In some embodiments, the PMC allows the seeder crystal's power to remain fixed, as the phase difference is adjusted.

In some embodiments, any phase mismatch induced within a PFD NLC can be alleviated by the use of a seeder NLC, with conjugate mismatch for alleviating varying laser wavelength and/or oven temperature induced MP.

In some embodiments, the techniques mentioned above can be applied to any periodically poled crystal with constant poling period.

Figure 17B:
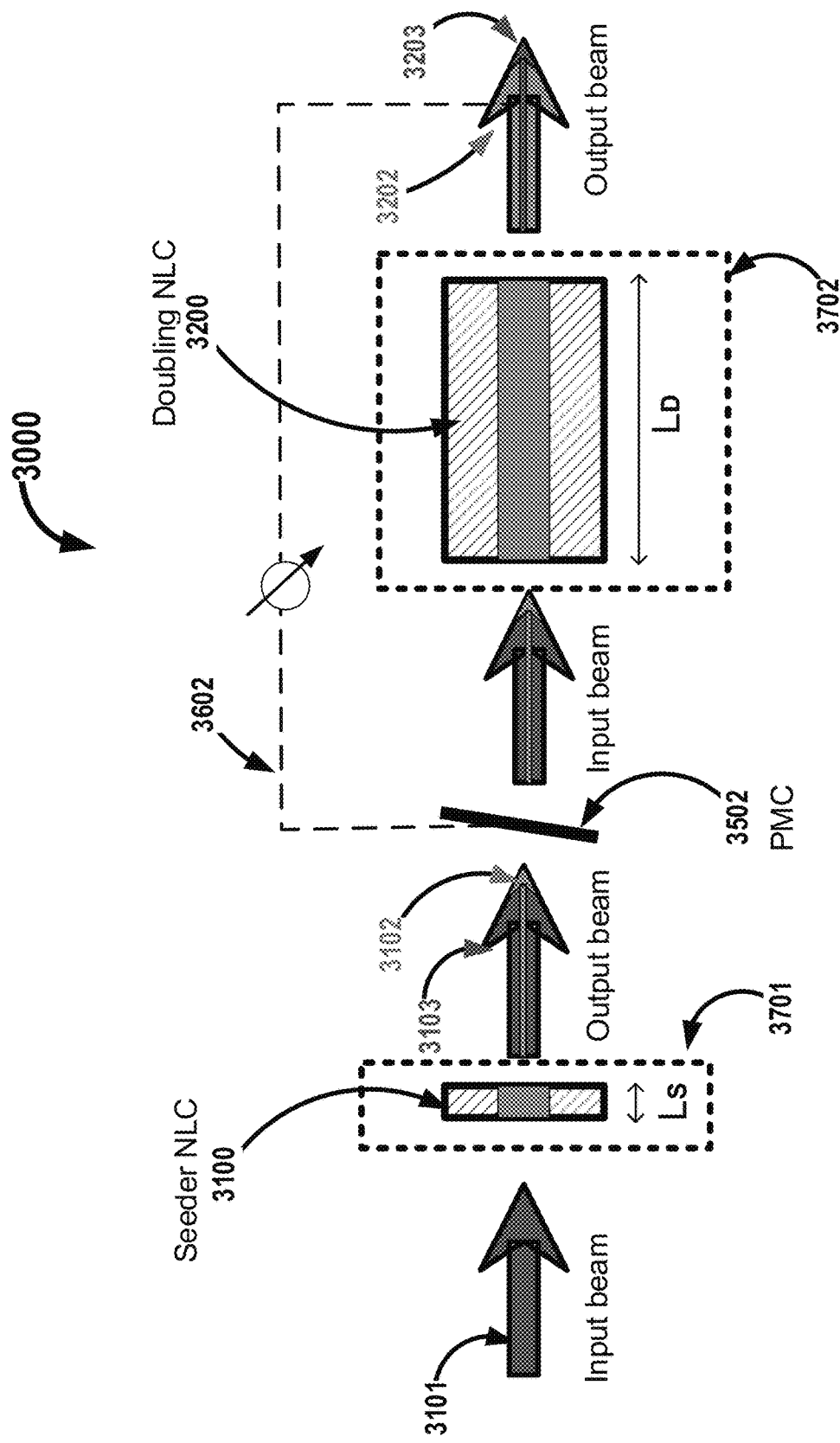
Figure 17C:
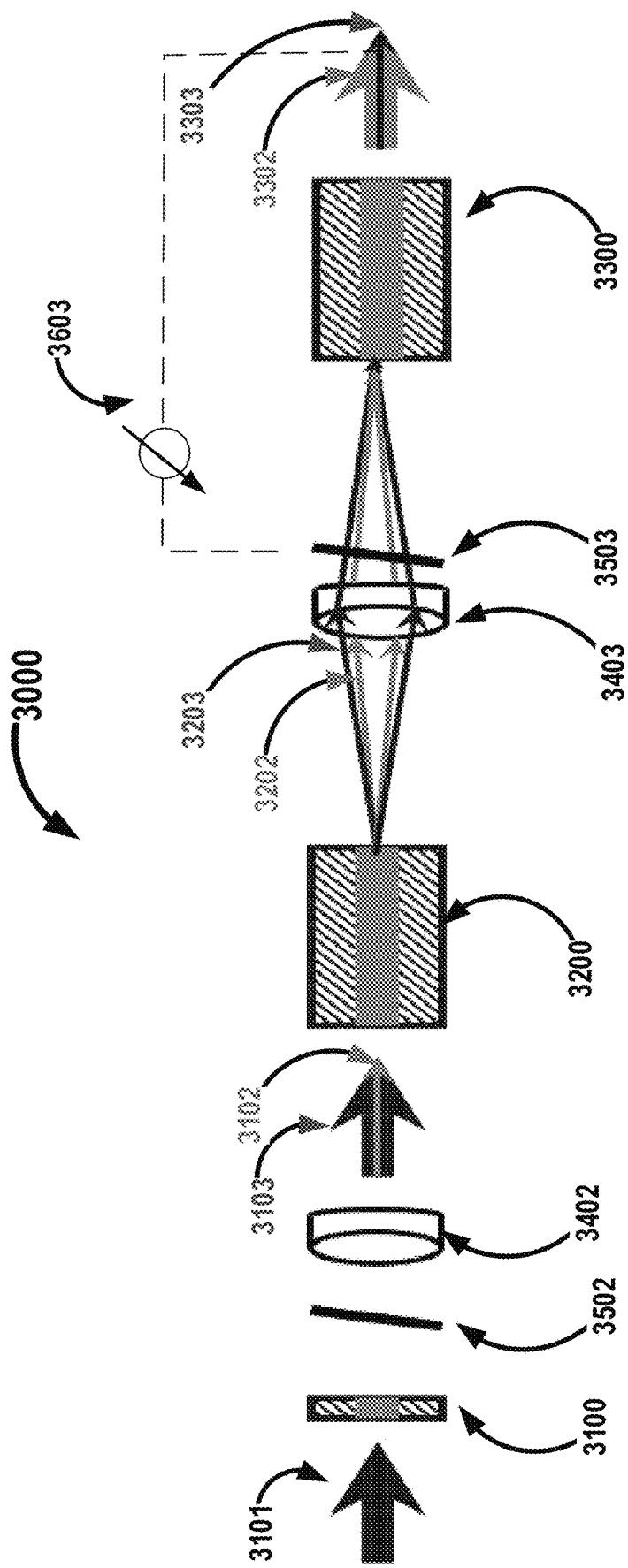

Reference is now made to FIGS. 17A-17C demonstrating several setups 3100 for an apparatus 3000 configured for generating a weak $2^{nd}$ harmonic seed beam 3102, for controlling its phase with respect to the high-power input-beam (fundamental beam) 3101, according to various embodiments of the invention. In some embodiments, after the generation of the $2^{nd}$ harmonic seed beam 3102 and the adjustment of the phase offset, the beams are propagated into a Power Frequency Doubling (PFD) Crystal 3200. In the situation depicted here one long wavelength beam is being frequency doubled. An achromatic optic 3402 (achromatic lens or multiple wavelength mirror), can be used to focus both beams 3102, 3103 to the same point within the $1^{st}$ PFD crystal 3200, so as to increase the intensities and thus to enhance frequency conversion.

In some embodiments, frequency doubling is efficient when phase matching occurs.

In some embodiments, the input waves 3102, 3103 propagate at exactly the same speed through the PFD crystal 3200 from inception of the first high frequency photon and out through the end of the frequency conversion zone. In some embodiments, phase matching between two wavelengths can be made to occur in certain crystals by control of the polarization orientations of the beams with respect to the crystallographic axes. The higher frequency beam will be automatically polarized along its preferential phase matching axis.

In some embodiments, phase matching is a function of refractive index which, in turn, is a function of propagation relative to crystallographic axes, of polarization, and of crystal temperature. In some embodiments, certain crystals maintained at specific temperatures for specific input wavelengths are particularly insensitive to propagation angle and/or bandwidth. Frequency conversion in these cases is referred to as Non-Critical Phase Matching (NCPM). Thus, for instance, if LBO maintained at 149.1° C. is used to frequency double a 1064 nm beam, then the beam can be focused into relatively long crystals. In some embodiments, focal spot and interaction length can then be optimized. NCPM is, however, sensitive to temperature and, by inference, to light absorption. Green light absorption is approximately four times greater than IR absorption.

In some embodiments of the invention, a new apparatus 3000 configured for frequency doubling of optical radiation is provided, and demonstrated in FIGS. 17A-17C. The apparatus 3000 comprising at least two sequential non-linear crystals (NLCs) 3100, 3200, 3300:

- a first NLC 100 configured to receive a fundamental beam 3101, at a fundamental frequency ($F_F$), and to emit a weak second harmonic beam 3102, at a second harmonic frequency ($F_H$) together with a strong residual beam 3103, at the fundamental frequency ($F_F$); the power ratio between the weak second harmonic beam 3102 and the fundamental beam 3101 is smaller than $5\times10^{-3}$ to 1, respectively; and
- at least one second NLC 3200 and any optional subsequent NLC 3300, configured to receive a residual beam 3103, 3203, at the fundamental frequency ($F_F$), and a second harmonic beam 3102, 3202, at the second harmonic frequency ($F_H$), of a previous NLC 3100, 3200, optionally after their phase difference have been adjusted for optimum frequency doubling, and configured to emit a strong frequency doubled beam 3202, 3302, at the second harmonic frequency ($F_H$), together with a residual beam 3203, 3303, at the fundamental frequency ($F_F$); the power ratio between the strong frequency doubled beam 3202, 3302 and the fundamental beam 3101 is larger than 0.3 to 1, respectively.

In some embodiments, the apparatus 3000 further comprises at least one phase mismatch compensator (PMC) 3502, 3503, configured to correct a phase relationship between a residual beam 3103, 3203, at the fundamental frequency ($F_F$), and a second harmonic beam 3102, 3202, at the second harmonic frequency ($F_H$), prior to being received by the second NLC 3200 and/or any subsequent NLC 3300. In some embodiments, the PMC comprises a chromatically dispersive element whose integral value can be controlled by tilt or by an applied electrical voltage.

FIGS. 17A-17B demonstrate an apparatus 3000 with only one doubling NLC 3200, whereas FIG. 17C demonstrates an apparatus with two doubling NLCs 3200, 3300 (first doubling NLC 3200 and second doubling NLC 3300), according to the various embodiments of the invention. FIGS. 17A-17B demonstrate an apparatus 3000 where a PMC 3502 is provided before the first doubling NLC 3200, whereas FIG. 17C demonstrates an apparatus where two PMCs 3502, 3503 are provided, one PMC 3502 before the first doubling NLC 3200, and another before the second doubling NLC 3300.

In some embodiments, the apparatus 3000 further comprises at least one feedback and control system 3602, 3603, configured to sample the strong frequency doubled beam 3202, 3302 and accordingly to adjust the PMC 3502, 3503 to allow maximum power in the strong frequency doubled beam 3202, 3302 over a wide range of operating conditions.

FIG. 17B demonstrates a feedback and control system 3602, configured to sample the strong frequency doubled beam 3202 emitted by a second NLC 3200 (which is the first doubling NLC) and accordingly to adjust the PMC 3502 provided prior to the first doubling NLC 3200; whereas FIG. 17C demonstrates a feedback and control system 3603, configured to sample the strong frequency doubled beam 3302 emitted by a third NLC 3300 (which is the second doubling NLC) and accordingly to adjust the PMC 3503 provided prior to the second doubling NLC 3300; both 3602, 3603 can be provided sequentially.

In some embodiments, the feedback and control system 3602, 3603 comprises:
- at least one measuring element (not shown); e.g. a photo detector;
- at least one processing element (not shown), configured for the analysis of the data, received from the at least one measuring element, and to accordingly provide control instructions for PMC adjustment/s; and
- at least one adjusting element (not shown), configured to adjust the PMC 3502, 3503, according to the control instructions; e.g. tilt the PMC by a motorized rotation device and/or by an applied voltage to the PMC.

In some embodiments, the apparatus 3000 further comprises at least one oven 3701, 3702 (demonstrated in FIG. 17B), each configured to adjust temperature of an NLC 3100, 3200 (seeder NLC 3100 and/or doubling NLC 3200).

In some embodiments, the length ($L_S$) of the first NLC 3100 (seeder NLC) is substantially smaller than the length ($L_D$) of the second NLC 3200 (doubling NLC). In some embodiments, $L_S$ equals to 10% or less of $L_D$, $L_S \leq 0.1\ L_D$.

In some embodiments, the second NLC 3200 and any optional subsequent NLC 3300 comprise/s LBO material (for converting a continuous wave laser) and its/their length ($L_D$) of is greater than 40 mm.

In some embodiments, the fundamental frequency ($F_F$) comprises a property of infra-red (IR) light ($\lambda_F$=1064 nm), therefore second harmonic frequency ($F_H$) comprises property of visible light ($\lambda_H$=532 nm).

In some embodiments, each of the NLCs is configured with a fundamental beam polarization along a crystallographic axis (Type 1) or with a fundamental beam polarization at 45° to the crystallographic axis (Type 2).

In some embodiments, each of the NLCs comprises at least one material selected from the group consisting: BBO, KTP, LBO, CLBO, DKDP, ADP, KDP, LiIO3, KNbO3, LiNbO3, AgGaS2, AgGaSe2.

In some embodiments, dimensions of lateral area 3210 of each of the NLCs is larger than the dimensions of its received input beams.

In some embodiments, the apparatus further comprises at least one collimating lens 3401, configured to make the input rays accurately parallel. In some embodiments, the apparatus further comprises at least one converging element 3402, 3403, configured to focus both the frequency doubled beam and the residual beam into a following element, for example into an NLC, or a PMC, optionally into the center (for example, 3215, FIG. 17A).

In some embodiments of the invention, a new method is provided for frequency doubling of optical radiation, the method comprising:
- providing a nonlinear crystal (NLC) with a fundamental beam, at a fundamental frequency ($F_F$), and a weak second harmonic beam, at a second harmonic frequency ($F_H$);
- thereby emitting via the NLC a strong frequency doubled beam, at the second harmonic frequency ($F_H$), together with a residual beam, at the fundamental frequency ($F_F$);
- wherein the power ratio between the provided weak second harmonic beam and the fundamental beam is smaller than $5 \times 10^{-3}$ to 1, respectively;
- and wherein the power ratio between the emitted strong frequency doubled beam and the fundamental beam is larger than 0.3 to 1, respectively.

In some embodiments, the step of providing further comprises phase mismatch compensating between the fundamental beam and the weak second harmonic beam, via a phase mismatch compensator (PMC); and wherein the method further comprises controlling the PMC to allow maximum power for the strong frequency doubled beam.

Reference is now made to FIGS. 18A and 18B. FIG. 18A schematically shows temperature variations along the optical axis in a single crystal temperature-tuned for low power conversion, but which experiences heating when operated at high power, while FIG. 18B shows the accumulated phase up to any location Z in the crystal. Temperatures are given as (T0=149.1° C.) where T0 (Z) is the on-axis temperature. As demonstrated, the crystal is hottest in the focal region. This is because the area around the heat generation zone (the beam) through which the heat must pass is lowest in the focal spot and because the distance across which the heat must pass before leaving the heat transport zone (the unilluminated crystal) is longest at the focus. The temperature distribution is asymmetric with respect to the focal region, because more green is generated as the beam propagates, so more light is absorbed in the latter part of the crystal. In this case, every point within the crystal is too hot, so the MP increases monotonically.

As mentioned above, FIG. 18A schematically demonstrates the temperature variation along the optical axis in a single LBO crystal placed in an oven set for low power frequency doubling of a 1064 nm beam. In some embodiments, optimum doubling occurs at 149.1° C. T0 is greater than the optimum temperature because of heating by the laser beams. The temperature profile is nonuniform because the beam is being focused into the center of the crystal and because green absorption is approximately 4× greater than the IR absorption. Optimum doubling will not occur because of this heating.

FIG. 18B schematically demonstrates the total phase difference between the fundamental and doubled beams. Note that phase mismatch starts at the front face of the crystal and builds up even though most of the doubling occurs in the focal region. This build-up of MP can significantly affect frequency conversion in the focal region.

Reference is now made to FIGS. 19A-19C demonstrating temperature retuning of the PFD crystal followed by addition of a conjugate seed phase difference for the purpose of achieving minimum MP and optimum temperature in the focal region, where most of the frequency conversion occurs. In some embodiments, the conditions depicted in FIGS. 18A-18B are regarded as the starting conditions.

FIG. 19A depicts a solution, according to some embodiments, having temperature retuning and phase offset provided by the seeder crystal, which is the basis of this solution. As the first step, the PFD is temperature retuned as in the conventional approach, as shown in FIG. 19B, where the feedback parameter is maximum harmonic power after the first PFD. In some embodiments, the phase of the $2^{nd}$ harmonic seed beam generated by the seeder crystal may not, however, be optimum. To achieve optimum phase difference from the seeder crystal, the PMC is varied, as shown in FIG. 19C. This two-step process is iterated until no further improvement is achieved. Simulations have shown that an optimum is almost always achieved no matter what the initial phase difference and that this optimum is very close to the conversion efficiency achieved with perfect PM.

In some embodiments the apparatus 3000 as mentioned above can be incorporated into various systems; few non-limiting examples:

Industrial application systems, such as irradiation of work-pieces with poor infrared absorption for the purpose of cutting, welding, surface treatment, or performing additive manufacturing.

Scientific applications systems, such as pumping Ti:sapphire for the purpose of generating femtosecond pulses at high repetition rate and at high average power, or for the purpose of generating higher frequencies through further sum frequency mixing/additional frequency doubling, or tunable frequencies below the second harmonic through the addition of an optical parametric oscillator.

Medical application systems, where invasive procedures need to be quickly performed.

Simulation Tests

Figure 20A:
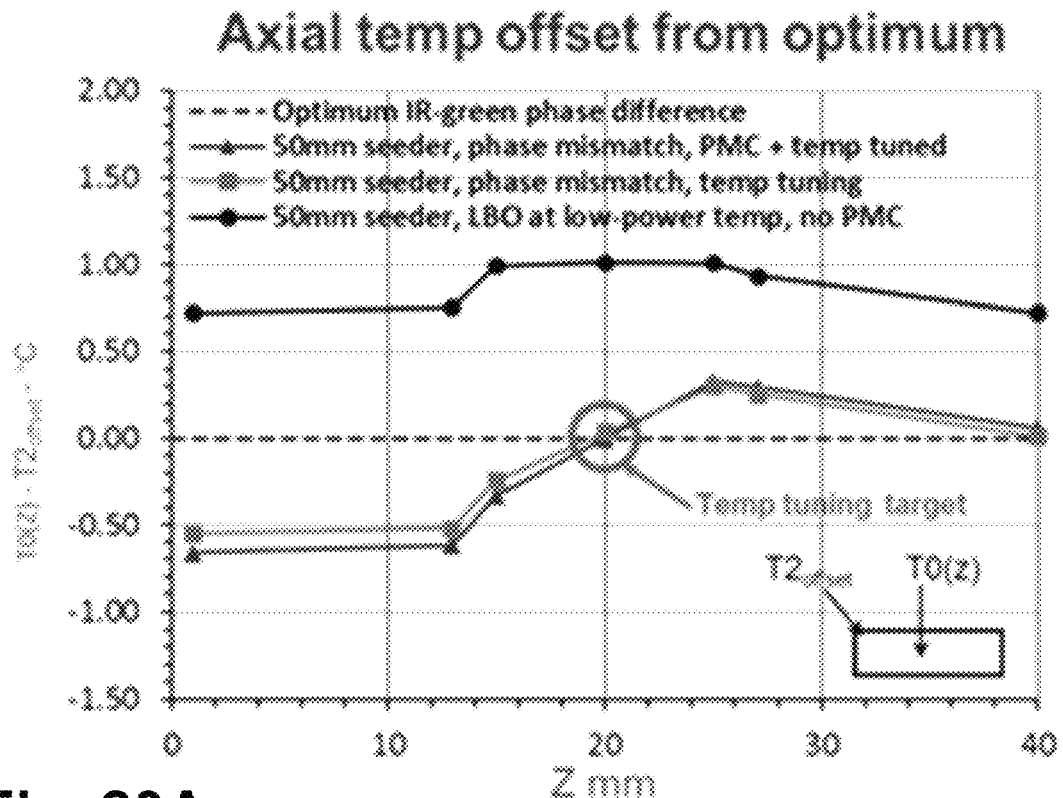
FIGS. 20A, 20B and 20C demonstrate a summary of a set of simulations performed with a 500 W input beam and a 50 mm seeder crystal.
Figure 20B:
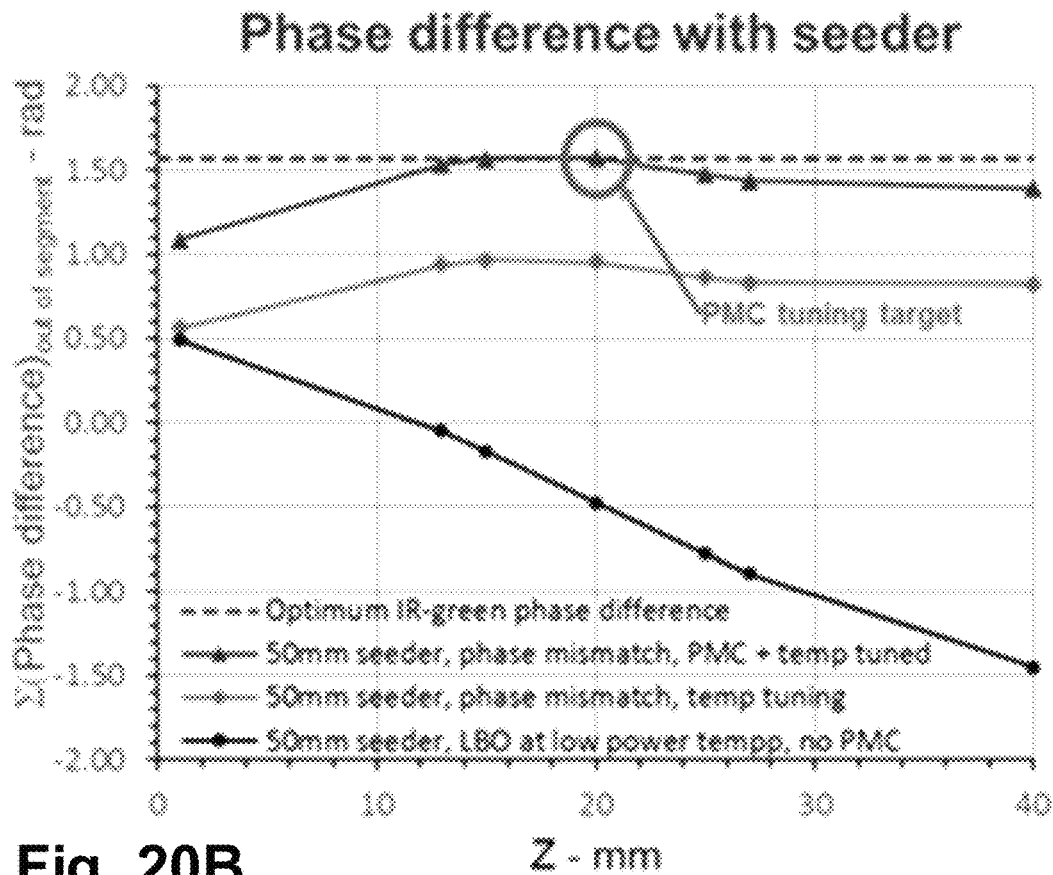
Figure 20C:
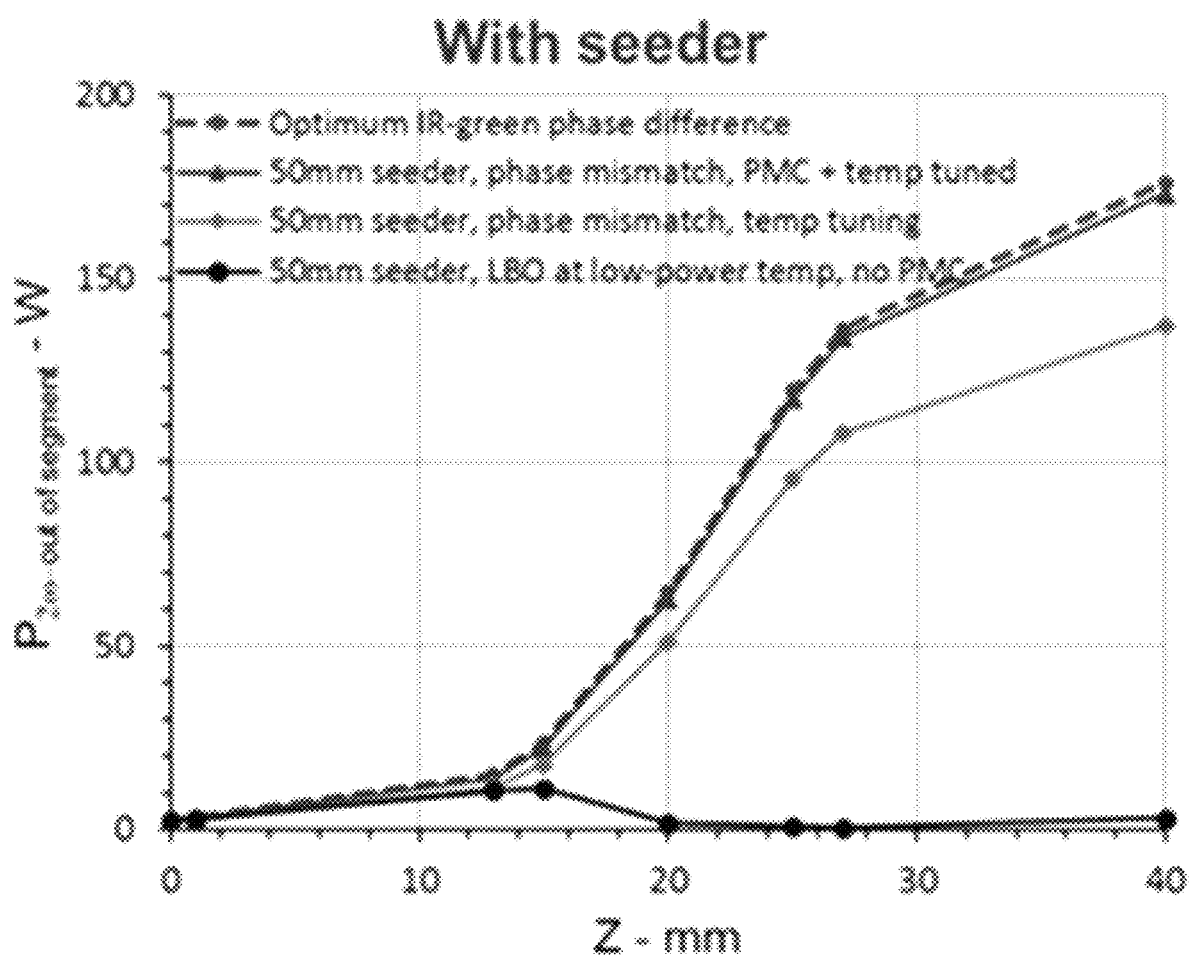

Reference is now made to FIGS. 20A, 20B and 20C, demonstrating results for a set of simulation performed with a 500 W input beam. A thick 50 mm seeder crystal was used to generate a $2^{nd}$ harmonic seed beam with a phase-difference significantly off from the conjugate phase difference required to correct the MP in the PFD NLC. It is noted that, from the point of view of seeder beam power required, a much thinner crystal could have been used.

The models incorporated in simulations:
a. Axially dependent absorption per wavelength.
b. Beam focuses into middle of crystal.
c. Transverse temperature calculated within the beam (heating zone) and in the un-irradiated zone (heat transport zone).
d. Phases calculated based on thermo-optic coefficients and segment propagation length.
e. Doubling per segment using SNLO.
f. Crystal divided into seven (7) segments. Beam diameter constant in each.
g. Use output for qualitative analysis.

FIGS. 20A-20C demonstrates three cases of axial temperature offset from the optimum temperature (dashed blue line). The input laser power was 500 W and a 50 mm seeder crystal was used. The test results are:

the black line with solid circles demonstrates the temperature change without an oven being retuned from low power.

The orange line with squares demonstrates the temperature offset after temperature tuning for maximum doubled power.

The green line with triangles demonstrates the temperature after retuning the PMC and a final (small) temperature retuning.

Optimization target was set to T0(Z)=149.1° C. at the center of the focal region. Heat transport along the input face was assumed to equal that in the interior. Heat transport across the input face was assumed to equal zero. Other boundary conditions were tested.

FIG. 20B demonstrates phase difference between fundamental (input) and doubled beams with a provided seeder NLC. The PMC phase was adjusted so as to reach optimum doubling at the PFD NLC's center. This strategy always resulted in optimal doubling.

FIG. 20C shows the green beam power, as the beams propagated through the PFD. It is noted that, the poor conversion prior to temperature and PMC retuning is significant. It is also noted that, by adding the PMC after temp retuning, the output increased by a factor of 1.3× and reached the power calculated without phase-mismatch.

Table 1: demonstrates a summary of simulation results for doubling of a 500 W input beam with and without a 50 mm seeder crystal.

TABLE 1

Summary of doubling 500 W without & with a 50 mm seeder

| System configuration | | | Doubling efficiency $P_{2w}/P_{w0}$ | Temp tuning - ° C. $T2_{PM} - T2_{UTO}$ | Input $\Delta\phi_{\omega-2\omega}$ to 1st crystal - rad $\Delta\phi_{input}$*[1] | $\Delta\phi$PMC | *[1]seeder or spoilt |
|---|---|---|---|---|---|---|---|
| No seeder, 1st crystal | With phase mismatch, | Temp tuned | 0.2730 | 1.2300 | 1.5708*[2] | — | *[2]No freedom |
|  | No phase mismatch |  | 0.332 | — | 1.5708*[3] | — | *[3]Optimum |
| Seeder (50 mm), 1st crystal (40 mm) | With phase mismatch, | Do nothing | 0.007025 | 0.0000 | 0.5322 | 0 | Seeder length |
|  |  | Temp tuned | 0.2743 | 1.2894 | 0.5322 | 0 |  |
|  |  | Temp tuned + PMC for max | 0.3539 | 1.3848 | 0.5322 | ~0.5197 | chosen to get significant MP from it. |

*[1]50 mm seeder selected only to show effect of its natural MP.

*[2]$P_{2w}$(seeder) = 2.545 W

*[3]Doubling reached maximum theoretical level despite strong heating

Table 2: demonstrates a summary of test results for doubling of a 500 W input beam with and without a 10 mm seeder crystal.

TABLE 2

Summary of doubling 500 W without & with a 10 mm seeder

| System configuration | | | Doubling efficiency $P_{2w}/P_{wo}$ | Temp tuning - °C. $T2_{PM} - T2_{UTO}$ | Input $\Delta\phi_{\omega-2\omega}$ to 1st crystal - rad | | *¹seeder or spont |
|---|---|---|---|---|---|---|---|
| | | | | | $\Delta\phi_{input}$*¹ | $\Delta\phi_{PMC}$ | |
| No seeder, 1st crystal (50 mm), | With phase mismatch, | Temp tuned | 0.2730 | 1.2300 | 1.5708*² | — | *²No freedom |
| | No phase mismatch | | 0.3079 | — | 1.5708*³ | — | *³Optimum |
| Seeder (40 mm), 1st crystal | With phase mismatch, | Do nothing | 0.1045 | 0.0000 | 1.3661 | 0 | Luckyl |
| | | Temp tuned | 0.3032 | 1.2248 | 1.3661 | 0 | Seeder came out |
| | | Temp tuned + PMC for max | 0.3064 | 1.2248 | 1.3661 | ~(—) 0.1829 | near optimum. |

*¹$P_{2w}$(seeder) = 0.1018 W
*²Doubling reached maximum theoretical level despite strong heating Important points to note from the above mentioned simulation tests are:

Two independent parameters are required to correct for phase mismatch the temperature and the PMC. While we have analyzed temperature induced phase mismatch, the Temperature+PMC correction technique can be applied to other causes of MP.

Acceptable phase matching was achieved over a long section of the PFD in the focusing geometry analyzed and using a uniform temperature oven.

Correction can significantly improve performance. The level of performance can be brought up to that of PFD without MP.

The use of a (seeder crystal+PMC) is fully compatible with multiple PFDs. In this case, each additional PFD is preceded with its own PMC. Carrying on the simulation through a second PFD crystal suggests that ~350 W might be achieved (70% conversion efficiency).

Figure 21:
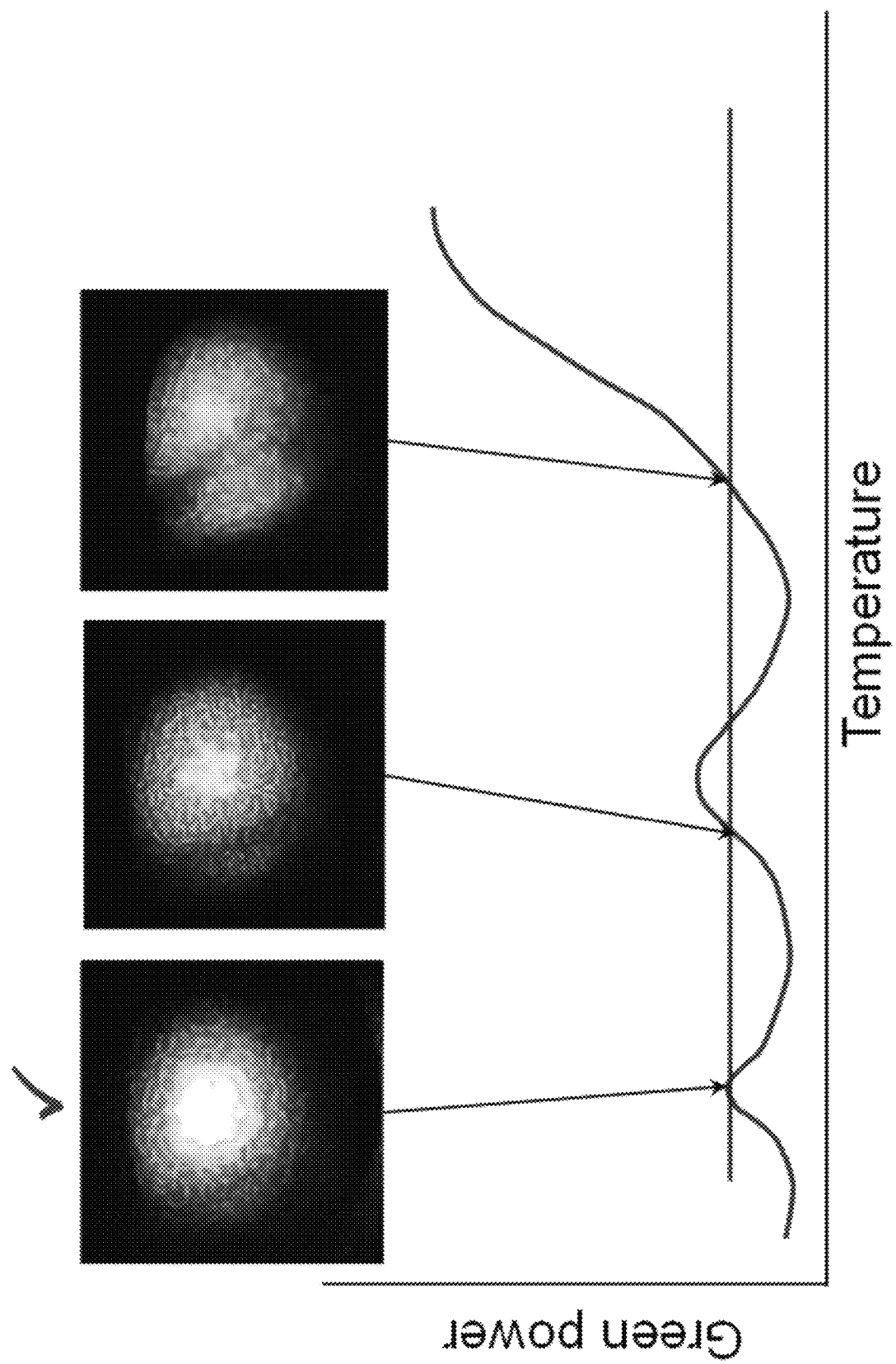
FIG. 21 demonstrates seeder beam profiles at off-resonant temperatures, according to some embodiments of the invention.

The aim of one experimental test was to demonstrate that injection of a weak seed beam with controlled fundamental-harmonic phase difference, as in some of the above embodiments, can produce better frequency doubling from a "Power Doubler" than an un-seeded configuration. The test featured:

a. Low temperature of a 1$^{st}$ oven to generate a weak seed beam. The seed beam profile is shown in FIG. 21 for different off-resonant temperatures. The best profile is obtained when the temperature corresponds to a secondary peak that provides the desired power. In this case 190 mW was chosen.

b. Determine the optimum 2$^{nd}$ oven temperature for $P_w \approx 220$ W+$P_{2w} \approx 30$ W.

c. Raise the temperature of the 2$^{nd}$ oven to simulate additional heating. Do this twice, once with the PMC held at a constant angle and then with the PMC rotated to yield maximum doubling.

Two seeder powers were tested in order to differentiate between input-power amplification, and phase-induced effects.

Figure 22A:
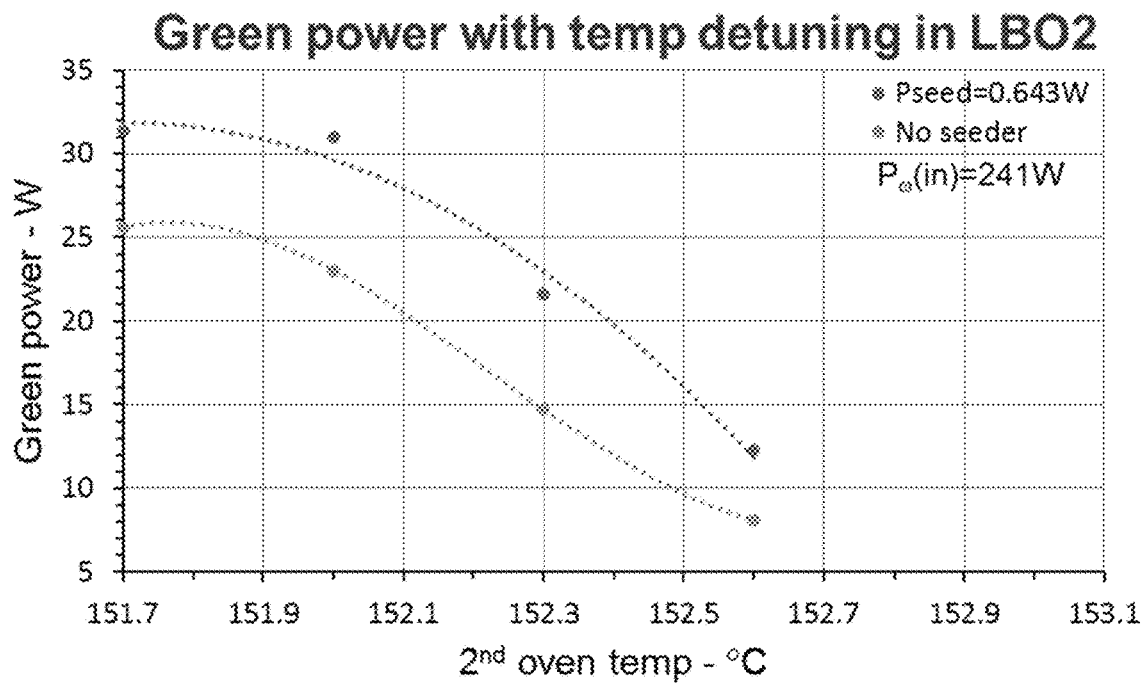
FIGS. 22A and 22B demonstrate simulation results with- and without-seeder beam and their comparison, according to some embodiments of the invention.
Figure 22B:
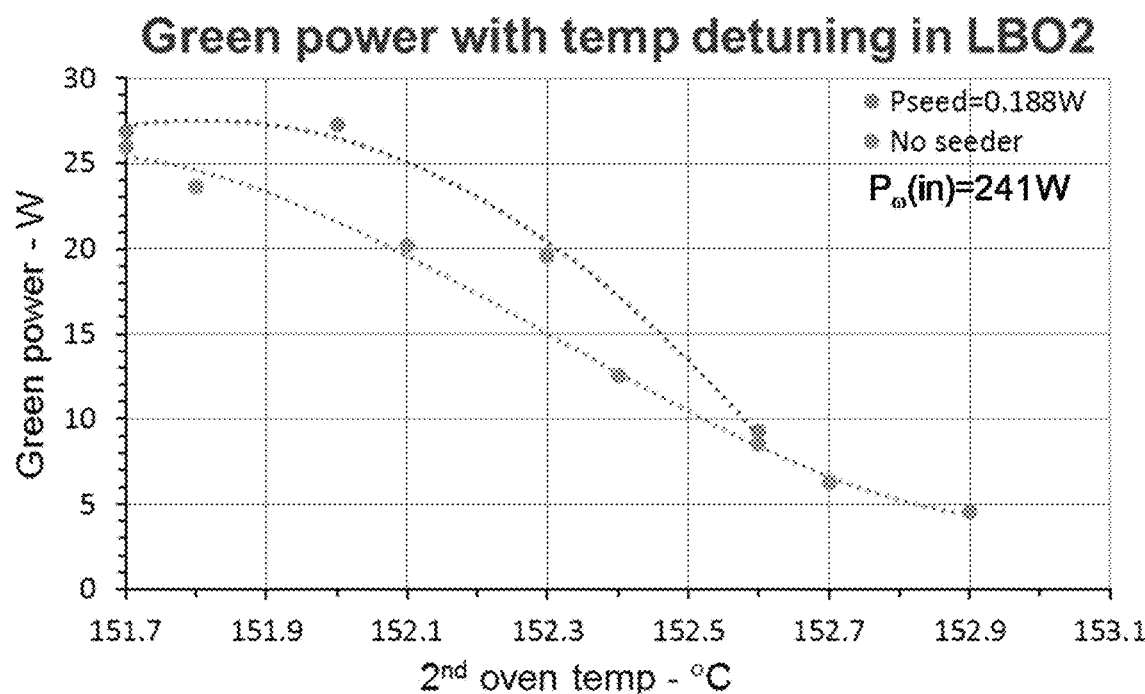

FIGS. 22A and 22B demonstrate experimental results with- and without-seeder beam and their comparison. FIG. 22A for a 0.643 Watt seeder and FIG. 22B for a 0.188 Watt seeder; the orange (upper) line is for the "with seeder" and the blue (lower) line is for the "without seeder". FIGS. 22A and 22B demonstrate:

1. There is a difference between the "with-" and the "without-" seeder results at the optimum temp for the 0.643 Watt seeder. This demonstrates power amplification and phase effects.
2. There is no difference between the "with-" and the "without-" seeder results at the optimum temp for the 0.188 Watt seeder. Elevated temperatures only shows mismatched phase effects. The difference (horizontal and/or vertical) shows the improvement.

Figure 23:
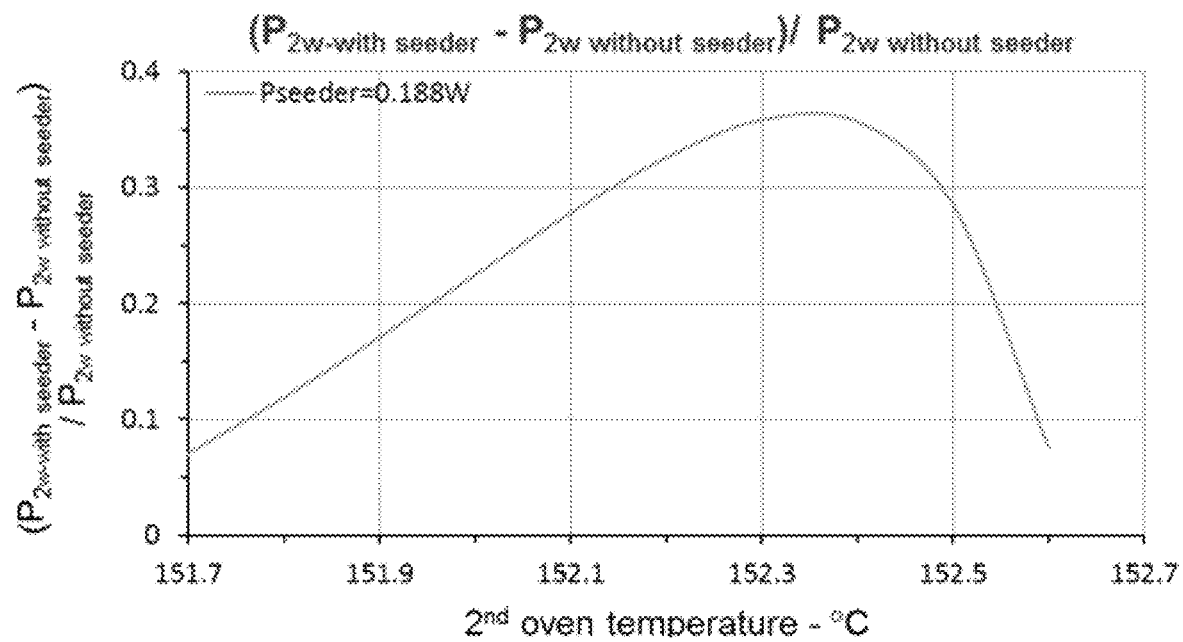
FIG. 23 demonstrates the added value to using a seeder beam, according to some embodiments of the invention.

FIG. 23 demonstrates the added value to using a seeder beam, by calculating $(P_{2w\text{-with seeder}} - P_{2w\text{-without seeder}})/P_{2w\text{-with seeder}}$ vs. the 2$^{nd}$ oven temperature.

It seems modest because the maximum appears in the wings and doesn't get us back to peak doubling.

In some embodiments, for a commercial product, a beam of constant power with fluctuations on the order of SD=±1.5% is produced. The broader the temperature bandwidth of the doubler, the easier it is to maintain this stability.

Table 3 demonstrates the width of the temperature tuning curves, at the 98.5% level.

TABLE 3

| Temperature bandwidth - ° C. | |
|---|---|
| No seeder | ±0.06 |
| With seeder | ±0.27 |
| Improvement | 4.5x |

Accordingly, the "no Seeder" bandwidth is tighter than the oven controller's capabilities. The "with Seeder" bandwidth is doable.

Figure 24:
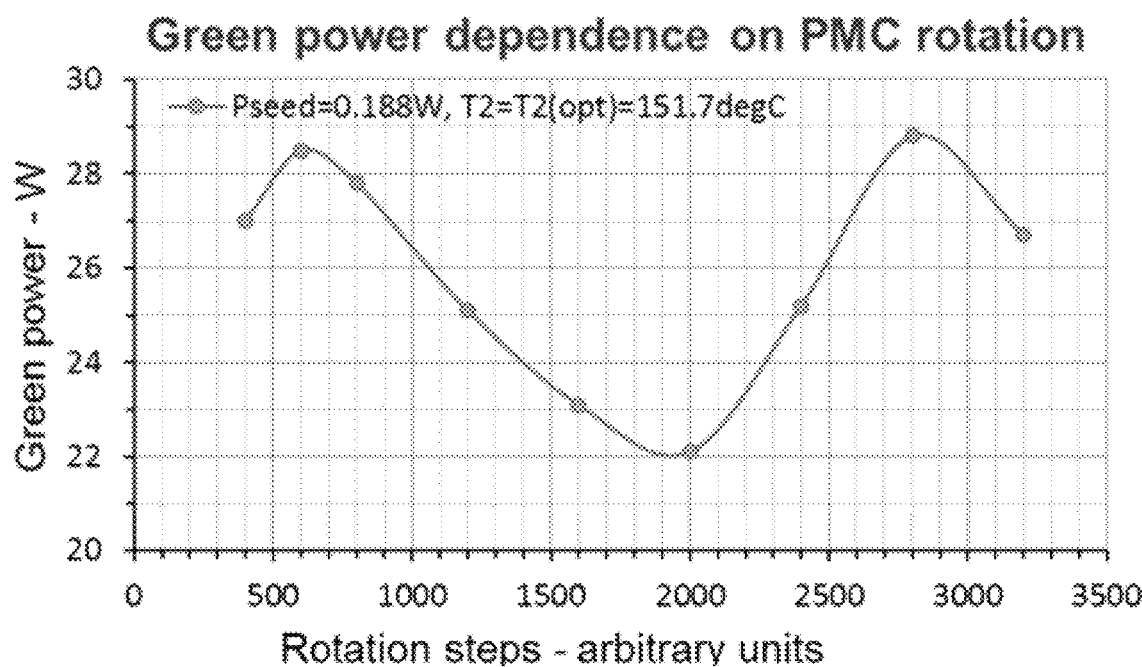
FIG. 24 demonstrates that the seeder beam provides a phase effect, by presenting the green output beam vs. PMC rotation, according to some embodiments of the invention.

FIG. 24 demonstrates that the seeder beam provides a phase effect, by presenting the green output beam vs. PMC rotation;
1. Only phase control can cause back-conversion (a reduction in power).
2. By rotating the PMC for fixed oven temperatures and the power is modified.
3. Only 0.19 Watt of seeder caused a 7 Watt drop in output. Therefore, phase control is confirmed.

Accordingly, the above mention seeder simulation tests lead to the conclusion that an output of green power >200 Watt from a single beam, can be provided using a seed beam, according to some of the above mentioned embodiments.

Enhanced Capabilities to Harmonic Conversion Systems Using an Actively Controlled Phase Mismatch Compensator Between Two Crystals In some embodiments the present invention provides an addition of dynamic control to the PMC through feedback or look-up tables so as to expand the capabilities of a frequency conversion system. In some embodiments, this can result in at least one of: enhanced stability in the presence of temperature variations in the ovens housing the crystals, changes in the average power of the laser, and the ability to modulate the harmonic beam.

Figure 25A:
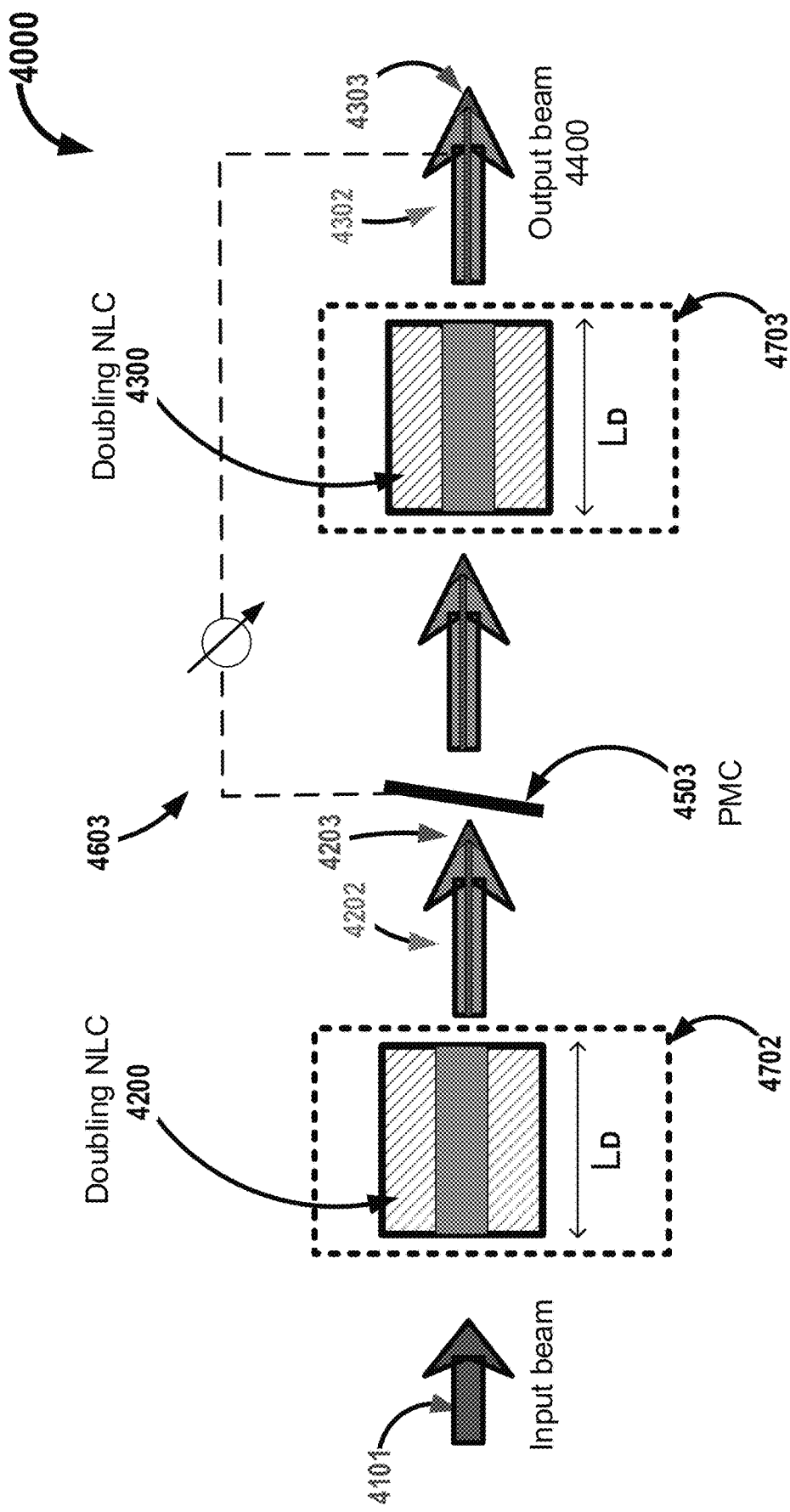
FIGS. 25A, 25B and 25C schematically demonstrate various configurations for the frequency doubling apparatus, according to some embodiments of the invention.
Figure 25B:
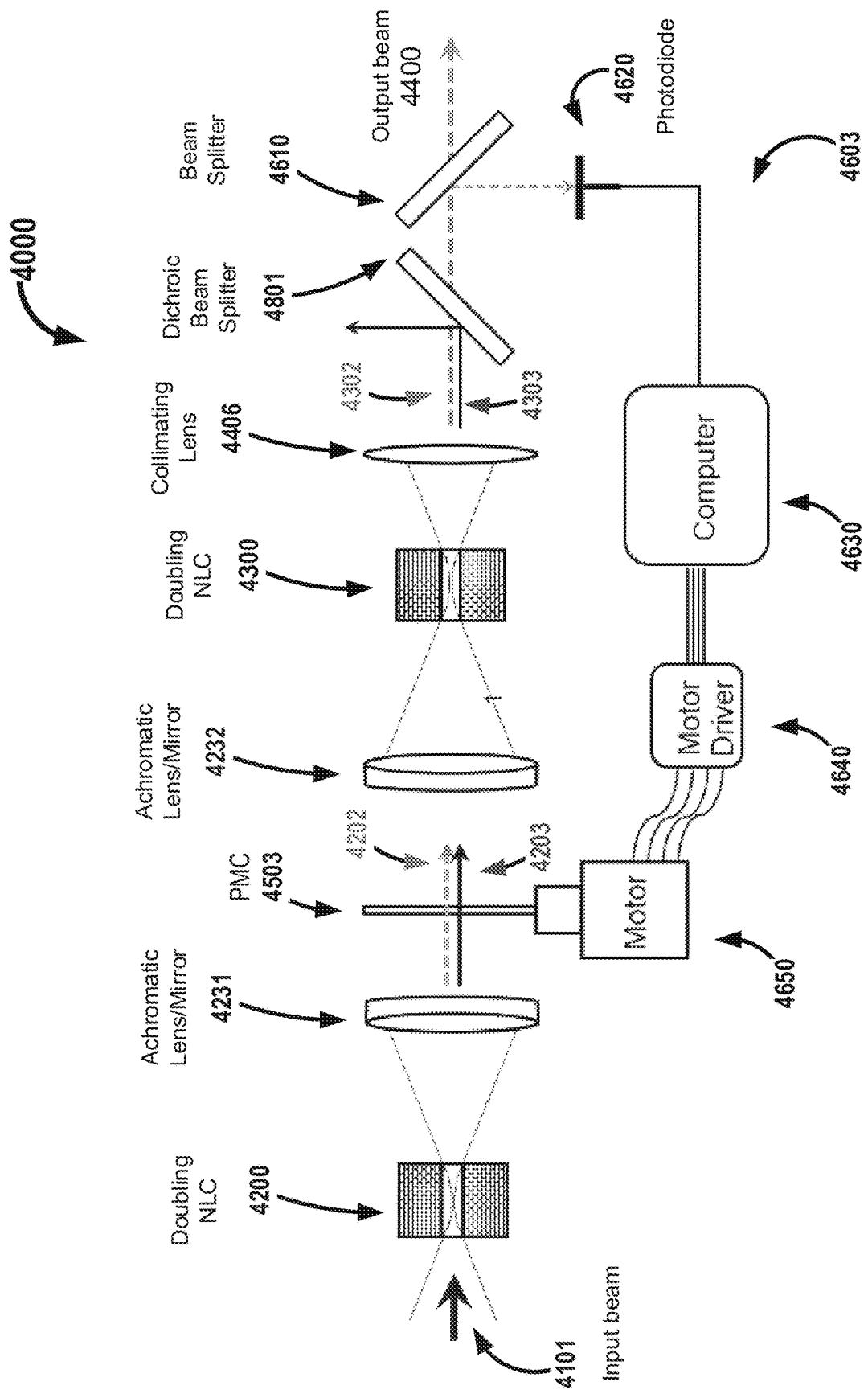
Figure 25C:
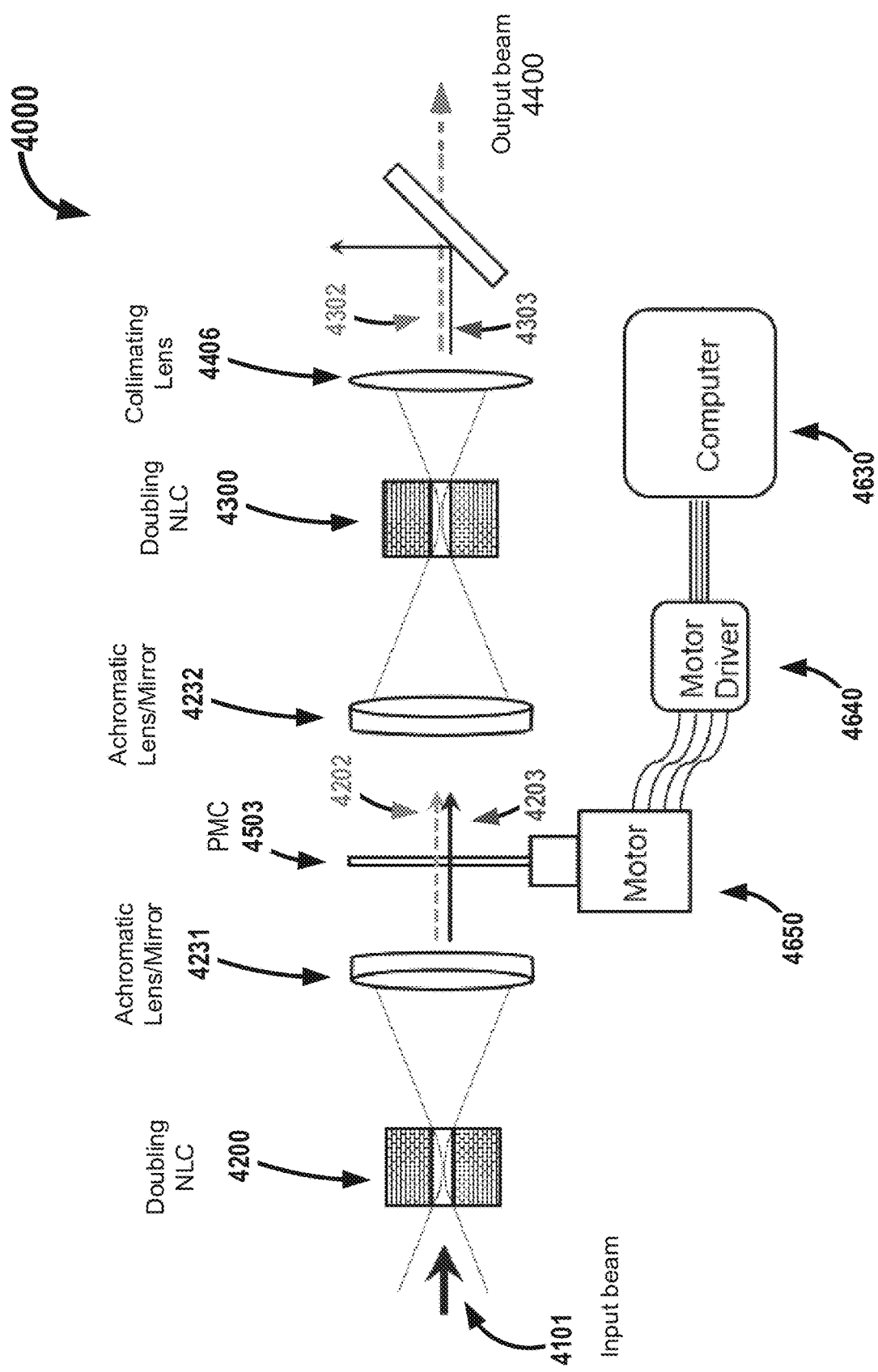

In some embodiments, the PMC described herein is consisting of a glass window. In some embodiments the PMC is generally applicable to any optical element exhibiting chromatic dispersion that is a function of some externally controllable parameter. Reference is made to FIGS. 25A, 25B and 25C demonstrating an apparatus 4000 configured to double frequency of an input of optical radiation 4101 and to provide an output beam 4400 comprising a second harmonic frequency 4302. The apparatus comprising:

at least two sequential nonlinear crystals (NLCs) 4200, 4300; each NLC, configured to receive a first beam 4101 or 4203 at a fundamental frequency ($F_F$), and optionally a second beam 4202 at a second harmonic frequency ($F_H$) from a previous NLC 4200, and to emit a strong frequency doubled beam 4202, 4302, at the second harmonic frequency ($F_H$), together with a residual beam, at the fundamental frequency ($F_F$) 4203, 4303;

at least one phase mismatch compensator (PMC) 4503, positioned between the two NLCs; the PMC is configured to correct a phase relationship between a residual beam 4203, at the fundamental frequency ($F_F$), and a second harmonic beam 4202, at the second harmonic frequency ($F_H$), prior to being received by the following NLC; and a motorized rotation device 4650 per each the PMC, configured to actively rotate the PMC and therefore actively adjust the correction of the phase relationship between the residual beam and the second harmonic beam.

In some embodiments, the apparatus 4000 further comprising at least one feedback- and control-system, configured to sample the strong frequency doubled beam in real-time and accordingly to tilt the PMC in a continuance or step-wise manner, via the motorized rotation device, to continuingly allow maximum power for the strong frequency doubled beam.

In some embodiments, the feedback and control system comprising: at least one beam splitter 4610, at least one measuring element (e.g. photodiode 4620), at least one processing element 4630, and at least one control element 4640 configured to control the motorized rotation device 4650.

In some embodiments, the PMC comprises an optically transparent window exhibiting chromatic dispersion, such that the distance through which the beams must pass through the window varies relative to its rotation angle. In some embodiments, the PMC comprises a plate exhibiting chromatic dispersion, such that the distance through which the beams must pass through the window (e.g. transparent plate polished on both sides) varies relative to its rotation angle.

In some embodiments, the motor is configured to rotate the PMC in a step-wise and/or a continuous motion, in a continuance real-time manner.

In some embodiments, the motor is further configured to rotate the PMC in a Dither form bounded between upper- and lower-values.

In some embodiments, wherein feedback- and control-system is configured to use the Dither form to provide at least one of the following:

minimize back-conversion in the following NLC, thereby maximize power of the output beam;

maximize back-conversion in the following NLC, thereby minimize power of the output beam;

adjust the power of the output beam to a predetermined value between the maximum and the minimum, optionally during static or dynamic operating conditions selected from: varying input laser power and varying oven temperatures.

In some embodiments, the motor is configured to rotate the PMC in a toggle mode, between maximum and minimum harmonic conversion states, such that the output beam is turned ON and OFF respectively.

In some embodiments, the motor is configured to rotate the PMC to provide flat-topped pulses of controlled rise and fall times, and of controllable duration.

In some embodiments, the motor is configured to rotate the PMC in accordance with look-up tables, and therefore to provide shaped harmonic pulses.

In some embodiments, the apparatus 4000 further comprising at least one dichroic beam splitter 4801 configured to separate at least part of the residual beam 4303 out of the output beam 4400.

In some embodiments, the power ratio between the emitted strong frequency doubled beam and the emitted fundamental beam is larger than 0.3 to 1, respectively.

In some embodiments, the apparatus 4000 further comprising at least one oven, each configured to adjust temperature of the NLCs. In some embodiments, the apparatus 4000 further comprising at least two ovens, each oven configured to adjust temperature of a different NLC.

In some embodiments, the active control of the PMC is configured to minimize power variations caused by variations in the temperature of the ovens housing the NLCs.

In some embodiments, at least one of the NLCs comprises LBO and its length ($L_D$) is sufficient to achieve significant harmonic light. In some embodiments, at least one of the NLCs comprises LBO and its length ($L_D$) of is greater than 40 mm.

In some embodiments, the fundamental frequency ($F_F$) comprises a property of infra-red (IR) light ($\lambda_F$=1064 nanometer nm), therefore second harmonic frequency ($F_H$) comprises property of visible light ($\lambda_H$=532 nm).

In some embodiments, each of the NLCs is configured with a fundamental beam polarization along a crystallographic axis thereof or with a fundamental beam polarization at 45° to the crystallographic axis thereof.

In some embodiments, each of the NLCs comprises at least one material selected from the group consisting: BBO, KTP, LBO, CLBO, DKDP, ADP, KDP, LiIO3, KNbO3, LiNbO3, AgGaS2, AgGaSe2.

In some embodiments, dimensions of lateral area of each of the NLCs is larger than the dimensions of its received input beams.

In some embodiments, the apparatus 4000 further comprising at least one achromatic converging element 4232, or, 4231 and 4232, configured to focus the fundamental and harmonic beams into an NLC.

In some embodiments of the invention, the apparatus 4000 further comprises at least one collimating lens 4406, configured to make its passing beam rays about accurately parallel. In some embodiments, the apparatus 4000 further comprises at least one converging element 4404, 4405, such as an achromatic-lens or -mirror, configured to focus both the frequency doubled beam and the residual beam into a following element, for example into an additional NLC.

In some embodiments, the PMC consists of a thin (~1 mm) anti-reflection coated, fused-silica window. In some embodiments, the material's intrinsic chromatic dispersion is utilized to add a controllable amount of phase difference between the fundamental and harmonic beams passing through it.

Figures 26A, 26B:
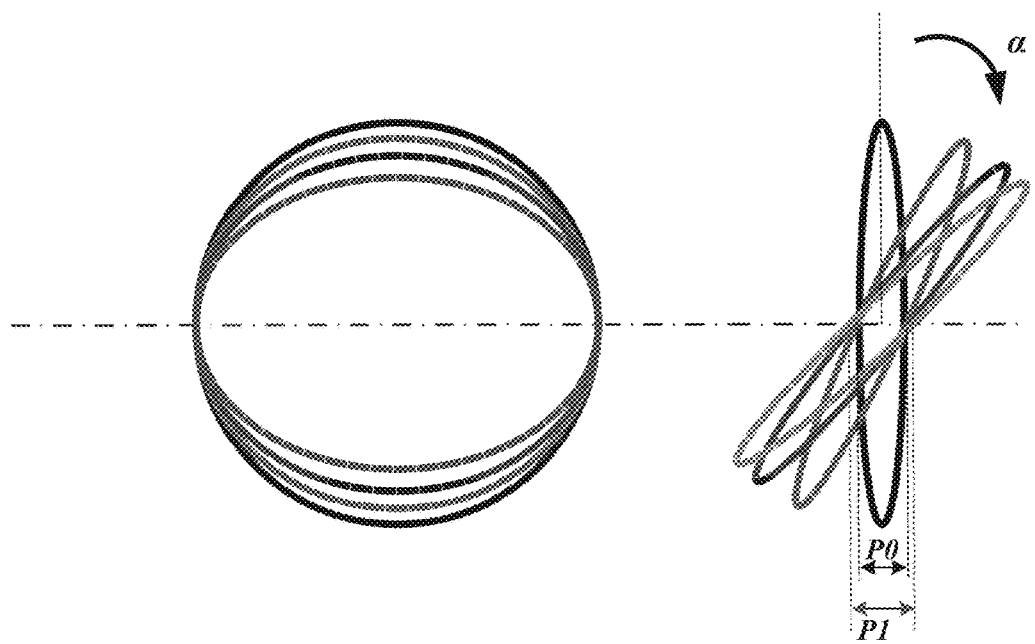
FIGS. 26A and 26B schematically demonstrate rotating- or tilting-angles of a PMC, front-view at FIG. 26A and side-view at FIG. 26B, according to some embodiments of the invention.

The following examples demonstrate that, according to some embodiments, enhanced capabilities are achieved through an active control of the PMC. In some embodiments, the PMC is mounted on a motorized rotating (or tilting) base 4650. In some embodiments, and as demonstrated in FIGS. 26A and 26B, the fundamental-harmonic phase difference increases in accordance with the PMC's rotation angle $\alpha$. An increased rotation—(or tilting-) angle $\alpha$ (from a PMC which is positioned perpendicular to the beam, $\alpha=0$) increases the optical path via the PMC, FIG. 26B: P1>P0, where P0 is the path for $\alpha=0$ and P1 is a path for $\alpha>0$.

In some embodiments, the optimal rotation angle, which provides an optimal output beam (e.g. a beam at a user specified power) 4400, can be selected as a result of rotating to predetermined positions, based on look-up tables (pre-defined tables, based on earlier database), or by using a feedback system 4603, as demonstrated in FIGS. 25A and 25B (with feedback system); FIG. 25C demonstrates an apparatus without a feedback system. In some embodiments, and as demonstrated in FIGS. 25A and 25B, feedback can be achieved by sampling the output beam 4400 using a power measuring detector (for instance a photodiode, FIG. 25B 4620). In some embodiments, in both cases (look-up tables and feedback system), a computer (or microprocessor) is used 4630, to send a control signal to the motor 4650 via driver electronics 4640.

Figure 27:
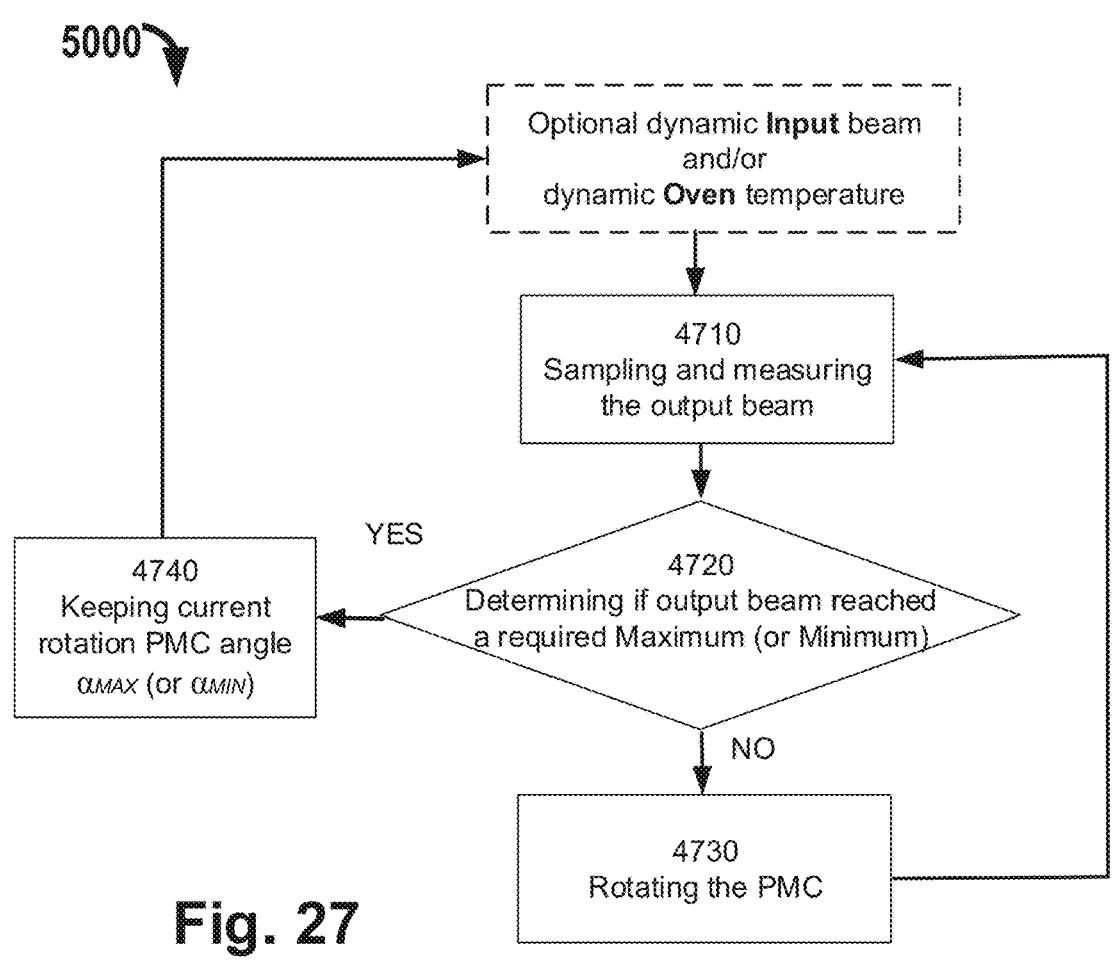
FIG. 27 schematically demonstrates optional feedback algorithms used to continuously adjust the PMC's rotation angle, according to some embodiments of the invention.

In some embodiments, and as demonstrated for example in FIG. 27, feedback algorithms can be used to continuously adjust the PMC's rotation angle so as to find, and then maintain, maximum doubling efficiency and to reduce (for example by a factor of two) the green power fluctuations, which are caused by temperature stability limitations of the ovens, used to maintain constant crystal temperatures. In some embodiments, the feedback control can be used to correct the PMC's angle to overcome changes in the laser input power that cause the crystal temperature to vary due to differing amounts of light absorption.

In some embodiments, the opposite of frequency doubling is back-conversion. Doubled light generated in the first crystal can be back-converted to the fundamental frequency in a second crystal, if the phase difference is adjusted to cause that effect. The PMC is effective in introducing such back-conversion phase-difference. Thus, the PMC can be rotated to maximize or to minimize frequency doubling. This effect allows generation of harmonic pulses by toggling the PMC angle between Low Green (LG) thereby output beam "OFF" and High Green (HG) angles thereby output beam "ON".

In some embodiments, and as demonstrated in FIG. 27, a method 5000 is provided for activating ("ON") and/or deactivating ("OFF") a doubled frequency output beam from the above mentioned apparatus 4000. The method comprising:

Real-time sampling and measuring 4710 the output beam;
Continuingly or frequently determining if the output beam reached a required Maximum value, for an "ON" output (or a required Minimum, for an "OFF" output) 4720,
if "NO" 4730 rotating the PMC, and repeating the method from the sampling step 4710;
if "YES" 4740 keeping the current angle $\alpha_{MAX}$ (or $\alpha_{MIN}$) and repeating the method from the sampling step 4710, for any case of dynamic input beam and/or dynamic oven temperature.

In some embodiments, the "ON"/"OFF" states are long enough, such that optimal maximum/minimum can be achieved. In some embodiments, for a faster "rise" or "fall" times ("ON"/"OFF"), the step of rotating comprises toggling the PMC between two predetermined states, therefore a fast modulating of the harmonic output beam.

The apparatus 4000 and method 5000 were tested and demonstrated an output beam 4400 activation ("ON") whose rise-time (30 milli-seconds ms) was limited only by the particular data communications hardware employed. In some embodiments, rise-time should only be limited by inertia of the rotation system together with torque plus accuracy of the motor toggling between two positions ("ON"/"OFF"). Doing this should thus yield a rise-time <1 ms in a phase-toggled mode.

In some embodiments, FIG. 25B schematically demonstrates the above apparatus 4000, comprising two nonlinear crystals (NLCs) 4200, 4300, in a configuration which was used for the following test demonstrations. The demonstrated harmonic conversion setup uses two nonlinear crystals placed in ovens and separated by an actively controlled Phase Mismatch Compensator (PMC) plate. The PMC is mounted on a motor whose position is computer-controlled using look-up tables or feedback provided by a photodiode sampling the harmonic output beam. In this setup, the beams are focused into each crystal so as to maximize conversion efficiency per crystal. In some embodiments and as used in this test setup, the NLCs comprising Lithium triborate (LBO), oriented for type 1, noncritical phase matching. As demonstrated, the NLCs are housed in resistive ovens that maintain a temperature of around 149.1±0.15° C. The optimum temperature varies as a function of input power, due to absorption of light at the fundamental and harmonic wavelengths. The degree of crystal absorption is a significant factor. Typical changes in optimum temperature are several degrees between 10 W and 250 W fundamental beam powers.

In some embodiments, sensitivity to changes in temperature scale inversely with crystal length. In the tested apparatus, individual crystals are at least 40 milli-meter (mm) long and there are two power doubling crystals per apparatus. Requirements are usually for ±1% harmonic power stability. This translates to an oven temperature stability requirement of about ±0.04° C. through two crystal-passes, which are in this example undergoing identical temperature variations (tested by double-passing one crystal). Such temperature stability is beyond the capabilities of most ovens plus controllers. The oven controllers work by applying an electrical pulse to the heating resistor whenever the temperature drops below a certain level. This raises the crystal temperature, but invariably causes an overshoot.

Figure 28A:
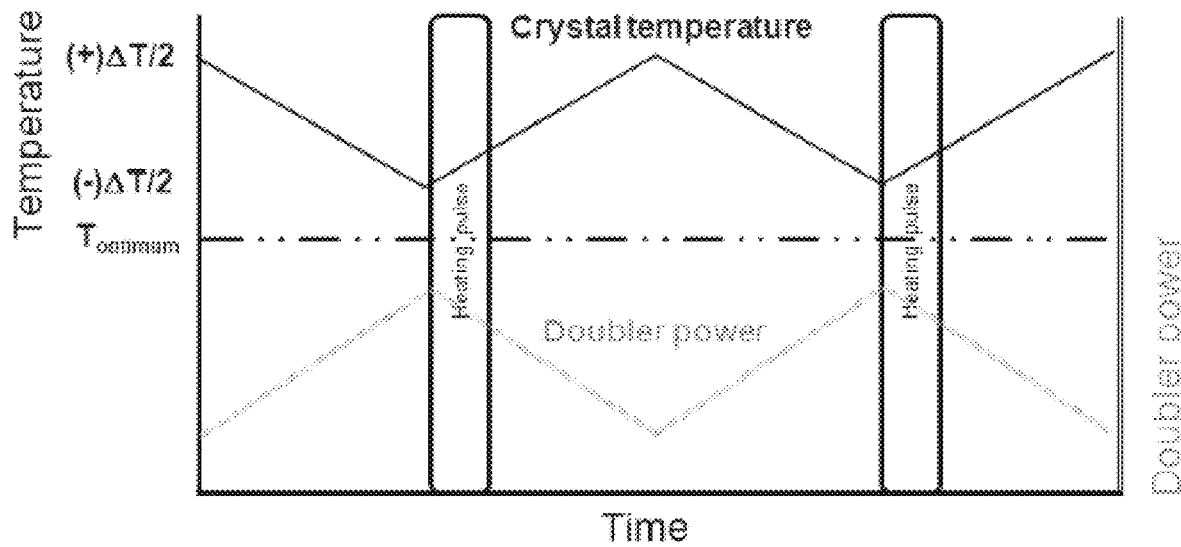
FIGS. 28A and 28B schematically demonstrate a crystal temperature in time and the doubler power variations, due to oven controller undershoot/overshoot, according to some embodiments of the invention.
Figure 28B:
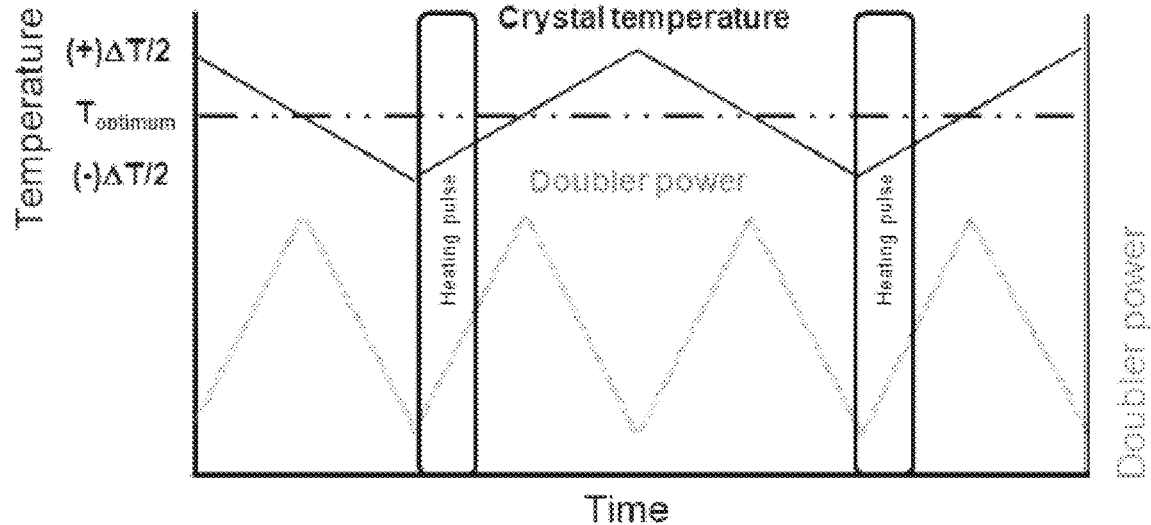

FIGS. 28A and 28B schematically demonstrate the crystal temperature in time and the doubler power variations, according to some embodiments of the invention, due to oven controller undershoot/overshoot. FIG. 28A demonstrates the oven temperature variations, which don't straddle the optimum temperature for frequency doubling, while FIG. 28B demonstrates the oven temperature straddling the optimum doubling temperature. For a typical system, the characteristic times for heating and cooling are on the order of one minute. As demonstrated, the harmonic light power variations mimic the frequency of oven temperature variations, if the temperatures don't cross the optimum temperature point, as demonstrated in FIG. 28A. When the oven temperature does cross the optimum temperature point, as demonstrated in FIG. 28B, then the frequency of harmonic power variations increases until twice the temperature-fluctuation frequency (when the temperature variations are symmetric around $T_{optimum}$). This result is a consequence of the fact that the harmonic power peaks every time the temperature crosses $T_{optimum}$ (on the way up or down), but the power drops for both positive and negative $\Delta T$.

In some embodiments, since temperature variations result in mismatched phase between the fundamental and harmonic light, a Phase Mismatch Compensator (PMC) plate can be used to add a conjugate phase so as to nullify the oven induced mismatched phase. In some embodiments, since the oven temperature is continuously varying, the PMC rotation also varies continuously. For this reason, the PMC is placed on a motorized rotation stage. In some embodiments, the PMC rotation angle varies via Dither control. In some embodiments Dither control is an intentionally applied form of noise, used to randomize quantization error, preventing large-scale patterns.

Figure 29:
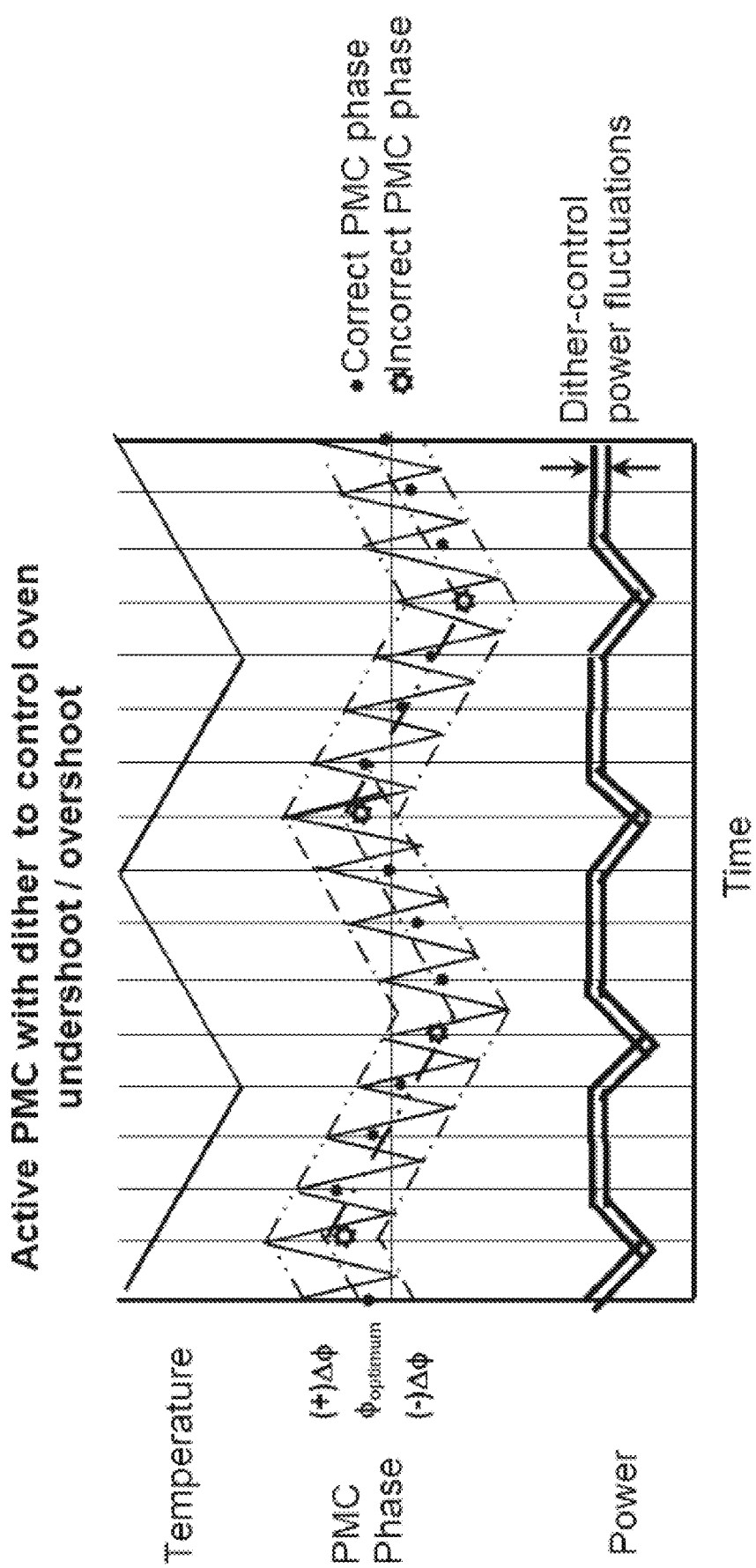
FIG. 29 schematically demonstrates the output power stabilization via Dither control for rotating the PMC, according to some embodiments of the invention, configured to overcome oven undershoot/overshoot.

FIG. 29 demonstrates the output power stabilization, according to some embodiments of the invention, via Dither control for rotating the PMC, which is configured to overcome oven undershoot/overshoot. As demonstrated, the active PMC response is shown by vertical lines in time. The rotation direction and the speed are evaluated at the end of each response period. The error results and power drops occur due to the delay between times when the crystal starts to heat up or to cool down and when the PMC re-orients. As demonstrated, high frequency, small-amplitude, rotational Dither control is applied to the PMC. In some embodiments, the Dither frequency upper limit is determined by physical inertia plus the feedback signal integration and the system's response time. In some embodiments, the Dither frequency lower limit is dictated by the application requirement or by the height/depth of the dither-induced power fluctuations. In some embodiments, the optimum PMC induced phase is not constant, but a saw-tooth with period equal to that of the oven temperature variations. On top of this slower variation is the Dither phase variation. When the Dither control properly tracks oven variation, there is fluctuation in the harmonic power, at twice the Dither frequency. If there is an error in the PMC phase (for instance when the crystal just starts to heat up after oven turns on and when there is a lag in processing the feedback signal and sending a control signal to the PMC), then the power drops and the high frequency fluctuation reduce to the Dither frequency.

In some embodiments, Dithered control with feedback is used to optimize the PMC angle, after a change in the operating conditions, as demonstrated in FIG. 30, and according to some embodiments, to then maintain harmonic power at a maximum value, while reducing fluctuations from typical values of about ±3.7% with a static PMC, as demonstrated in FIG. 31A, and according to some embodiments to about ±1.6% when the PMC is operated with active feedback control, as demonstrated in FIG. 31B where continuous Dither was used (Upper right section demonstrates a zoomed view at the time zone of 1440.5-1442.7 Sec). For these measurements the feedback photodiode was monitored. Notes: FIG. 30 demonstrates the output's green power, as the feedback-controlled PMC was rotated to bring the output to its maximum level ($P_{2\omega}$=80 Watt). The sawtooth during the rise in power is a result of the PMC's Dither control. The data was taken using the feedback photodiode. FIGS. 31A and 31B demonstrate a comparison of power fluctuations without-(FIG. 31A) and with-(FIG. 31B) continuous feedback-controlled PMC stabilization. FIGS. 31A and 31B demonstrate 10 minutes windows, out of 60 minutes runs. For these measurements, the feedback photodiode was monitored.

Figure 32:
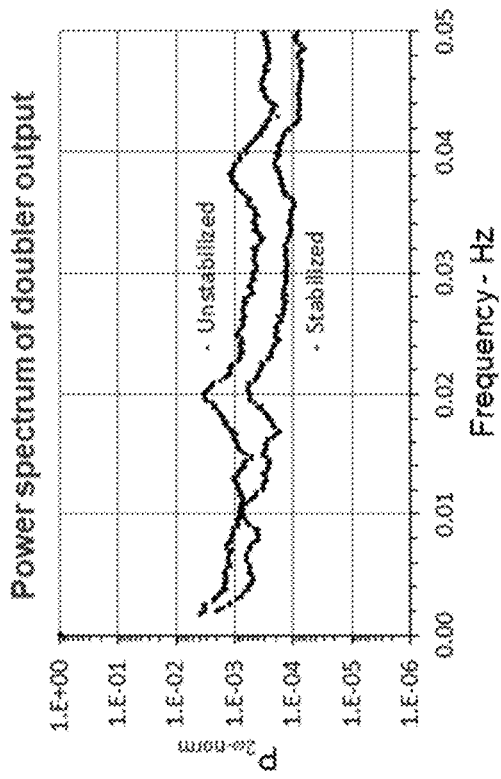
FIG. 32 demonstrates power spectra of the harmonic output for one hour runs, with and without stabilization algorithm, according to some embodiments of the invention.

In some embodiments, additional insight can be obtained by looking at power meter data in the frequency domain. This is demonstrated in FIG. 32, where one-hour runs were analyzed using Fast Fourier Transforms (FFTs), with (lower graph) and without (upper graph) stabilization algorithm. For the run performed without the stabilization algorithm, the harmonic conversion started out at optimum phase matching, but drifted over time. Thus, two offset peaks can be observed at the oven's characteristic temperature response frequency and also at twice that frequency. Note also the existence of an elevated amount of low frequency power just beyond the constant power (constant output) spike at 0 Hz. Note: at 0 Hz there is a point at a value equal to 1. This is the constant power component of the signal. In some embodiments, a perfectly stable beam would contain only this one point. This is another indication of power drift. The results with continuous Dither stabilization are very different. The oven-induced power fluctuations were reduced by approximately a factor of ×5 and the low frequency drift was also substantially reduced. Higher frequency components, beyond the scope of the plot were generated due to the Dither stabilization algorithm. These frequencies were beyond the frequency response of the Ophir 50(150) power meter, which was used.

Figure 33:
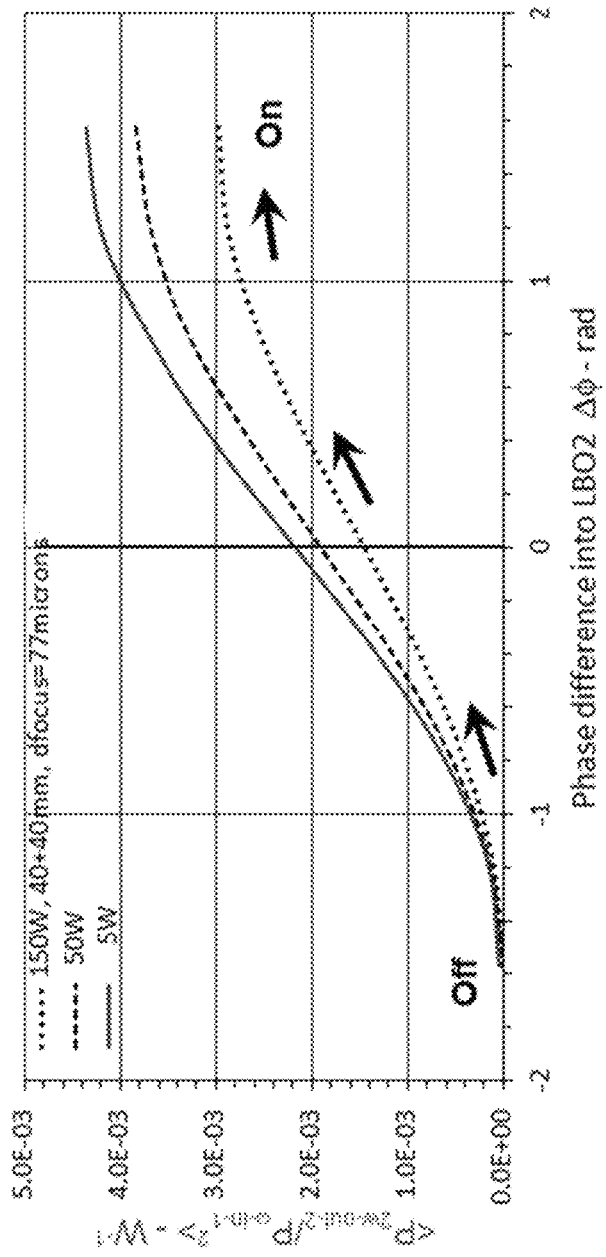
FIG. 33 schematically demonstrates back-conversion phase difference, according to some embodiments of the invention.

In some embodiments, high levels of back-conversion can be achieved and maintained with the same techniques as used to maximize harmonic conversion in the two NLCs apparatus 4000. In some embodiments, the only parameter that is changed is the infra-red (IR)—green phase difference. Simulations of this effect are demonstrated in FIG. 33, showing Smith Non-Linear Optics (SNLO) simulations, of the effect of rotating the PMC plate on the harmonic output power, for different input powers. Typical low green to high green ratios, greater than a factor of ten, have been experimentally achieved at high power (LG/HG<0.10). In some embodiments, this effect can be used to modulate ("ON"/"OFF") a high-power continuance wave (CW) green beam. This is important because just turning on and off the fundamental beam results only in minute-long rise-times. Note: the reason is that for high power doubling, the oven temperature is lowered to account for IR plus green absorption. When the laser is first turned on, doubling efficiency is low because the temperature is too low. As IR light is absorbed, the crystal temperature rises and more green is generated. Absorption of the green further raises the crystal temperature, which approaches its optimum high power value. In some embodiments, full doubling efficiency cannot be reached until fundamental and then green absorption bring the crystals to thermal equilibrium.

Figure 34A:
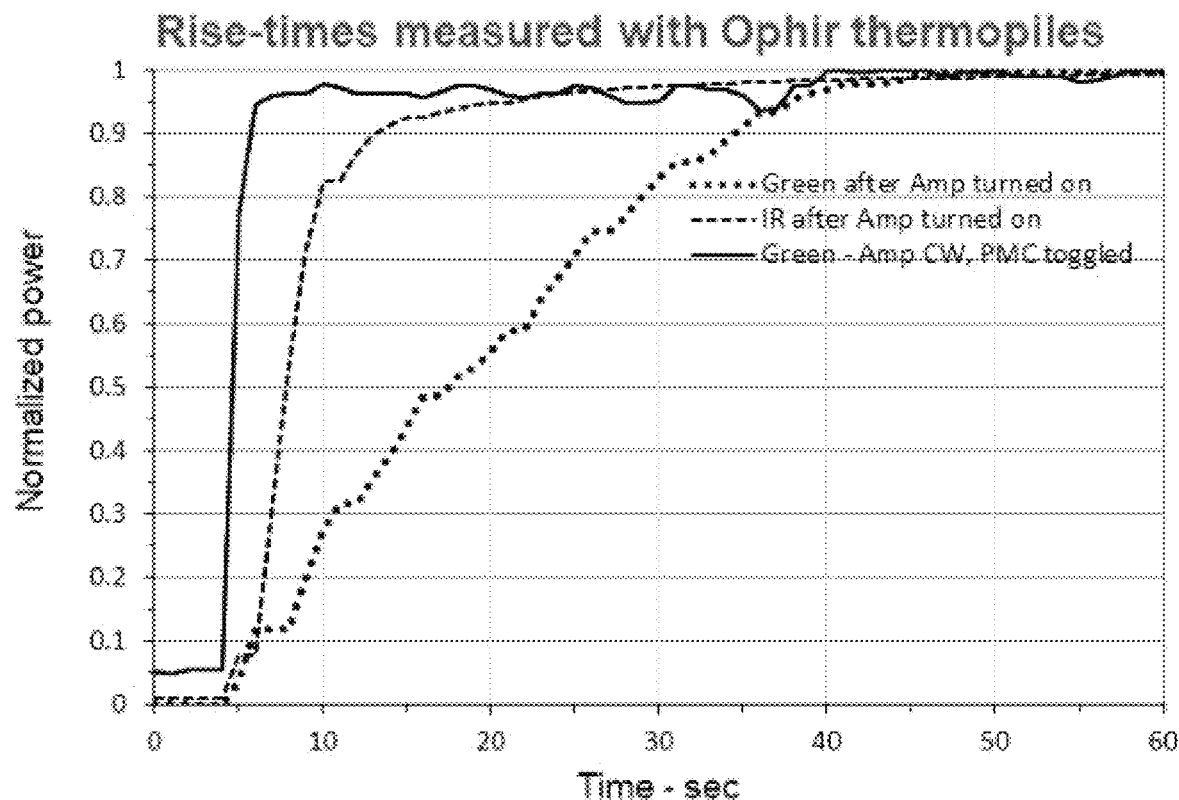
FIGS. 34A and 34B demonstrate a comparison between the rise-times achieved, according to some embodiments of the invention, by rapidly turning on the laser, as in FIG. 34A, and by toggling the PMC position.
Figure 34B:
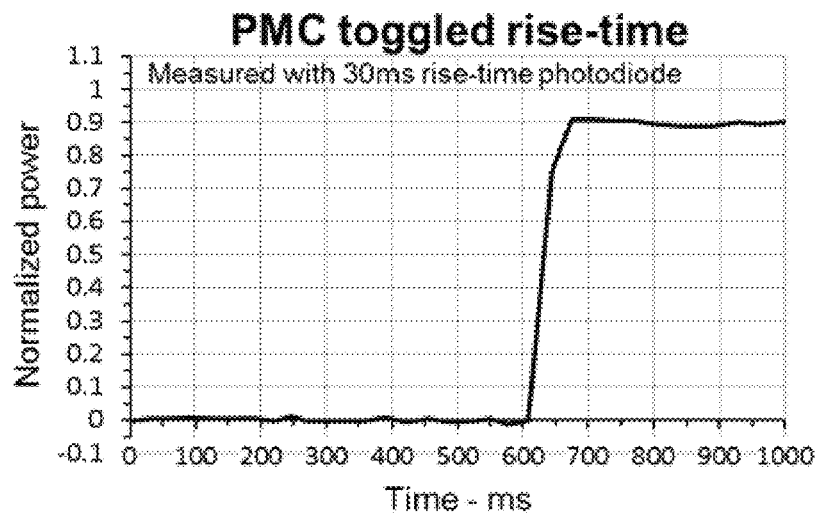

FIGS. 34A and 34B demonstrate a comparison between the rise-times (from minimum power to maximum power) achieved, according to some embodiments, by rapidly turning "on" the input laser beam, as in FIG. 34A, and by toggling the PMC position, as in FIG. 34B; IR input power was 246 Watt; Maximum green power was 75 Watt. Thermopile power meters ($\tau_{rise}$=2 sec) were used to perform the measurements in FIG. 34A, while the feedback photodiode was used to obtain the trace shown in FIG. 34B ($\tau_{rise}$=30 ms). In this test setup the rise-time of the PMC activated system was limited by communications times between the photodiode and the computer, and between the computer and the PMC rotary stage. The dashed line shows the rise-time of the fiber-laser upon rapid turn-on. The dotted line shows the much slower rise in the green output power. This slow response is due to the time required to reach thermal equilibrium, first due to IR absorption and then due to green absorption as more green power is produced. The much faster response using PMC toggling is a consequence of the fact that the first crystal is in thermal equilibrium, while the second crystal is partially heated due to IR absorption. Sub-millisecond rise-times should be achievable by minimizing inertia and by proper selection of the motor plus controller.

It should be pointed out that more complex pulse-shaping is a straight-forward extension of this technique. In some embodiments, any shaped pulse can be generated so long as the relevant time-dependent PMC angles can be derived, programmed, and then executed.

In some embodiments the apparatus 4000 as mentioned above can be incorporated into various systems; few non-limiting examples:
Industrial application systems, such as irradiation of work-pieces with poor infrared absorption for the purpose of cutting, welding, surface treatment, or performing additive manufacturing.
Scientific applications systems, such as pumping Ti:sapphire for the purpose of generating femtosecond pulses at high repetition rate and at high average power, or for the purpose of generating higher frequencies through further sum frequency mixing/additional frequency doubling, or tunable frequencies below the second harmonic through the addition of an optical parametric oscillator.
Medical application systems, where invasive procedures need to be quickly performed.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A hybrid pump module configured to be coupled to an optical fiber having a core and at least one clad, the pump module comprising:
   at least one focusing lens in optical path with the optical fiber;
   plurality of diode modules, each configured to output a multi-mode beam in optical path with the clad;
   at least one core associated module in optical path with the core configured to provide a function selected from a group consisting of:
   a) to output a single-mode beam towards the core;
   b) to receive a beam from the core, and to couple the received beam to an output optical fiber;
   c) to receive a beam from the core, and to reflect the received beam back to the core; and
   d) to receive a beam from the core, and to reflect a part of the received beam back to the core, and to couple another part of the received beam to an output optical fiber;
   wherein the plurality of diode modules and the core associated module are arranged in at least two rows, such that their output beams are parallel one to another, per each row;
   and wherein the pump module further comprises:
   at least one polarizer beam combiner, in the path of a first beams' row; and
   one or more folding mirrors, each folding-mirror for each additional row, wherein each folding mirror is configured to redirect its corresponding row of parallel beams into the respective polarizer beam combiner.

2. The hybrid pump module of claim 1, further comprises a volume Bragg grating (VBG), configured to narrow and lock beams to a predetermined range of wavelength.

3. The hybrid pump module of claim 1, wherein each of the diode modules comprises:
   a broad area laser (BAL); and
   a BAL associated folding-mirror, configured with an optical path between its associated BAL and the clad.

4. The hybrid pump module of claim 1, wherein the core associated module comprises a seed module comprising:
   at least one seed input, configured to be coupled to a seed laser device; and
   a seed associated folding-mirror, configured for optical path between the seed input and the core.

5. The hybrid pump module of claim 4, wherein the seed associated module further comprises at least one of:
   a beam amplifier configured to amplify the seed beam;
   a tap or a partial mirror, configured to sample the seed beam, and a monitor configured monitor and alert of backward beam transmission; and
   an isolator configured to allow transmission of light in one direction only.

6. A fiber amplifying system comprising:
   a doped optical fiber, comprising a core and at least one clad;
   the hybrid pump module of claim 4, coupled to a first end of the optical fiber.

7. The fiber amplifying system of claim 6, wherein the system further comprises at least one selected from: a pump dump, an end-cap element.

8. The hybrid pump module of claim 1, wherein the core associated module comprises an output module comprising:
   an output fiber, optionally comprising an end-cap element; and
   a folding-mirror associated with the output fiber, configured for optical path between the core and the output fiber.

9. The fiber amplifying system of claim 6, further comprises the hybrid pump module of claim 8, coupled to a second end of the optical fiber.

10. The hybrid pump module of claim 1, wherein the core associated module comprises a high reflecting (HR) module comprising:
    an HR mirror; and
    a folding-mirror associated with the HR mirror, configured for optical path between the core and the HR mirror.

11. The hybrid pump module of claim 10, wherein the HR module further comprises an intra cavity modulator arranged between the HR mirror and its associated folding-mirror, configured to modulate the reflected beam.

12. A fiber laser system comprising:
an optical fiber, comprising a core and at least one clad;
the hybrid pump module of claim 10, coupled to a first end of the optical fiber; and
a Fiber Bragg Grating (FBG), coupled to a second end of the optical fiber.

13. The fiber laser system of claim 12, further comprises at least one of: a pump dump and an end-cap element.

14. The hybrid pump module of claim 1, wherein the core associated module comprises a partial reflecting (PR) module comprising:
an output fiber, optionally comprising an end-cap;
a PR mirror, in optical path with the output fiber; and
a folding mirror associated with the PR mirror, configured for optical path between the core and the PR mirror.

15. The hybrid pump module of claim 1, further comprises at least one heat dispensing element selected from a group consisting of: base surface, ribs, screws, and any combination thereof.

* * * * *